United States Patent [19]
Murata et al.

[11] Patent Number: 5,268,587
[45] Date of Patent: Dec. 7, 1993

[54] SEMICONDUCTOR INTEGRATED CIRCUIT DEVICE INCLUDING A DIELECTRIC BREAKDOWN PREVENTION CIRCUIT

[75] Inventors: Jun Murata, Kunitachi; Hideyuki Miyazawa, Ohme; Kyoichiro Asayama, Tachikawa; Akihiro Tamba; Seigou Yukutake, both of Hitachi; Hiroyuki Miyazawa, Kodaira; Yutaka Kobayashi, Katsuta; Tomoyuki Someya, Hitachi, all of Japan

[73] Assignee: Hitachi, Ltd., Tokyo, Japan

[21] Appl. No.: 786,750

[22] Filed: Nov. 1, 1991

Related U.S. Application Data

[63] Continuation of Ser. No. 496,328, Mar. 20, 1990, Pat. No. 5,081,515.

[30] Foreign Application Priority Data

Mar. 20, 1989 [JP] Japan .................................. 1-65845

[51] Int. Cl.⁵ ...................... H01L 29/06; H01L 29/78
[52] U.S. Cl. ................... 257/357; 257/358; 257/360; 257/363
[58] Field of Search .............. 357/23.13, 13; 257/355, 257/356, 357, 358, 360, 363

[56] References Cited

U.S. PATENT DOCUMENTS 4,757,363  7/1988  Bohm et al. ...................... 357/23.13
4,893,159  1/1990  Suzuki et al. .................... 357/23.13

FOREIGN PATENT DOCUMENTS 246774    6/1984  Japan ................................. 257/355
59-100569 2/1990  Japan ................................. 257/356

*Primary Examiner*—Sara W. Crane
*Attorney, Agent, or Firm*—Antonelli, Terry, Stout & Kraus

[57] ABSTRACT

A semiconductor integrated circuit device includes a dielectric breakdown prevention circuit coupled to an external terminal for protecting an input stage circuit. The prevention circuit has bipolar transistors and complementary MISFETs including a first MISFET of a first conductivity type and a second MISFET of a second conductivity type. A first semiconductor region of the first conductivity type is formed by the same layer as a well region in which the second MISFET is formed. A second semiconductor region of the second conductivity type is formed in said first semiconductor region by the same layer as source and drain regions of the second MISFET. These first and second semiconductor regions form a first PN junction diode. The external terminal is electrically coupled to one end portion of said second semiconductor region. A high impurity conductivity type buried third semiconductor region underlies the said second semiconductor region, and is formed by the same layer as a region isolating the bipolar transistors. This third region is disposed at the bottom surface of said first semiconductor region. A fourth semiconductor region of the second conductivity type is also formed in said first semiconductor region by the same layer used for collector contact regions of the bipolar transistors, and is connected with another end portion of said second semiconductor region, in contact with the third semiconductor region. The fourth semiconductor region is coupled to the input stage circuit, and the third and fourth semiconductor regions form a second PN junction diode.

23 Claims, 39 Drawing Sheets

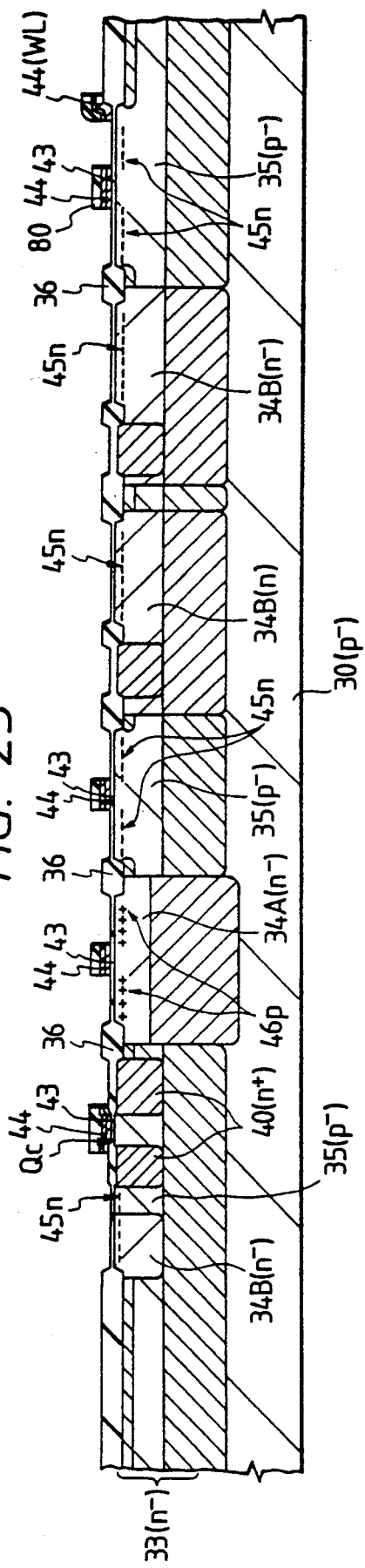
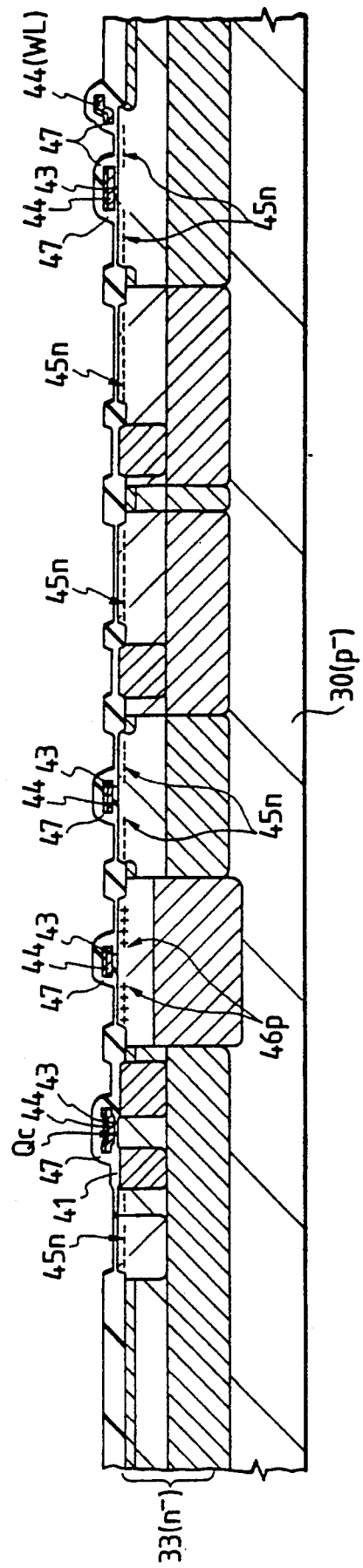
FIG. 23
FIG. 24

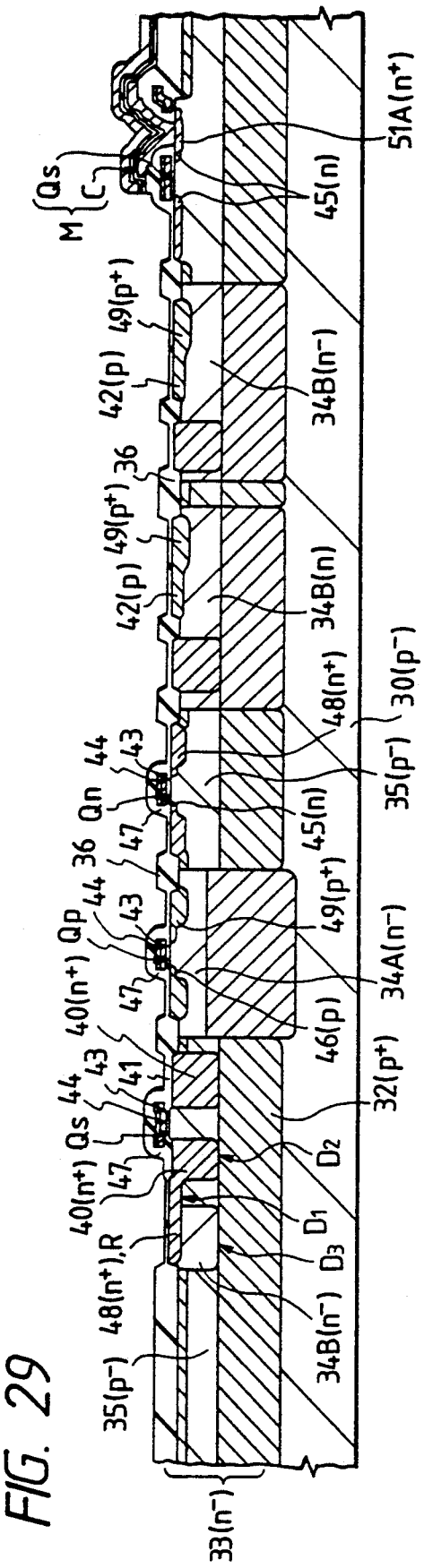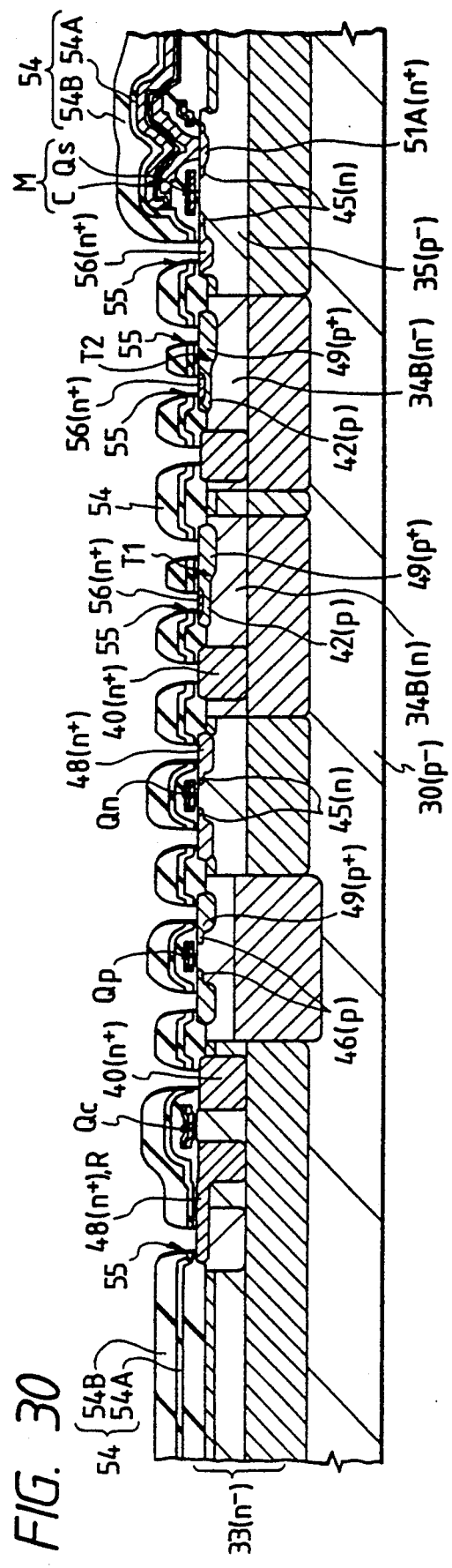

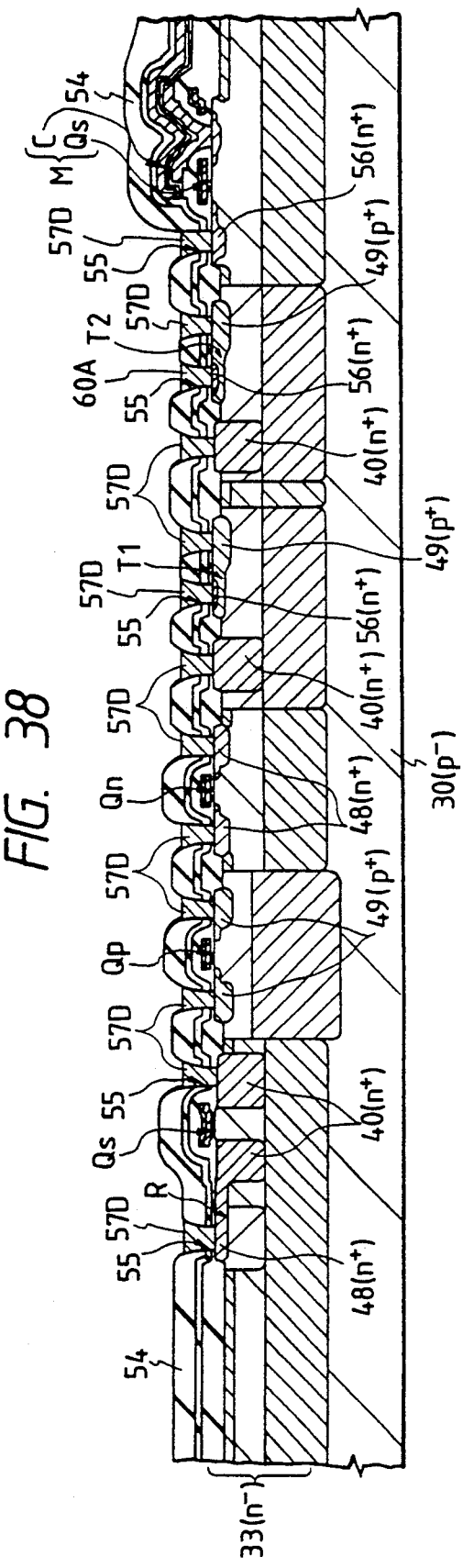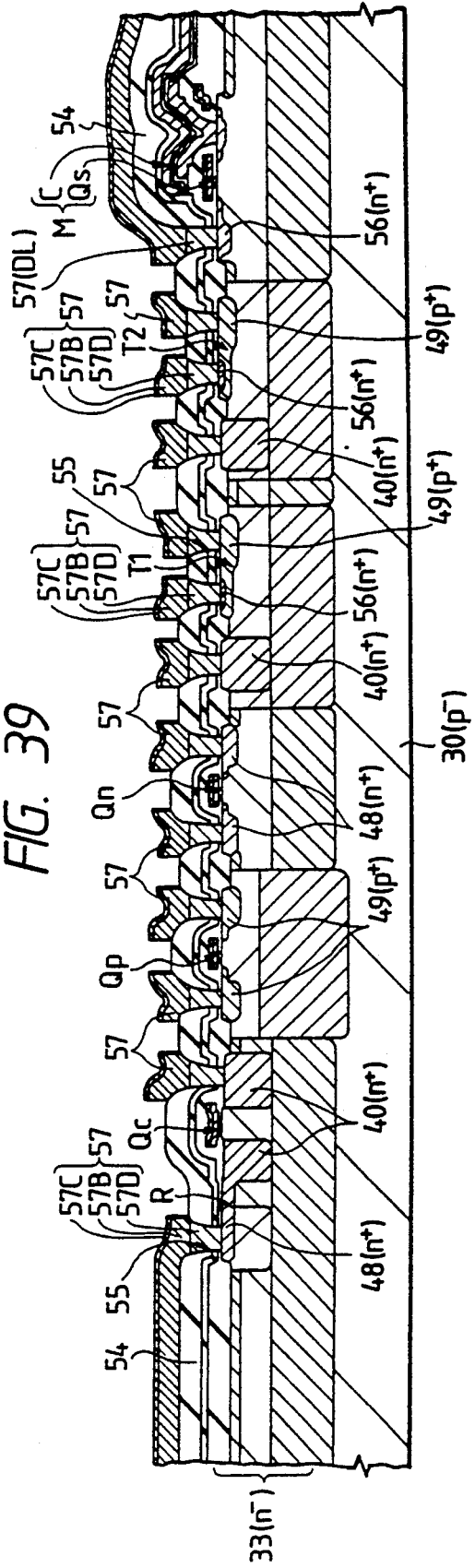

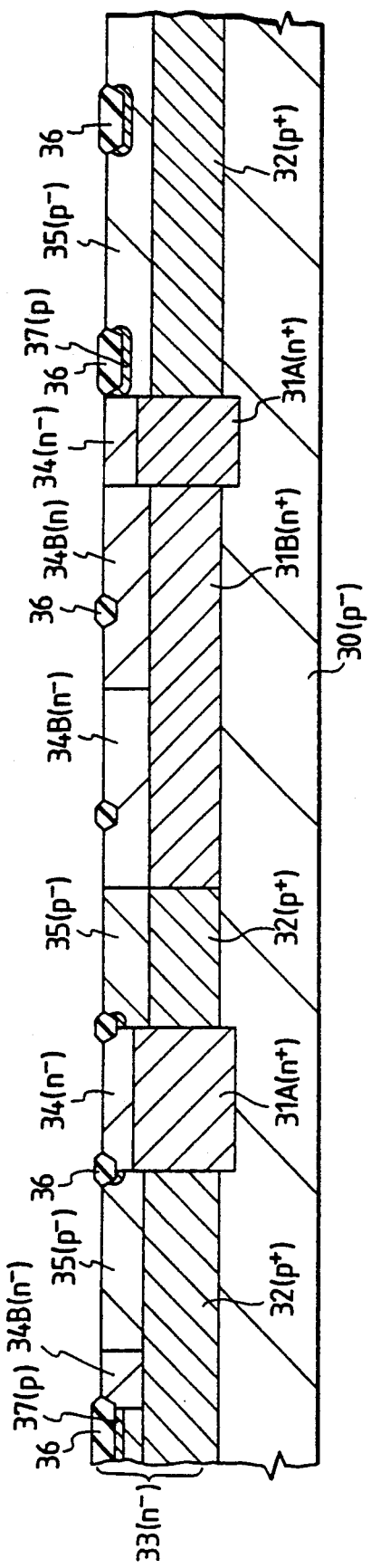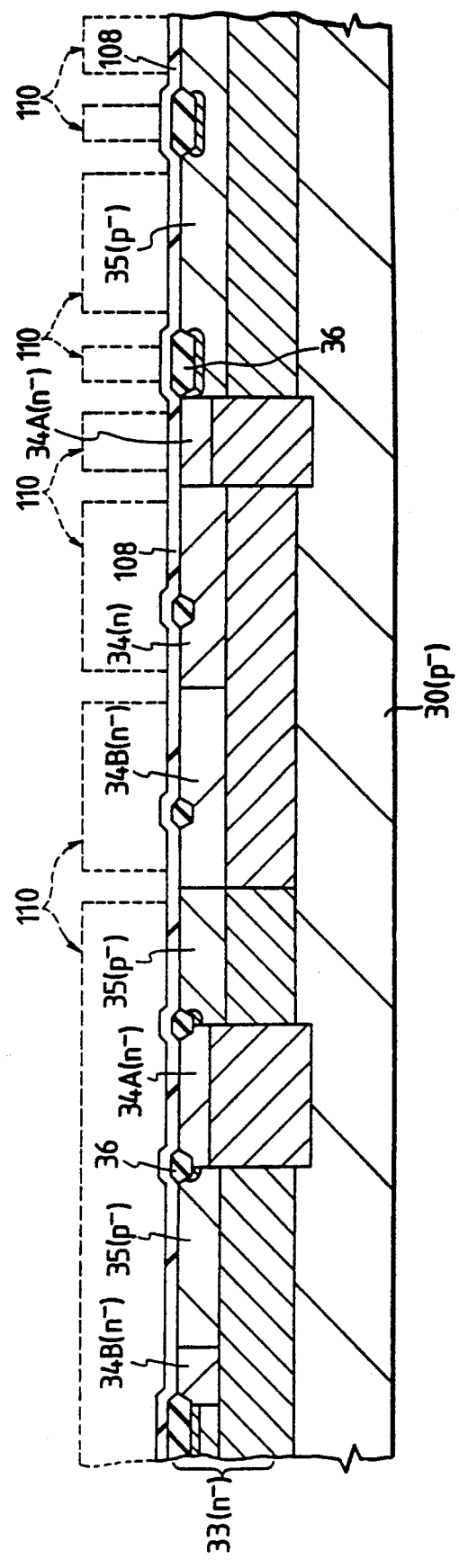

SEMICONDUCTOR INTEGRATED CIRCUIT DEVICE INCLUDING A DIELECTRIC BREAKDOWN PREVENTION CIRCUIT

This is a continuation of application Ser. No. 496,328, filed Mar. 20, 1990, now U.S. Pat. No. 5,081,515.

BACKGROUND OF THE INVENTION

This invention relates to a hybrid semiconductor integrated circuit device. More particularly, the present invention relates to technique which will be effective when applied to a hybrid semiconductor integrated circuit device (hereinafter referred to as "Bi-CMOS") fabricated by integrating bipolar transistors and complementary MISFETs (CMOSs) on the same semiconductor substrate.

Development of hybrid semiconductor integrated circuit devices by integrating bipolar transistors and complementary MISFETs on the same semiconductor substrate has been carried out. In the hybrid semiconductor integrated circuit devices, a dielectric breakdown prevention circuit is inserted between external terminals (bonding pads) and an input stage circuit.

Generally, this dielectric breakdown prevention circuit comprises a resistance element and a clamp MISFET. The resistance element comprises an n-type semiconductor region (a diffusion layer resistor) formed on the main plane portion of a p-type semiconductor substrate (a well region, in practice). One of the ends of this resistance element is connected directly to the external terminal and its other end, to the input stage circuit through a drain region of clamp MISFET. The resistance element reduces an excessive current (transient current) that is inputted to the external terminal and will otherwise cause dielectric breakdown, or absorbs it to the side of the semiconductor substrate by breakdown (reversible breakdown). The breakdown of the latter is generated by the n-type semiconductor region as the resistance element and a diode device defined by a p-n junction portion with the p-type semiconductor substrate. The clamp MISFET has an n-channel and its drain region is formed integrally with the other end of the resistance element.

The source region and gate electrode of the clamp MISFET are connected to a reference potential, e.g. 0 [V], respectively. The clamp MISFET is constituted so as to absorb the excessive current passing through the resistance element by surface breakdown or zenor breakdown, to the semiconductor substrate side. Each of the breakdown voltages (junction with stand voltages) of the clamp MISFET are set to be lower than the dielectric breakdown voltage of the gate insulation film of the complementary MISFET of the input stage circuit.

In the dielectric breakdown prevention circuit having the construction as described above, the excessive current inputted to the external terminal is reduced by the resistance element and is clamped by the clamp MISFET. In this manner this circuit can prevent the breakdown (dielectric breakdown) of the gate insulation film of the input stage circuit. Since the resistance element and the clamp MISFET of the dielectric breakdown prevention circuit can be fabricated by the same production step as MISFETs of an internal circuit or the like, the dielectric breakdown prevention circuit is characterized in that the number of production steps of the hybrid semiconductor integrated circuit device can be reduced.

The hybrid semiconductor integrated device which is now being developed by the present inventor and is not therefore a prior art accomplishes a high integration density in accordance with the rule of proportional contraction. It employs a 0.8 [μm] fabrication process. This 0.8 [μm] process is the one that can form the minimum fabrication dimension such as the gate length of the gate electrode of MISFET and the width of wirings at 0.8 [μm]. If such a fabrication process is employed, the gate insulation film of MISFET of an internal circuit or an input stage circuit can be formed by an about 20 [nm]-thick thin film in accordance with the rule of proportional contraction described above. The dielectric breakdown voltage of this gate insulation film having such a small thickness is about 19 [V]. On the other hand, the impurity concentrations of the n-type semiconductor region and p-type semiconductor substrate forming the resistance element and the clamp MISFET of the dielectric breakdown prevention circuit are not increased against the rule of proportional contraction for the purpose of reducing the increase in a parasitic capacitance or because the number of fabrication steps increases. This means that the p-n junction withstand voltage (breakdown voltage) between the drain region (high impurity concentration) of the resistance element and clamp MISFET and the semiconductor substrate (low impurity concentration) does not substantially change with a higher integration density. This p-n junction withstand voltage is about 20 [V]. In other words, the dielectric withstand voltage of the gate insulation film of the complementary MISFET of the input stage circuit is lower than the junction withstand voltage of the resistance element and clamp MISFET of the dielectric breakdown prevention circuit. Therefore, when an excessive current is inputted to the external terminal, there occurs frequently the phenomenon that the input stage circuit undergoes dielectric breakdown before the dielectric breakdown prevention circuit absorbs this excessive current.

Accordingly, the inventor of the present invention improves the dielectric breakdown voltage of the hybrid semiconductor integrated circuit device by employing the technique disclosed in Japanese Patent Application No. 136100/1988 that was filed previously. This technique forms each of the resistance element and clamp MISFET of the dielectric breakdown prevention circuit by an n-type semiconductor region having a high impurity concentration and brings the bottom surface of this n-type semiconductor region into contact with a buried type p-type semiconductor region having a high impurity concentration. The n-type semiconductor region having a high impurity concentration is formed by the same fabrication step as a collector potential pull-up semiconductor region which pulls up a collector potential from the buried type collector region of an n-p-n bipolar transistor of a vertical structure to the surface of the semiconductor substrate. The buried type p-type semiconductor region having a high impurity concentration is formed by the same fabrication step as the buried type p-type semiconductor region of a device isolation region which defines the periphery of the bipolar transistor described above. In other words, this dielectric breakdown prevention circuit constitutes the diode device by the n-type semiconductor region having a high impurity concentration and the p-type semiconductor region having a high impurity concentration, and reduces the p-n junction withstand voltage (breakdown voltage). This p-n junction withstand voltage is from about 10 to about 16 [V]. Accordingly, since the dielectric breakdown prevention circuit mounted to the hybrid semiconductor integrated device which is under development by the present inventor can absorb the excessive current before the occurrence of dielectric breakdown of the input stage circuit, it can improve the dielectric breakdown withstand voltage. Incidentally, Bi-CMOS devices are described in U.S. patent application Ser. No. 07/029,681 by Yutaka KOBAYASHI et al, filed Mar. 24, 1987.

SUMMARY OF THE INVENTION

As a result of dielectric breakdown test of the hybrid semiconductor integrated circuit device under development described above, the inventor of the present invention has found that the following new problem occurs.

The dielectric breakdown prevention circuit can absorb the excessive current causing dielectric breakdown by the diode device described above, and can prevent the dielectric breakdown of the input stage circuit. However, since the excessive current concentrates on the diode device, this diode device or in other words, the p-n junction portion, undergoes thermal breakdown (permanent breakdown). Thus, there occurs the problem that the dielectric breakdown withstand voltage of the hybrid semiconductor integrated circuit is governed by the dielectric breakdown withstand voltage of the dielectric breakdown prevention circuit and this dielectric breakdown withstand voltage drops.

The objects of the present invention are as follows.

(1) The first object is to provide technique capable of improving the dielectric breakdown withstand voltage of a hybrid semiconductor integrated circuit having a dielectric breakdown prevention circuit.

(2) The second object is to provide technique capable of accomplishing the object of the item (1) and of reducing the number of fabrication steps of the hybrid semiconductor integrated circuit device.

(3) The third object is to provide technique capable of improving electrical reliability of the hybrid semiconductor integrated circuit device.

(4) The fourth object is to provide technique capable of improving the operation speed of the hybrid semiconductor integrated circuit device.

(5) The fifth object is to provide technique capable of improving the integration density of the hybrid semiconductor integrated circuit device.

(6) The sixth object is to provide technique capable of improving the withstand voltage of bipolar transistors of the hybrid semiconductor integrated circuit device.

(7) The seventh object is to provide technique capable of reducing power consumption of the hybrid semiconductor integrated circuit device.

These and other objects and novel features of the present invention will become more apparent from the following detailed description when taken in connection with the accompanying drawings.

Among the inventions disclosed herein, the following will represent some typical examples.

(1) In a semiconductor integrated circuit device of the type wherein a wiring is connected to the main plane of the emitter region of a bipolar transistor through an emitter opening formed in an inter-level insulation film, the emitter region of the bipolar transistor is constituted by introducing antimony into the main plane portion inside the region of the base region defined by the emitter opening and by activating it. The wiring described above is constituted by an aluminum wiring or an aluminum alloy wiring.

(2) In a semiconductor integrated circuit device of the type wherein bipolar transistors and MISFETs are formed on the same semiconductor substrate, each of the emitter region of the bipolar transistor and the source and drain regions of MISFET is formed by introducing an impurity by ion implantation and activating it by the same fabrication step, and an aluminum wiring or an aluminum alloy wiring is connected to each of the emitter, source and drain regions through a barrier metal layer formed by the same fabrication step. The barrier metal layer is formed by a transition metal nitride film or a transition metal silicide film.

(3) In a semiconductor integrated circuit device having a dielectric breakdown prevention circuit between an external terminal and an input stage circuit connected directly to the former, the present invention forms the dielectric breakdown prevention circuit by a first diode device comprising a first semiconductor region of a first conductivity type which is formed by the same layer as the well region of the complementary MISFET on the main plane portion of the semiconductor substrate and a second semiconductor region of a second conductivity type formed by the same layer as the source and drain regions of the complementary MISFET on the main plane portion of this first semiconductor region, and a second diode device comprising a buried type third semiconductor region of the first conductivity type having a high impurity concentration and formed by the same layer as an isolation region of the bipolar transistor buried in the semiconductor substrate and a fourth semiconductor region of the second conductivity type having a high impurity concentration and formed by the same layer as a potential pull-up semiconductor region of a buried type collector region of the bipolar transistor disposed with its bottom surface kept in contact with the third semiconductor region on the main plane portion of the semiconductor substrate. Furthermore, the present invention disposed these first and second diode devices sequentially and in parallel from the external terminal to the input stage circuit.

(4) In a semiconductor integrated circuit device having a dielectric breakdown prevention device between an external terminal and an input stage circuit connected directly to the former and also having complementary MISFETs and bipolar transistors, the prevent invention constitutes the dielectric breakdown prevention circuit by a third diode device comprising a buried type third semiconductor region of the first conductivity type having a high impurity concentration and formed by the same layer as an isolation region of the bipolar transistor buried in the semiconductor substrate and a fifth semiconductor region of the second conductivity type having a low impurity concentration and formed by the same layer as a well region of the complementary MISFET disposed with its bottom surface in contact with the third semiconductor region on the main plane portion of the semiconductor substrate, and a second diode device comprising the third semiconductor region described above, and a fourth region of the second conductivity type having a high impurity concentration and formed by the same layer as a potential pull-up semiconductor region of a buried type collector region of the bipolar transistor with its bottom surface in contact with the third semiconductor region on the main surface portion of the semiconductor substrate. Furthermore, the present invention disposes these third and second diode devices sequentially and in parallel from the input terminal to the input stage circuit.

(5) The dielectric breakdown prevention circuit of the item (3) or (4) described above is constituted by disposing sequentially and in parallel the third, first and second diode devices from the external terminal to the input stage circuit.

(6) The dielectric breakdown prevention circuit of the items (3) through (5) described above has a clamp MISFET and the source region of this clamp MISFET is formed by the same layer as the fourth semiconductor region of the second conductivity type of the second diode device or the second semiconductor region of the second conductivity type of the first diode device.

(7) An insulation film having a greater film thickness than a gate insulation film is disposed between the drain region of the clamp MISFET of the dielectric breakdown prevention circuit of the item (6) described above and its gate electrode.

(8) In a semiconductor integrated circuit device having a bipolar transistor whose intrinsic collector region and whose buried type collector region are sequentially disposed in the direction of depth of a substrate and MISFET formed in a region where a well region which is the same layer and has the same conductivity type as those of the intrinsic collector region and buried type collector region described above and a buried type semiconductor region are sequentially disposed in the direction of the depth of the substrate, the depth of the well region for forming MISFET from the surface of the substrate is set to be smaller than the depth of the intrinsic collector region of the bipolar transistor from the surface of the substrate.

(9) In a production method of a semiconductor integrated circuit device having a bipolar transistor whose intrinsic collector region and whose buried type collector region are disposed sequentially in the direction of depth of a substrate, and MISFET which is formed in a region where a well region and a buried semiconductor region formed by the same layer, and having the same conductivity type, as those of the intrinsic collector region and buried type collector region are disposed sequentially in the direction of depth of the substrate, the production method of the present invention includes the step of introducing a first impurity into the main plane portion of the formation region of the bipolar transistor in the substrate and introducing the first impurity and a second impurity having a higher diffusion speed than the first impurity into the main plane portion of the formation region of MISFET in substrate, the step of growing an epitaxial layer on the main plane of the substrate, diffusing the first impurity into the formation region of the bipolar transistor so as to form the buried type collector region and diffusing the first and second impurities into the formation region of MISFET so as to form the buried type semiconductor region, and the step of forming the intrinsic collector region on the main plane portion of the formation region of the bipolar transistor in the epitaxial layer and forming the well region on the main plane portion of the formation region of MISFET in the epitaxial layer.

(10) In a semiconductor integrated circuit device for constituting MISFET on the main plane of an active region whose periphery is defined by a channel stopper region and a device isolation insulation film formed on the main plane of a nonactive region of a substrate, the impurity concentration of the channel stopper region at the boundary portion between the channel stopper region and the device isolation insulation film is made to be higher than the impurity concentration of the impurity for forming the channel stopper which is taken into the device isolation insulation film.

(11) In a semiconductor integrated circuit device of the type wherein a buried type semiconductor region having the same conductivity type as, but a higher impurity concentration than, those of a well region is formed below the well region and a wiring is connected to a first semiconductor region which is the source and drain regions of MISFET formed on the main plane portion of the well region through a connection hole bored in an inter-level insulation film, a wiring is connected to the first semiconductor region of a first MISFET formed on the main plane portion of the first region of the well region and a wiring is connected to the first semiconductor region of a second MISFET formed on the main plane portion of a second region different from the first region of the well region, through a second semiconductor region which is formed by introducing an impurity having the same conductivity type as that of the first semiconductor region into a region defined by the connection hole described above, and has a greater junction depth than that of the first semiconductor region.

(12) In a semiconductor integrated circuit device of the type wherein DRAM for constituting a memory cell by a series circuit of an MISFET for selecting a memory cell and a data storage capacitance element and a bipolar transistor are formed on the same semiconductor substrate, the data storage capacitance element of the memory cell of DRAM is formed inside a thin trench defined from the main plane of the semiconductor substrate in the direction of its depth, and an isolation region defining the periphery of the bipolar transistor is constituted by a thin trench formed by the same step as the thin trench forming the data storage capacitance element of the memory cell of DRAM. The data storage capacitance element of the memory cell of DRAM has a stacked structure formed by laminating sequentially a lower electrode layer, a dielectric film and an upper electrode layer inside the thin trench.

(13) In a semiconductor integrated circuit device of the type equipped with DRAM formed by arranging memory cells each comprising a series circuit of an MISFET for selecting a memory cell and a data storage capacitance element on the main plane of a well region, a buried type semiconductor region having the same conductivity type as, and a higher impurity cocentration than, those of the well region having the memory cells of DRAM thereon is disposed below the well region, and a well potential is supplied to the well region through this buried semiconductor region.

(14) In a semiconductor integrated circuit device of the type wherein an aluminum wiring or aluminum alloy wiring extending on an inter-level insulation film is connected to an emitter region of a bipolar transistor through an emitter opening formed on the inter-level insulation film, a transition metal film or a transition metal silicide film is buried in the emitter opening formed in the inter-level insulation film, and the emitter region of the bipolar transistor and the aluminum wiring or the aluminum alloy wiring are connected through this buried transition metal film or transition metal silicide film.

(15) In a semiconductor integrated circuit device including a bipolar transistor whose intrinsic collector region and whose buried type collector region are sequentially disposed in the direction of depth of a substrate and MISFET formed in the region where a well region and a buried type semiconductor region having the same layer and the same conductivity as those of the intrinsic collector region and the buried type collector region are disposed sequentially in the direction of depth of the substrate, the depth of the intrinsic collector region of the bipolar transistor from the surface of the substrate is made to be smaller than the depth of the well region, which forms MISFET, from the surface of the substrate.

(16) In a semiconductor integrated circuit device of the type including DRAM whose memory cell comprises a series circuit of MISFET for selecting the memory cell and a data storage capacitance element of a stacked structure and whose complementary data lines extending on an upper electrode layer of the data storage capacitance element of the stacked structure through an inter-level insulation film are connected to one of the semiconductor regions of MISFET for selecting the memory cell, the width of the wiring of the complementary data line is made to be smaller than the film thickness of the inter-level insulation film between the complementary data line and the upper electrode layer of the data storage capacitance element of the stacked structure below the complementary data line.

(17) The width of the wiring of a signal line formed by the same conductor layer as the complementary data line and extending to a peripheral circuit of DRAM of the item (16) is made to be greater than the film thickness of the inter-level insulation film as the lower layer of the former.

(18) The width of the wiring of a power source wiring, which is formed by the same conductor layer as the complementary data line which is extended from a power source external terminal of DRAM of the item (16) and before it is extended, is made to be greater than the film thickness of the inner-level insulation film as the lower layer of the former.

(19) In a semiconductor integrated circuit device having a bipolar transistor of a vertical structure wherein its emitter region, base region and collector region are disposed sequentially from the surface of a substrate in the direction of its depth, the portion of the collector region immediately below the emitter region is formed in a higher impurity concentration than the other collector regions.

(20) The higher impurity concentration region of the collector region in the item (19) immediately below the emitter region is formed by introducing an impurity into the collector region inside a region defined by an emitter opening which also defines the emitter region.

According to the means (1) described above, the diffusion quantity in the horizontal direction of the emitter region is greater than in the case of arsenic and even if the size of the emitter opening increases due to pre-washing which is effected before the formation of the wiring, short-circuit between the base region and the wire can be prevented. Therefore, electrical reliability of the semiconductor integrated circuit device can be improved, the diffusion quantity in both the horizontal and vertical directions of the emitter region is smaller than in the case of phosphorus and the junction depth of each of the emitter, base and collector regions can be reduced. In this manner the travelling distance of the current in the emitter and collector regions can be shortened and the operation speed of the semiconductor integrated circuit device can be improved. Since the p-n junction areas between the emitter region and the base region and between the base region and the collector region can be reduced and the parasitic capacitance can be reduced, too, the operation speed of the semiconductor integrated circuit device can further be improved. Since the occupying area of the bipolar transistor can be reduced by reducing the junction depth of each of the emitter, base and collector regions, the integration density of the semiconductor integrated circuit device can be improved.

According to the means (2) described above, the formation steps of the source and drain regions of MISFET, the barrier metal layer and the wiring can be used commonly as the formation steps of the emitter region of the bipolar transistor, the barrier metal layer and the wiring, respectively, the number of fabrication steps of the semiconductor integrated circuit device can be reduced and at the same time, since the emitter region is formed by the introduction of an impurity by ion implantation, controllability of the impurity concentration can be improved in comparison with the introduction of the impurity by thermal diffusion (polysilicon emitter method). Therefore, it is possible to reduce variance of an emitter-ground current amplification ratio ($h_{FE}$) of the bipolar transistor and to improve electrical reliability of the semiconductor integrated circuit device. It is also possible to prevent the alloying reaction of the emitter, source and drain regions with the wiring, respectively, and to prevent an alloy spike phenomenon. In this manner, electrical reliability of the semiconductor integrated circuit device can further be improved.

According to the means (3) described above, the excessive current imputted to the external terminal can be reduced step-wise by the first and second diode devices and moreover, the p-n junction withstand voltage of the second diode device can be made lower than the dielectric breakdown withstand voltage of the devices of the input stage circuit. Accordingly, it is possible to prevent the dielectric breakdown of the input stage circuit and to improve the dielectric breakdown withstand voltage of the semiconductor integrated circuit device. Since the formation steps of the first and second diode devices of the dielectric breakdown prevention circuit can use commonly the formation steps of the bipolar transistor and the complementary MISFET, respectively, the fabrication steps of the semiconductor integrated circuit device can be reduced by the number of the fabrication steps of the dielectric breakdown prevention circuit.

According to the means (4) described above, the excessive current inputted to the external terminal can be reduced step-wise by the third and second diode devices and moreover, the p-n junction withstand voltage of the second diode device can be made to be lower than the dielectric breakdown withstand voltage of the devices of the input stage circuit. Therefore, it is possible to prevent the dielectric breakdown of the input stage circuit and to improve the dielectric breakdown withstand voltage of the dielectric breakdown prevention circuit. Since the formation steps of the bipolar transistor and the complementary MISFET can be used commonly as the formation steps of the third and second diode devices of the dielectric breakdown prevention circuit, respectively, the number of the fabrication steps of the semiconductor integrated circuit device can be reduced by the number of the formation steps of this dielectric breakdown prevention circuit.

According to the means (5) described above, the excessive current inputted to the external terminal can be reduced at the three stages of the third, first and second diode devices. Therefore, the dielectric breakdown withstand voltage of the dielectric breakdown prevention circuit can be further improved.

According to the means (6) described above, variance of the channel length of each of the drain and source regions can be reduced when the drain and source regions of the clamp MISFET are formed by the fourth semiconductor region. Therefore, the integration density of the semiconductor integrated circuit device can be improved. When the source region of the clamp MISFET is formed by the second semiconductor region, its detour towards the channel formation region can be reduced. Therefore, the integration density of the semiconductor integrated circuit device can be improved.

According to the means (7) described above, the mirror capacity occurring between the drain region and gate electrode of the clamp MISFET can be reduced so that the signal transmission speed can be improved and the operation speed of the semiconductor integrated circuit device can be improved, too.

According to the means (8) described above, the well region of the region where MISFET is to be formed can be made shallow and the depth of the buried type semiconductor region having a high impurity concentration from the substrate surface can be made smaller than that of the well region. Therefore, punch-through of MISFET (or the short-channel effect) can be reduced, the high integration density of MISFET can be accomplished and the base region and the buried type collector region to be formed on the main plane portion of the intrinsic collector region of the bipolar transistor can be isolated from each other by increasing the dpeth of the intrinsic collector region. For these reasons, it becomes possible to improve the junction withstand voltage between the base and collector regions and to attain a higher withstand voltage of the bipolar transistor. Since it is not necessary to introduce (counter-dope) a high concentration impurity into the channel formation region in order to reduce punch-through of MISFET, it is possible to reduce the impurity scatter effect, and to improve the operation speed because the source-drain current is not increased.

According to the means (9) described above, since the diffusion rate of the second impurity is higher than that of the first impurity and the dimension of the buried type semiconductor region of the MISFET formation region in the direction of dpeth of the substrate, it is possible to make the well region of the MISFET formation region shallow and to increase the depth of the intrinsic collector region of the bipolar transistor.

According to the means (10) described above, since the entrapped quantity of the impurity into the device isolation insulation film can be reduced and the impurity concentration of the channel stopper region below the device isolation insulation region can be increased, the device isolation capacity and the integration density can be improved by increasing the threshold voltage of the parasitic MOS. Since the entrapped quantity of the impurity into the device isolation insulation film can be reduced and the impurity concentration in the channel stopper region need not be increased excessively, the detour quantity of the impurity forming the channel stopper region towards the active region can be reduced, the narrow channel effect of the MISFET can be reduced and the integration density can be improved.

According to the means (11) described above, the first semiconductor region of the first MISFET and the buried type semiconductor region below the well region can be isolated and the parasitic capacitance added to the first semiconductor region of this first MISFET can be reduced. Therefore, the operation speed of the semiconductor integrated circuit device can be improved and even if any deviation of mask registration occurs at the fabrication step of the first semiconductor region and the wiring, the first semiconductor region of the second MISFET and the wiring can be connected reliably to each other through the second semiconductor region. Therefore, it is possible to prevent the short-circuit between the wiring and the well region and to improve electrical reliability of the semiconductor integrated circuit device.

According to the means (12) described above, the charge storage quantity can be increased in the direction of depth of the substrate by the thin trench of the data storage capacitance element of the memory cell of DRAM. Therefore, it is possible to reduce the memory cell area and to improve the integration density of the semiconductor integrated device. Since the isolation dimension can be secured in the direction of depth of the substrate by the thin trench of the isolation region of the bipolar transistor, it is possible to reduce the isolation area, to improve the integration density of the semiconductor integrated circuit device and moreover, to form the thin trench of the data storage capacitance element of the memory cell of DRAM and the thin trench of the isolation region of the bipolar transistor by the same fabrication step. Consequently, the number of fabrication steps of the semiconductor integrated circuit device can be reduced.

According to the means (13) described above, since the noise occurring in the well region can be absorbed by the buried type semiconductor region having a smaller resistance value than the well region, the erroneous operations of the data read and write operations of DRAM can be prevented, respectively. Since the distribution of the well potential of the well region inside the memory cell array can be made uniform, the fluctuation of the threshold voltage of MISFET for selecting the memory cell can be reduced and electrical reliability of the semiconductor integrated circuit device can be improved.

According to the means (14) described above, it is possible to fill substantially all the regions inside the emitter opening with the transition metal film or transition metal silicide film and to increase the sectional area of the wiring at the step portion of the emitter opening. Therefore, it becomes possible to reduce the area of the emitter region with the decrease in the emitter opening, to reduce the occupying area of the bipolar transistor and to improve the integration density of the semiconductor integrated circuit device. Furthermore, since the transition metal film or the transition metal silicide film has a higher electromigration withstand voltage than the aluminum wiring or the aluminum alloy wiring, it becomes possible to further reduce the area of the emitter opening and to further improve the integration density of the semiconductor integrated circuit device. Since the transition metal film or the transition metal silicide film can prevent the alloying reaction between the emitter region and the aluminum wiring or the aluminum alloy wiring, the alloy spike phenomenon can be prevented.

According to the means (15) described above, the bipolar transistor can reduce the depth of the intrinsic collector region from the substrate surface and can shorten the travelling distance of the current. Therefore, it is possible to improve the base cut-off frequency and the operation speed of the bipolar transistor. Furthermore, since the source and drain regions of the MISFET and the buried type semiconductor region can be isolated by increasing the dpeth of the well region of MISFET from the substrate surface, the parasitic capacitance added to each of the source and drain regions can be reduced and the operation speed of the MISFET can be improved.

According to the means (16) described above, since the parasitic capacitance added to the complementary data line can be reduced and the charge/discharge current flow rate of the complementary data line can be reduced, it is possible to reduce power consumption of the DRAM and eventually, to reduce power consumption of the semiconductor integrated circuit device. Since power consumption can thus be reduced, the integration density of the semiconductor integrated circuit device can be improved.

According to the means (17) described above, since the resistance value of the signal lines (e.g. clock system wirings) extending to the peripheral circuit can be reduced by increasing the sectional area, the signal transmission speed can be improved and hence, the operation speed of the semiconductor integrated circuit device can be improved.

According to the means (18) described above, since the resistance value of the power source wiring can be reduced by increasing its sectional area, it is possible to reduce the noise, to prevent the erroneous operation and to improve electrical reliability of the semiconductor integrated device. Since a sufficient wiring width dimension can be secured, it is possible to secure a migration withstand voltage, to prevent disconnection and to improve electrical reliability of the semiconductor integrated circuit device.

According to the means (19) described above, since the resistance value of the region of the collector region immediately below the emitter region, where the current flows substantially, can be reduced and the flowing time of the current can be shortened, it is possible to increase the base cutoff frequency, and to improve the operation speed of the bipolar transistor. Since the regions of the collector region other than its region immediately below the emitter region are formed by the low impurity concentration and can reduce the parasitic capacitance formed at the p-n junction between the collector region and the base region, it is possible to further reduce the base cutoff frequency and to further improve the operation speed of the bipolar transistor.

According to the means (20) described above, the fabrication step of the emitter opening can be used commonly as the fabrication step of the impurity introduction mask for forming the high impurity concentration region of the collector region immediately below the emitter region, the number of the fabrication steps of the semiconductor integrated circuit device can be reduced by the number of the mask formation step.

BRIEF DESCRIPTION OF THE DRAWINGS

FIGS. 15 to 31 are sectional views of the principal portions, each showing the hybrid semiconductor integrated circuit device in accordance with each fabrication step;

FIGS. 38 and 39 are sectional views of the principal portions each showing the hybrid semiconductor integrated circuit device in accordance with each fabrication step;

FIGS. 51 to 56 are sectional views of the principal portions, each showing the hybrid semiconductor integrated circuit device in accordance with each fabrication step.

DESCRIPTION OF THE PREFERRED EMBODIMENTS

Figure 1:
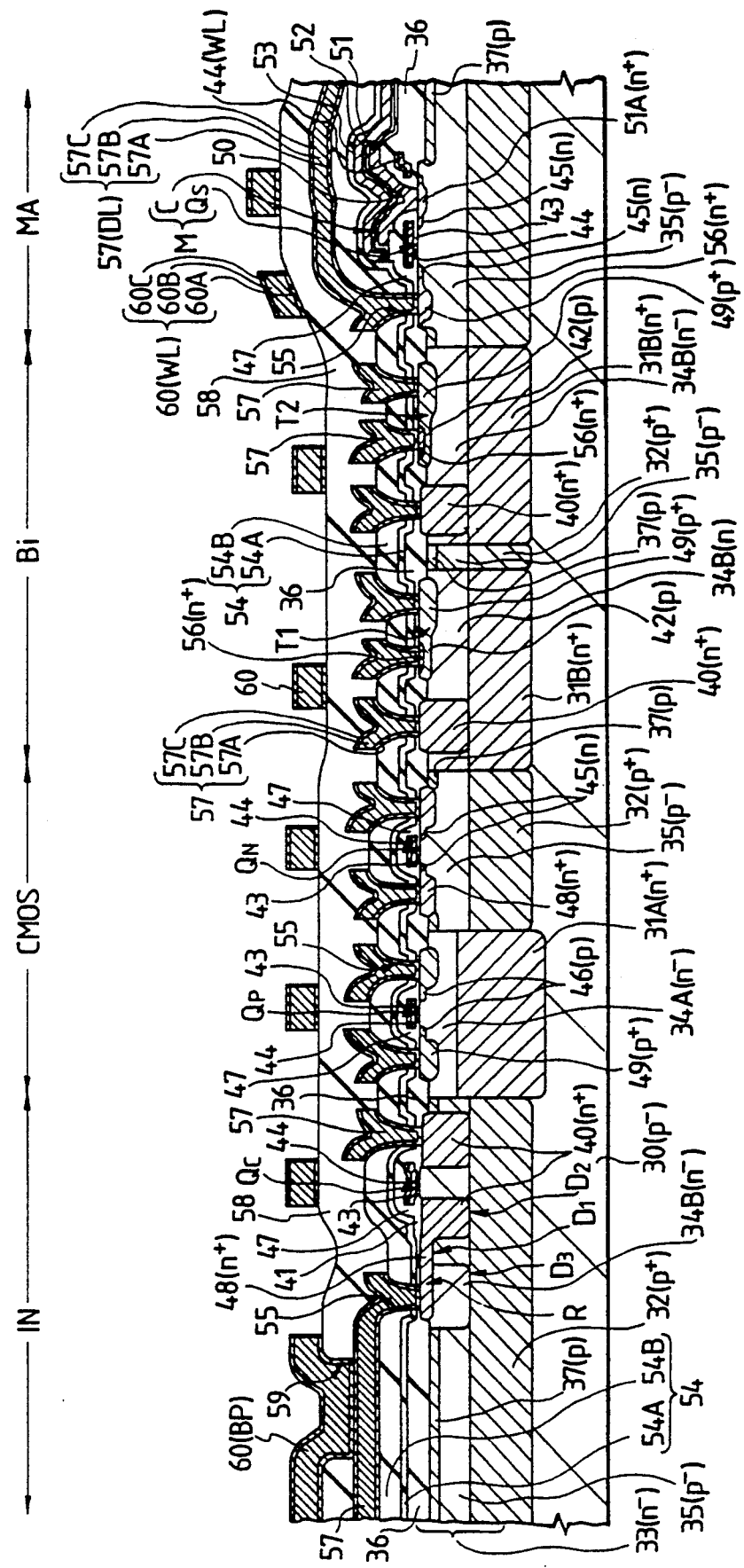
FIG. 1 is a sectional view of the principal portions of a hybrid semiconductor integrated circuit device in accordance with an embodiment I of the present invention.

Hereinafter, the structure of the present invention will be described with the embodiments wherein the present invention is applied to a hybrid semiconductor integrated circuit device having mounted thereto a DRAM having a large capacity of 4 [Mbits].

Incidentally, like reference numerals will be used throughout the drawings to identify like constituents having the same function, and repetition of the explanation of such constituents will be omitted.

EMBODIMENT I

Figure 2:
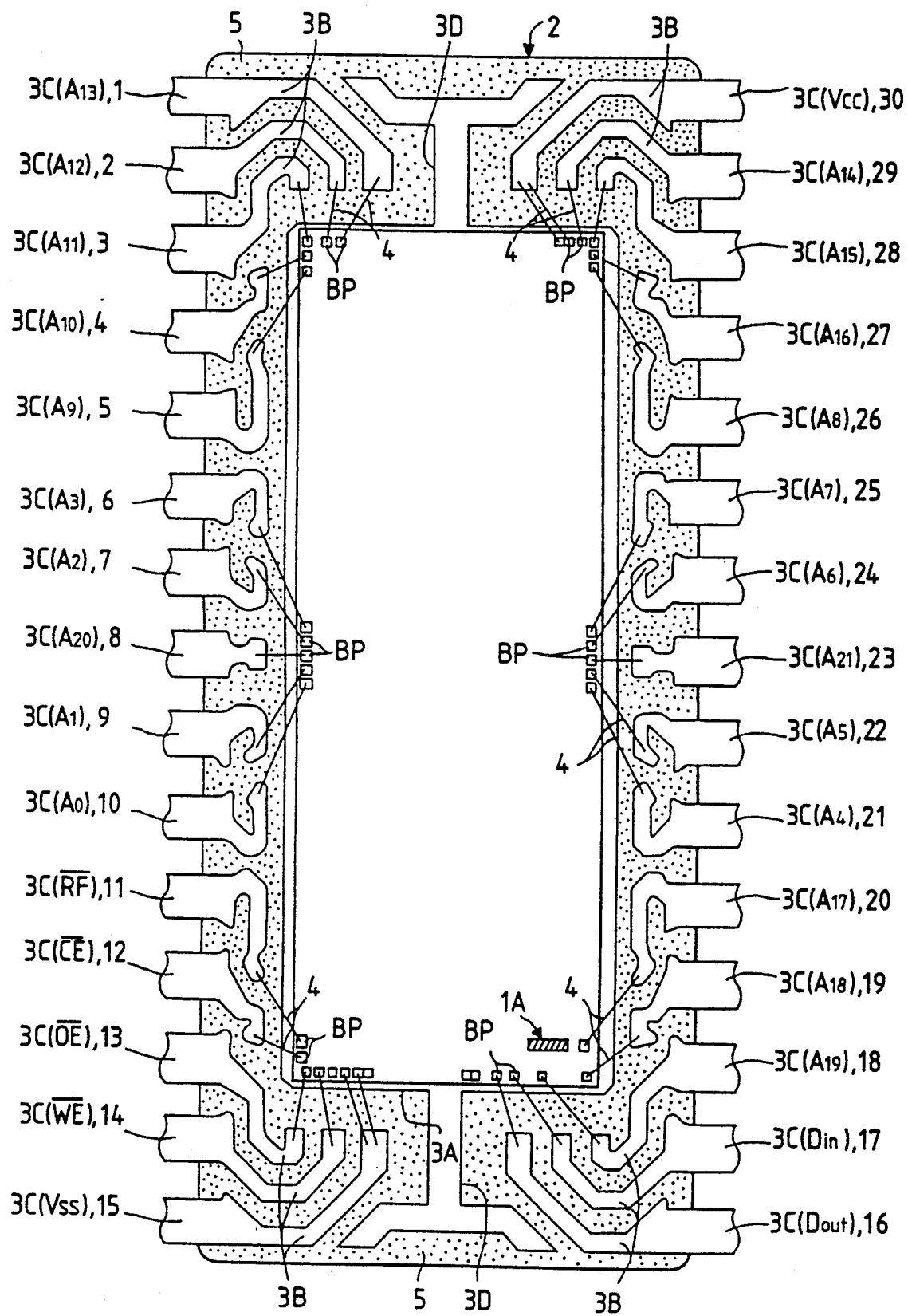
FIG. 2 is a partial sectional plan view of a resin mold type semiconductor device for molding the hybrid semiconductor integrated circuit device described above.

FIG. 2 (partial sectional plan view) shows a resin mold semiconductor device for sealing a hybrid semiconductor integrated circuit device (Bi-CMOS) 1 in accordance with an embodiment I of the present invention.

As shown in FIG. 2, the hybrid semiconductor integrated circuit device (semiconductor pellet) 1 is molded by an SOJ (Small Out-line J-bend) type resin mold semiconductor device 2. The hybrid semiconductor integrated circuit device 1 is mounted onto the surface of the tab 3A of the resin mold semiconductor device 2 through an adhesive.

The hybrid semiconductor integrated circuit device 1 has a planar rectangular shape of 5.22 [mm] × 5.91 [mm], for example. This hybrid semiconductor integrated circuit device 1 is molded by the 350 [mil] resin mold semiconductor device 2. A memory cell array constituted by arranging a plurality of memory cells (memory devices), in matrix, for storing 1 [bit] data is disposed on the main plane of DRAM mounted to the hybrid semiconductor integrated circuit device 1. This DRAM has a large capacity of 4 [Mbit]. A direct peripheral circuit and an indirect peripheral circuit are disposed on the main plane of DRAM at the portions other than the memory cell array. The direct peripheral circuit is a circuit for controlling directly the write and read operations of information into and from the memory cell. It includes a row address decoder circuit, a column address decoder circuit, a sense amplifier circuit, and the like. The indirect peripheral circuit is the circuit for controlling indirectly the operation of the direct peripheral circuit. It includes a clock signal generation circuit, a buffer circuit, and the like.

External terminals (bonding pads) BP are disposed at the centers of the major and minor sides of the planar rectangular shape at the most peripheral portion of the hybrid semiconductor integrated circuit device 1. The external terminal BP is connected to an inner lead 3B through a bonding wire 4. An aluminum (Al) wire is used as the bonding wire 4. A gold (Au) wire, a copper (Cu) wire, a coated wire produced by coating an insulating resin on the surface of a metallic wire, and the like, may be used as the bonding wire 4. This bonding wire 4 is bonded by a bonding method using thermal bonding in combination with ultrasonic vibration, though this method is not particularly limitative.

The inner lead 3B is formed integrally with an outer lead 3C. These inner lead 3B, outer lead 3C and tab 3A are cut off and molded from the read frame. The lead frame is made of Cu, or Fe-Ni alloy (having a nickel content of 42 or 50 [%], for example). A tab suspension lead 3D is connected to each of the mutually opposed minor sides of the tab 3A.

The inner lead 3B is formed integrally with the outer lead 3C. Each of the inner lead 3B, outer lead 3C and tab 3A is cut off from the lead frame and is molded. The lead frame is made of Cu, Fe-Ni (e.g. Ni content of 42 or 50 [%]), or the like, for example. A tab suspension lead 3D is connected to each of the mutually opposed minor sides of the tab 3A.

A number is put to each terminal of the outer lead 3C in accordance with a standard rating and determines the signal applied thereto. In FIG. 2, the left upper end is a first terminal, the left lower end is a 15th terminal, the right lower end is a 16th terminal and the right upper end is a 30th terminal. In other words, the resin molded semiconductor device 2 of this embodiment I comprises 30 terminals (30 pins) in total ranging from the first to 30th terminals that are disposed sequentially.

Address signals $A_{13}$, $A_{12}$, $A_{11}$, $A_{10}$ and $A_9$ are applied to the first, second, third, fourth and fifth terminals, respectively. Address signals $A_3$, $A_2$, $A_{20}$, $A_1$ and $A_0$ are applied to the sixth, seventh, eigth, ninth and tenth terminals, respectively. A row address strobe signal $\overline{RF}$ is applied to the eleventh terminal, a column address strobe signal $\overline{CE}$ is applied to the twelfth terminal, an output enable signal $\overline{OE}$ is applied to the 13th terminal and a write enable signal $\overline{WE}$ is applied to the 14th terminal. A reference voltage $V_{ss}$ such as the ground potential 0 [V] of the circuit is applied to the 15th terminal.

A data output signal $D_{out}$ and a data input signal $D_{in}$ are applied to the 16th and 17th terminals, respectively. Address signals $A_{19}$, $A_{18}$ and $A_{17}$ are applied to the 18th, 19th and 20th terminals, respectively. Address signals $A_4$, $A_5$, $A_{21}$, $A_6$ and $A_7$ are applied to the 21st, 22nd, 23rd, 24th and 25th terminals, respectively. Address signals $A_8$, $A_{16}$, $A_{15}$ and $A_{14}$ are applied to the 26th, 27th, 28th and 29th terminals, respectively. A power source voltage $V_{cc}$ such as the operation voltage 5 [V] of the circuit is applied to the 30th terminal.

The hybrid semiconductor integrated circuit device 1, the tab 3A, the bonding wire 4, the inner lead 3B and the tab suspension lead 3D are molded by the resin molding portion 5. The resin molding portion 5 uses a phenolic type curing agent or an epoxy resin to which silicone rubber and a filler are added, in order to accomplish a low stress. The silicone rubber has the function of reducing a thermal expansion coefficient of the epoxy resin. The filler is formed by spherical silicon oxide particles and has the function of reducing likewise the thermal expansion coefficient.

As shown in FIG. 2, the hybrid semiconductor integrated circuit device 1 is equipped at the right lower part with a pellet name portion 1A. The name of product, the model, the production number, and the like, are put to the pellet name portion 1A. This pellet name 1A comprises a later-appearing conductor film or insulation film.

Figure 3:
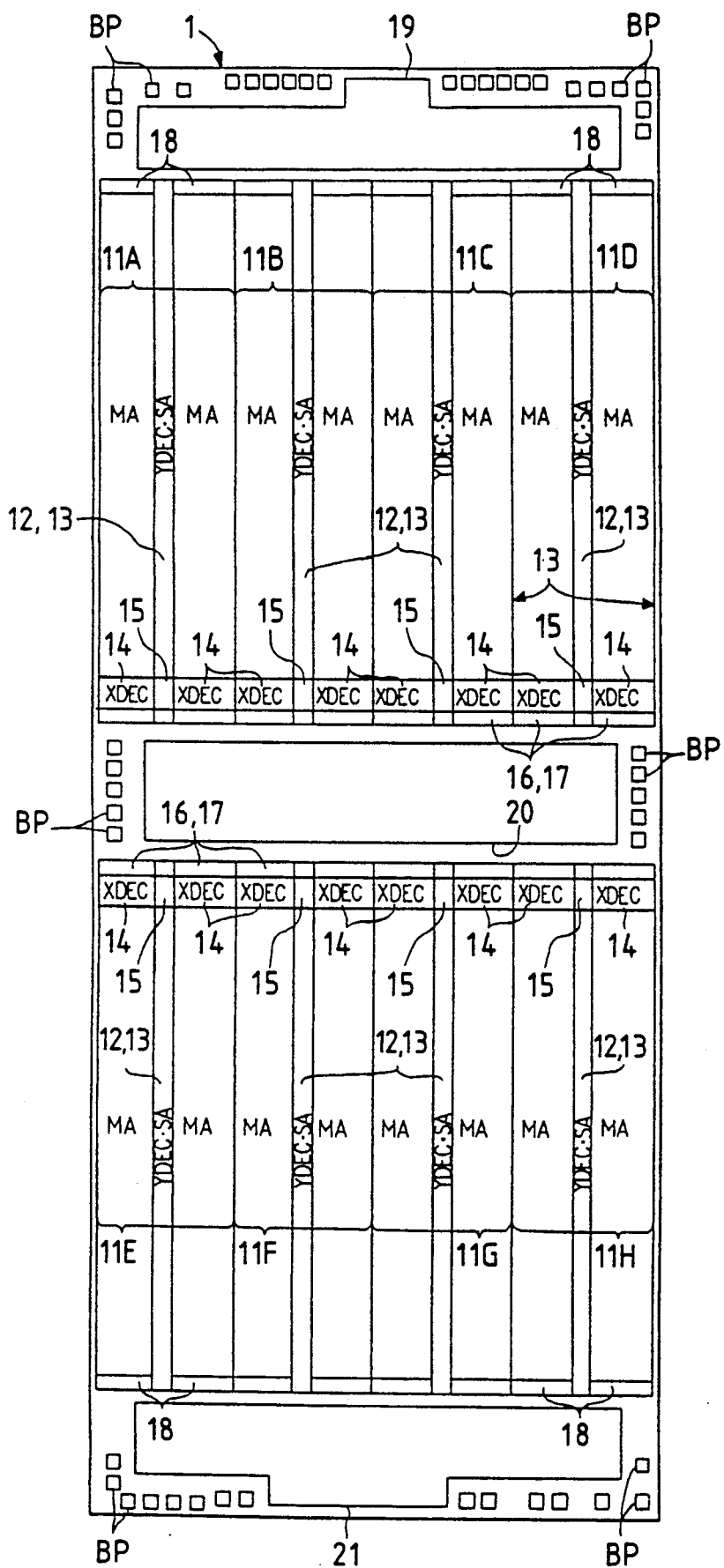
FIG. 3 is a layout diagram of the hybrid semiconductor integrated device.

Next, FIG. 3 (chip layout diagram) shows the schematic structure of the hybrid semiconductor integrated circuit device 1 molded by the resin mold semiconductor device 2.

As shown in FIG. 3, the memory cell array (MA) 11 of DRAM is disposed on the surface at the center of the hybrid semiconductor integrated circuit device 1. This memory cell array 11 is divided into eight segments, that is, the four memory cell arrays 11A~11D divided on the upper part of the hybrid semiconductor integrated circuit device 1 and the four memory cell arrays 11E~11H divided on its lower part. In other words, DRAM employs an 8-mat structure. Each of the eight divided memory cell arrays 11A~11H is further divided into two segments or in other words, the memory cell array 11 is divided into total 16 memory cell arrays MA. One of these 16 divided memory cell arrays MA has a 256 [Kbit] capacity.

Part of column address decoder circuit (YDEC) 12 and a sense amplifier circuit (SA) 13 are disposed between the two memory cell arrays MA of the 16 divided memory cell arrays. The sense amplifier circuit 13 comprises complementary MISFETs (CMOS) and part of the sense amplifier circuit 13 comprises n-channel MISFET, P-channel MISFET as the other part of the sense amplifier circuit 13 is positioned at the end of the memory cell array MA at the position opposed the part described above. Complementary data lines (two data lines) extend from one of the ends of the sense amplifier circuit 13 on the memory cell array MA, and DRAM of this embodiment has a folded bit line system (two crosspoint system).

A row address decoder circuit (XDEC) 14 and a word driver circuit (not shown) are disposed at the end of each of the 16 divided memory cell arrays MA on its center side. A data line pre-charge circuit 15, a common source switch circuit 16 and a word line pre-charge circuit 17 are disposed in the proximity of the row address decoder circuit 14 described above.

A common source switch circuit 18 is disposed at the other end of each of the 16 divided memory cell arrays MA on its peripheral side.

These circuits 12~18 disposed at the periphery of the 16 divided memory cell arrays MA are constituted as the direct peripheral circuit of DRAM.

An upper side peripheral circuit 19 is disposed on the upper side of DRAM and a lower side peripheral circuit 20, on its lower side. Intermediate side peripheral circuits 21 are disposed between the four memory cell arrays 11A~11D among the eight memory cell arrays on the upper side of DRAM and between the four memory cell arrays 11E~11H on the lower side. These peripheral circuits 19~21 are constituted as the indirect peripheral circuit of DRAM.

Figure 4:
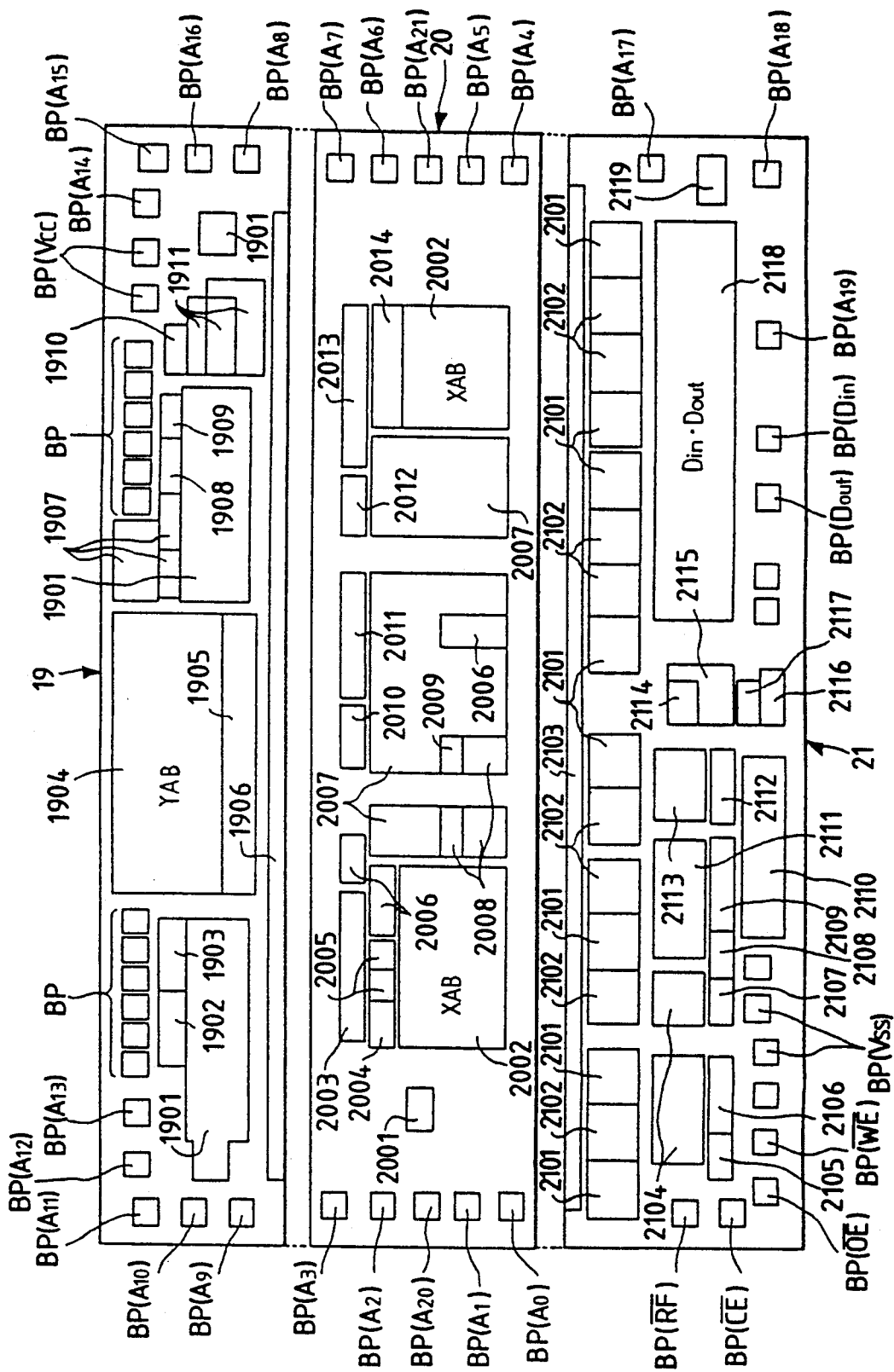
FIG. 4 is an enlarged layout diagram of the principal portions of FIG. 3.

Next, the definite circuit disposition of the indirect peripheral circuit of DRAM of the hybrid semiconductor integrated circuit device 1 described above will be explained briefly with reference to FIG. 4 (enlarged layout diagram of the principal portions). FIG. 4 shows also the names of signals applied to the external terminals BP.

As shown in FIG. 4, each circuit of the upper side peripheral circuit 19 of the indirect peripheral circuit 19 is basically disposed near the external terminal BP to which each signal is applied Reference numeral 1901 represents a Y system redundancy circuit; 1902 is a $V_G$ generation circuit; 1903 is a sense amplifier control circuit; 1904 is a Y address buffer circuit; 1905 is a Y predecoder circuit; 1906 is a common source drive circuit; and 1907 is a $v_{ss}$ generation circuit ($V_{ss}$ generator).

This $V_{ss}$ generation circuit 1907 is the circuit which generates a potential of $-2.5 \sim 3.5$ [V], for example. Reference numeral 1908 represents a column address strobe system clock generation circuit; 1909 is a substrate potential detection circuit; 1910 is an HVC generation circuit; and 1911 is a text mode control circuit.

Each of the circuits of the intermediate side peripheral circuit 20 of the indirect peripheral circuit described above is likewise disposed basically near the external terminal BP to which each signal is applied. Reference numeral 2001 represents a common source short circuit; 2002 is an X address buffer circuit; 2003 is a $\overline{WE}$ buffer circuit; 2004 is an output control circuit; 2005 is a 4-bit test circuit; 2006 is a sense amplifier control circuit; 2007 is an X system redundancy circuit; 2008 is an X system predecoder circuit; 2009 is a Y system control signal generation circuit; and 2010 is a column address strobe system clock generation circuit. Reference numeral 2011 represents a refresh signal buffer circuit; 2012 is a redundancy precharge circuit; 2013 is a $V_{CH}$ generation circuit; and 2014 is a memory cell array select signal generation circuit.

Similarly, each of the circuits of the lower side peripheral circuit 21 of the indirect peripheral circuit is disposed basically near the external circuit to which each signal is applied. Reference numeral 2101 represents a main amplifier circuit for writing; 2102 is a main amplifier for reading; 2103 is a common source drive circuit; 2104 is a Z system address buffer circuit; 2105 is a substrate potential detection circuit; 2106 is a column address strobe system buffer circuit; 2107 is a column address strobe system clock generation circuit; 2108 is a test mode control circuit; 2109 is an output enable system circuit; 2110 is a multi-bit test circuit; 2111 is a Z system predecoder circuit; 2112 and 2115 are main amplifier control circuits; 2113 is an output select circuit; 2114 is an output control circuit; 2116 is a sense amplifier control circuit; 2117 is an AL master control circuit; 2118 is a data input buffer-data output buffer circuit; and 2119 is a $V_{REF}$ generation circuit.

Next, the principal portions of each of the divided memory cell arrays MA of DRAM and the principal portions of its peripheral circuit will be explained with reference to FIG. 5 (equivalent circuit diagram of the principal portions).

Figure 5:
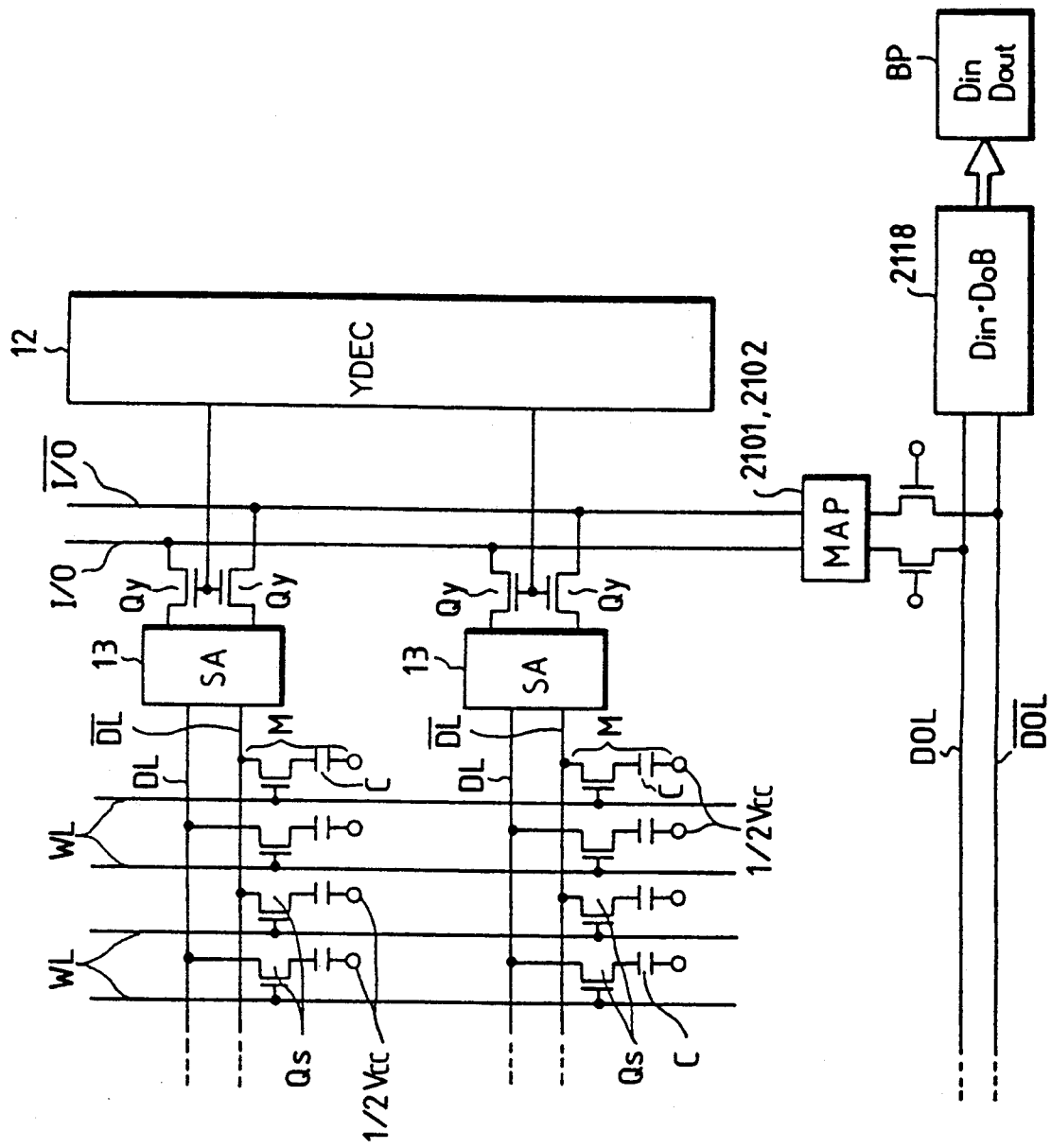
FIGS. 5 to 9 are equivalent circuit diagrams of the principal portions of the hybrid semiconductor integrated circuit device.

As shown in FIG. 5, in DRAM employing the folded bit line system, the complementary data lines DL, $\overline{DL}$ extend in the columnar direction in the memory cell array MA. A plurality of sets of complementary data lines DL are disposed in the row direction. They are connected to the sense amplifier (SA) circuit 13.

In the memory cell array MA, the word lines WL extend in the columnar direction crossing the complementary data lines DL. A plurality of word lines WL are disposed in the columnar direction. Though not shown in the drawing, each word line WL is connected to the row address buffer circuit (XDEC) 14 so that it can be selected.

A memory cell (memory device) M for storing 1 [bit] data is disposed at each point of intersection between the complementary data line DL and the word line WL. The memory cell M comprises the series circuit of an n-channel MISFET Qs for selecting the memory cell and a data storage capacitance element C.

One of the semiconductor regions of the memory cell selecting MISFET Qs of the memory cell M is connected to the complementary data line DL and the other, to one of the electrodes of the data storage capacitance element C. The gate electrode is connected to the word line WL. The other electrode of the data storage capacitance element C is connected to the power source voltage $\frac{1}{2} V_{cc}$. The power source voltage $\frac{1}{2} V_{cc}$ is an intermediate voltage between the reference voltage $V_{ss}$ and the power source voltage $V_{cc}$, that is, about 2.5 [V]. The power source voltage $\frac{1}{2} V_{cc}$ can reduce the field intensity applied between the electrodes of the data storage capacitance element C and can reduce the drop of the dielectric withstand voltage of a dielectric film.

The sense amplifier circuit 13 described above is constituted in such a manner as to amplify the data of the memory cell M transmitted through the complementary data line DL. The data amplified by the sense amplifier circuit 13 is outputted to the common data lines I/O and $\overline{I}/$ through an n-channel MISFET Qy for column switching. The column switching MISFET Qy is controlled by the column address decoder circuit (YDEC) 12.

The common data line I/O is connected to the main amplifier circuit 2101 for writing and to the main amplifier circuit 2102 for reading. Each of these main amplifier circuits 2101, 2102 is connected to the external terminal for signal input (Din) BP and to the external terminal for signal output (Dout) BP through MISFET for switching (without symbol), the input/output signal lines DOL, $\overline{DOL}$ and the data input buffer-data output buffer circuit (Din, DoB) 2118, respectively.

Figure 6:
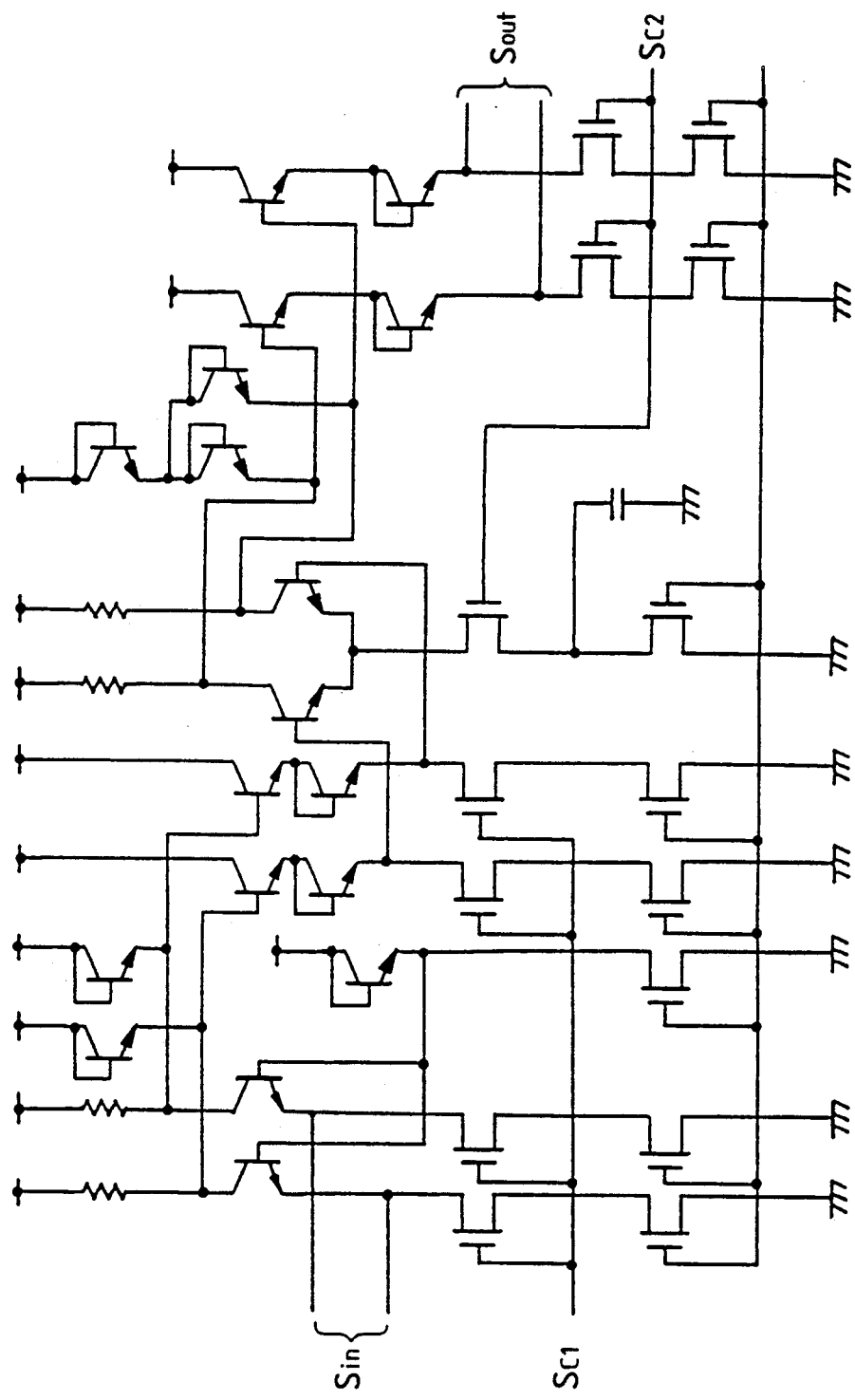
Figure 7:
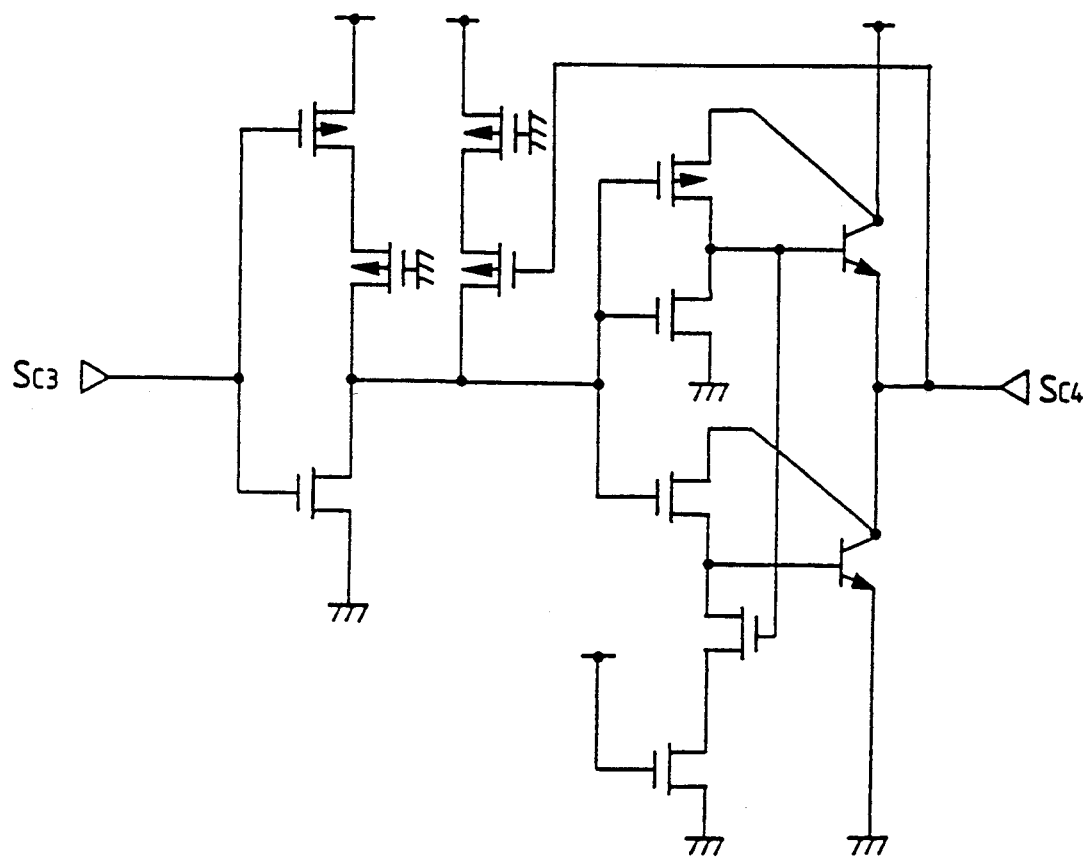

Next, among the indirect peripheral circuits of DRAM shown in FIG. 4, the principal portions of the main amplifier circuit 2102 for reading of the lower side peripheral circuit 21 and the principal portions of the column address strobe system buffer circuit 2106 are shown in FIG. 6 (equivalent circuit diagram) and in FIG. 7 (equivalent circuit diagram), respectively.

Part of the peripheral circuits comprises a bipolar transistor and complementary MISFETs in the hybrid semiconductor integrated circuit device 1 in order to improve the operation speed and the high driving capacity, to attain a higher integration density and to reduce power consumption. As shown in FIG. 6, the main amplifier 2102 for reading comprises an ECL gate circuit using the bipolar transistors and MISFET as its principal components. This main amplifier circuit 2102 for reading includes a resistance element and a capacitance element. In FIG. 6, symbol Sin represents the input signal, Sout is an output signal and Sc1 and Sc2 are the control signals.

As shown in FIG. 7, the column address strobe system buffer circuit 2106 comprises a Bi-CMOS gate circuit whose input side comprises complementary MISFETs and whose output side comprises bipolar transistors. In FIG. 7, symbol $Sc_3$ represents an input clock signal and $Sc_4$ does an output clock signal.

Figure 8:
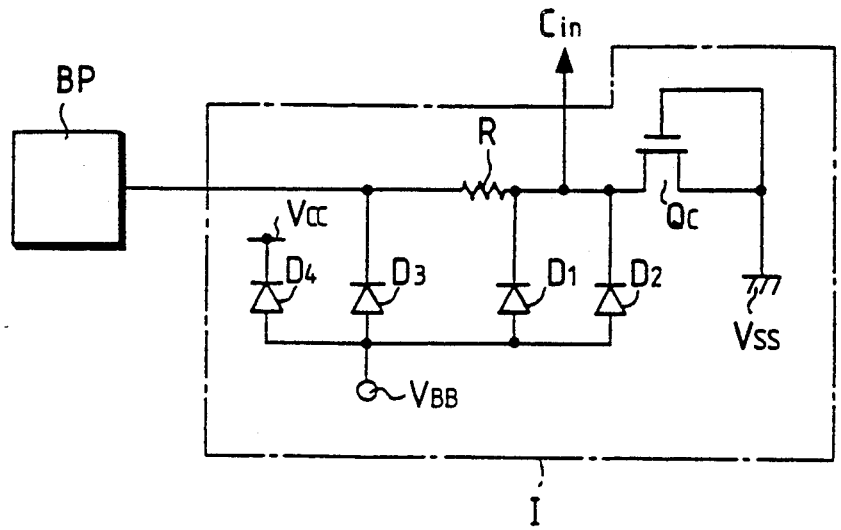
Figure 9:
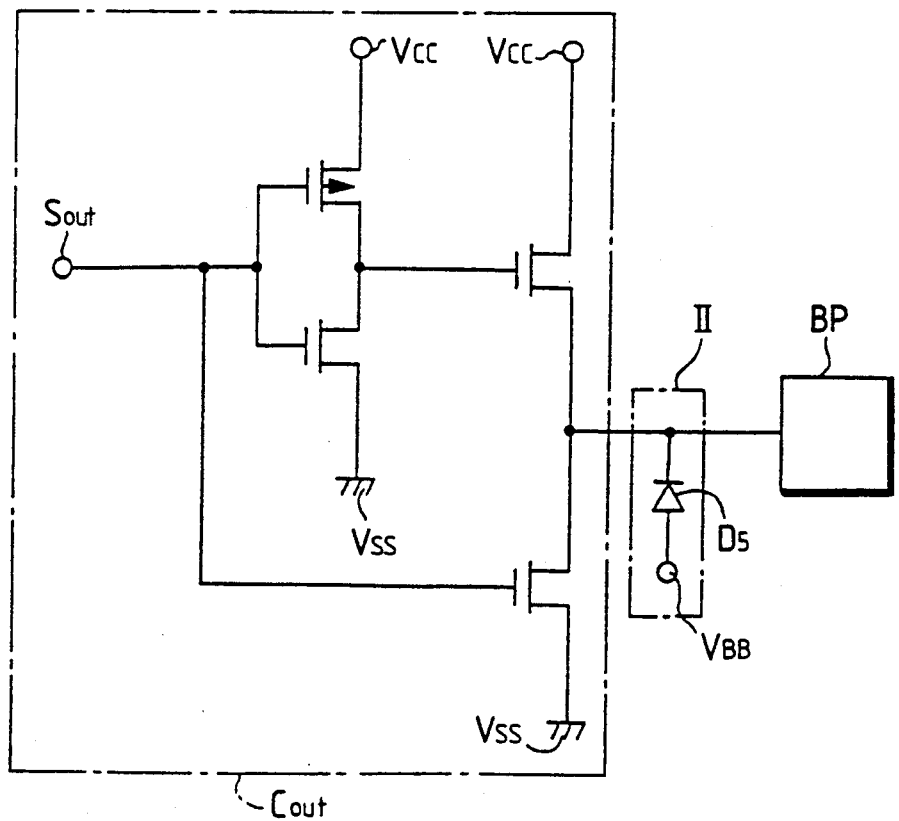

The input portion of the hybrid semiconductor integrated circuit device 1 is shown in FIG. 8 (equivalent circuit diagram) and its output portion, in FIG. 9 (equivalent circuit diagram).

As shown in FIG. 8, the input portion of the hybrid semiconductor integrated circuit device 1, e.g. the data input buffer-data output buffer circuit 2118, has its input stage circuit Cin connected to the external terminal BP for the input signal. Though not shown in the drawing, the input stage circuit Cin comprises a CMOS inverter circuit, for example. A dielectric breakdown prevention circuit I is disposed between the external terminal BP for the input signal and the input stage circuit Cin.

The dielectric breakdown prevention circuit I comprises mainly a protective resistance element R, a clamp MISFET Qc and diode devices $D_1 \sim D_4$. The protective resistance element R is disposed in series between the external terminal BP and the input stage circuit Cin. This protective resistance element R has the function of reducing the excessive current that will otherwise cause dielectric breakdown. The clamp MISFET Qc comprises an n-channel MISFET. The drain regions of the clamp MISFET Qc are connected to the external terminals BP through the input stage circuit Cin and the protective resistance element R, respectively. The source region and gate electrode of the clamp MISFET Qc are connected to the reference potential $V_{ss}$, respectively. The clamp MISFET Qc is constituted in such a manner as to absorb the excessive current towards the semiconductor substrate side. The cathode region of each diode device $D_1 \sim D_3$ is connected between the external terminal BP and the input stage circuit Cin in parallel with the others. The anode region of each diode device $D_1 \sim D_3$ is connected to the semiconductor substrate and to the substrate potential $V_{ss}$. Each diode device $D_1 \sim D_3$ is constituted in such a manner as to absorb the excessive current towards the semiconductor substrate side. On the other hand, the cathode region of the diode device $D_4$ is connected to the power source voltage $V_{cc}$ and its anode region is connected in parallel with each of the diode devices $D_1 \sim D_3$. This diode device $D_4$ is constituted in such a manner as to absorb the excessive current described above to the power source voltage $V_{cc}$.

This dielectric breakdown prevention circuit I is constituted in such a manner as to reduce the excessive current inputted to the external terminal BP for the input signal and to prevent the breakdown of the gate insulation film of the input stage circuit Cin, that is, the dielectric breakdown.

As shown in FIG. 9, the output portion of the hybrid semiconductor integrated circuit device 1 such as the data input buffer-data output buffer circuit 2118 connects the output stage circuit Cout to the external terminal BP for the output signal. The output stage circuit Cout comprises a push-pull circuit (driver circuit) whose output stage comprises a series circuit of n-channel MISFETs. The source region of one of the n-channel MISFETs of this push-pull circuit and the drain region of the other n-channel MISFET are connected to the external terminal BP described above. The output signal Sout is inputted to the output stage circuit Cout. This output signal Sout is inputted as an inversion output signal to the gate electrode of one of the n-channel MISFETs of the push-pull circuit through a CMOS inverter circuit. (In the drawing, an arrow is put to each p-channel transistor and this will also hold true of the later-appearing drawings.) The output signal Sout is directly inputted to the gate electrode of the other n-channel MISFET of the push-pull circuit.

The dielectric breakdown prevention circuit II is disposed between the external terminal BP for the output signal and the output stage circuit Cout. This dielectric breakdown prevention circuit II comprises a diode device $D_5$. The cathode region of this diode device $D_5$ is connected in parallel with the external terminal BP and the output stage circuit Cout and its anode region is connected to the substrate potential $V_{ss}$. The diode device $D_5$ has the same structure as the diode device $D_2$ of the afore-mentioned dielectric breakdown prevention circuit I of the input portion. The dielectric breakdown prevention circuit II is constituted in such a manner as to absorb the excessive current inputted to the signal terminal BP for the output signal towards the semiconductor substrate side.

Next, the definite structure of the hybrid semiconductor integrated circuit device 1 will be explained briefly with reference to FIG. 1 (sectional view of the principal portions). FIG. 1 shows the input portion IN, the CMOS region CMOS and the bipolar transistor region Bi of the hybrid semiconductor integrated circuit device 1 and the memory cell array region MA of DRAM in order named from the left side to the right side.

As shown in FIG. 1, the hybrid semiconductor integrated circuit device 1 comprises a $p^-$-type semiconductor substrate 30 made of single crystal silicon and a substrate formed by $n^-$-type epitaxial layer 33 grown on the main plane of the former.

Bipolar transistors T1, T2 are disposed in the bipolar transistor formation region Bi of the hybrid semiconductor integrated circuit device 1. Each of the bipolar transistors T1, T2 is disposed on the main plane of the $p^-$-type semiconductor substrate 30 within the region encompassed of the device isolation region. The device isolation region comprises a $p^-$-type semiconductor substrate 30, a buried $p^+$-type semiconductor region 32, a $p^-$-well region, a p-type channel stopper region 37 and a device isolation insulation film 36. The buried $p^+$-type semiconductor region 32 forming the device isolation region is disposed between the $p^-$-type semiconductor substrate 30 and the $n^-$-type epitaxial layer 33. The $p^-$-well region 35 is constituted in such a manner that its bottom surface comes into contact with (or is connected to) the buried $p^+$-type semiconductor region 32 on the main plane portion of the $n^-$-type epitaxial layer 33. The p-type channel stopper region 37 is disposed on the main plane portion of the $p^-$-type well region 35. The device isolation insulation film 36 is disposed on the main plane of the $p^-$-well region 35. This device isolation insulation film 36 is made of a silicon dioxide film formed by the selective oxidation of the main plane of the $p^-$-type well region 35.

Each of the bipolar transistors T1, T2 is of an n-p-n type having a vertical structure which comprises an n-type collector region, a p-type base region and an n-type emitter region. The bipolar transistor T1 has high frequency characteristics and the bipolar transistor T2 has a high withstand voltage.

The n-type collector region comprises the buried $n^+$-type semiconductor region 31B, the $n^-$-type well region 34B or the n-type well region 34B and the collector potential pumping $n^+$-type semiconductor region 40. The buried $n^+$-type semiconductor region 31B is disposed between the $p^-$-type semiconductor substrate 30 and the $n^-$-type epitaxial layer 33. This buried $n^+$-semiconductor region 31B is formed in self-alignment with the buried $p^+$-semiconductor region 32. The $n^-$-well region 34B and the n-type well region 34B are used as the intrinsic collector region and are disposed on the main plane portion of the $n^-$-type expitaxial layer 33. The $n^-$-type well region 34B and the n-type well region 34B are formed in self-alignment with the $p^-$-well region 35. The collector potential pumping $n^+$-semiconductor region 40 is constituted in such a manner that its bottom surface is in contact with the buried $n^+$-type semiconductor region 31b and it can take out the collector potential of the buried $n^+$-type semiconductor region 31B to the substrate surface.

The n-type well region 34B as the intrinsic collector region of the bipolar transistor T1 has a higher impurity concentration than that of the bipolar transistor T2. In other words, since the bipolar transistor T1 can reduce the resistance value of the intrinsic collector region, it can improve the high frequency characteristics. In contrast, the $n^-$-type well region 34B as the intrinsic collector region of the bipolar transistor has a lower impurity concentration than that of the bipolar transistor T1. In other words, since the bipolar transistor T2 can improve the p-n junction withstand voltage between the intrinsic collector region and the p-type base region, it can improve the withstand voltage.

The p-type base region comprises the p-type semiconductor region 42 used as the intrinsic base region and the $p^+$-type semiconductor region 49 used as the graft base region. The p-type semiconductor region 42 and the $p^+$-type semiconductor region 49 are formed integrally with each other and are disposed on the main plane portions of the $n^-$-type and n-type well regions 34B, 34B, respectively.

The n-type emitter region comprises the $n^+$-semiconductor region 56. The planar shape of this $n^+$-type semiconductor region 56 is defined by a connection hole (emitter aperture) 55 which is formed in a later-appearing inter-level insulation film 54.

A wiring 57 is connected to the collector potential pumping $n^+$-type semiconductor region 40 of the n-type collector region through the connection hole 55 formed in the inter-level insulation film 54. Similarly, a wiring 57 is connected to each of the $p^+$-type semiconductor region 49 as the graft base region of the p-type base region and $n^+$-type semiconductor region 56 as the n-type emitter region through the connection hole 55 formed in the inter-level insulation film 54.

The inter-level insulation film 54 has a two-layered structure comprising a silicon dioxide film 54A and a BPSG (Boron-Phospho-Silicate Glass) film 54 that are laminated sequentially. The silicon dioxide film 54A as the lower layer is disposed in order to prevent the leak of B and P of the BPSG film 54B of the upper layer into the devices of the lower layer. The silicon dioxide film 54A is deposited by CVD using an organic silane gas as a source gas or an inorganic silane gas and a nitrogen oxide gas as the source gases, for example. The BPSG film as the upper layer is constituted in such a manner as to insulate and separate the devices of the lower layer from the conductor layer of the upper layer and to make the surface flat. This BPSG film is deposited by CVD and densifying and reflow treatments are applied thereto.

The wiring 57 described above is formed at the wiring formation step of the first layer in the fabrication process. This wiring 57 has a three-layered structure obtained by laminating sequentially a transition metal silicide film 57A, an aluminum alloy film 57B and a transition metal silicide film 57C. An $MoSi_2$ film is used as each of the transition metal silicide films 57A and 57C, for example. A $TaSi_2$ film, a $TiSi_2$ film or a $WSi_2$ film may be used as the transition metal silicide films 57A and 57C. A transition metal nitride film such as a TiN film may be used in place of the transition metal silicide film 57A of the lower layer.

The transition metal silicide film 57A as the lower layer of the wiring 57 is constituted in such a manner as to be capable of preventing the growth of the epitaxial layer of silicon at the junction portion with the substrate (silicon) and of reducing the resistance value at the junction portion. The aluminum alloy film 57B as the intermediate layer is the main body of the wiring 57 and is prepared by adding copper (Cu) or silicon (Si) to aluminum. Copper (Cu) has the action of reducing the migration phenomenon, and Si has the action of reducing the alloy spike phenomenon. The transition metal silicide film 57C as the upper layer can reduce the optical reflection factor more greatly than the surface of the aluminum alloy film 57B of the lower layer. In other words, the transition metal silicide film 57C of the upper layer can reduce diffraction of an etching mask (photo-resist film) at the time of exposure in photolithography and can reduce fluctuation of the size of the etching mask. Accordingly, fabrication accuracy of the wiring 57 can be improved. The transition metal silicide film 57C of the upper layer can reduce aluminum hill rock occurring on the surface of the aluminum alloy film 57B of the intermediate layer.

A wiring 60 is disposed on the wiring 57 described above through the inter-level insulation film 58. Though not shown in this region, the wiring 60 is connected to the wiring 57 of the lower layer through a connection hole 59 formed in the inter-level insulation film 58. Though not shown in detail in FIG. 1, the inter-level insulation film 58 has a three-layered structure produced by sequentially depositing a silicon dioxide film deposited by plasma CVD, for example, a silicon dioxide film coated by SOG (Spin On Glass) and applied with baking treatment and a silicon dioxide film deposited by plasma CVD. This inter-level insulation film 58 is constituted in order to primarily flatten the surface of the silicon dioxide film of the intermediate layer.

The wiring 60 described above is formed by the wiring formation step of the second layer in the fabrication process. This wiring 60 has a three-layered structure produced by laminating sequentially the transition metal silicide film 60A, the aluminum alloy film 60B and the transition metal silicide film 60C in substantially the same way as the wiring 57 described already.

An n-channel MISFET Qn and a p-channel MISFET Qp are disposed in the CMOS region CMOS of the hybrid semiconductor integrated circuit device 1.

The n-channel MISFET Qn is formed on the main plane of the p$^-$-type well region 25 inside the region whose periphery is encompassed by the device isolation insulation film 36 and the p-channel stopper region 37. The device isolation insulation film 36 comprises a silicon dioxide film formed by oxidizing the main plane of the p$^-$-type well region 35. The p-type channel stopper region 37 is disposed on the main plane portion of the p$^-$-well region 35 below the device isolation insulation film 36. The buried p$^+$-semiconductor region 32 is disposed below the bottom of the p$^-$-well region 35 in contact (connection) therewith. This buried p$^+$-semiconductor region 32 is used as part of the p$^-$-type well region 35 and has a higher impurity concentration than the latter. In other words, since the buried p$^+$-semiconductor region 32 can reduce the specific resistance value of the bottom portion of the p$^-$-well region 35, it can prevent the parasitic thyristor operation which is inherent to CMOS. The p$^-$-well region 35, the buried p$^+$-semiconductor region 32 and the p-type channel stopper region 37 are formed by the same layer as the p$^-$-well region 35 of the device isolation region of the bipolar transistor region Bi, the buried p$^+$-semiconductor region 32 and the p-type channel stopper region 37, respectively.

The n-channel MISFET Qn described above mainly comprises the p$^-$-type well region 35, the gate insulation film 43, the gate electrode 44, a pair of n-type semiconductor regions 45 as the source and drain regions and a pair of n$^+$-type semiconductor regions 48.

The p$^-$-type well region 35 is used as the channel formation region. The gate insulation film 43 comprises the silicon dioxide film prepared by oxidizing the main plane of the p$^-$-type well region 35. The gate electrode 44 comprises a composition film prepared by laminating a transition metal silicide film (refractory metal silicide film) on a polycrystalline silicon film. Besides the composite film described above, the gate electrode 44 may be a polycrystalline silicon film, a transition metal silicide film or a transition metal film (refractory metal film such as Mo, Ti, Ta, W), or a composite film prepared by laminating the transition silicide film or the transition metal film on the polycrystalline silicon film. The gate electrode 44 is formed by the gate wiring formation step of the first layer in the fabrication process.

The n-type semiconductor region 45 having a low impurity concentration is disposed between the n$^+$-semiconductor region 48 having a high impurity concentration and the channel formation region. This n-type semiconductor region 45 constitutes the n-channel MISFET Qn in the so-called LDD (Lightly Doped Drain) structure. The n-type semiconductor region 45 is formed in self-alignment with the gate electrode 44. The n$^+$-type semiconductor region 48 having the high impurity concentration is formed in self-alignment with the sidewall spacer 47 which is in turn formed in self-alignment with the sidewall of the gate electrode 44 described above. The sidewall spacer 47 comprises a silicon dioxide film, for example.

The wiring 57 is connected to the n$^+$-type semiconductor region 48 as the source and drain regions of the n-channel MISFET Qn through the connection hole 55 formed in the inter-level insulation film 54. The wiring 57 is formed by the same layer as the wiring 57 formed in the bipolar transistor region Bi.

The p-channel MISFET Qp is formed on the main plane of the n$^-$-type well region 34A inside the region which is encompassed by the device isolation insulation film 36. A buried n$^+$-type semiconductor region 31A is disposed at the bottom of the n$^-$-well region 34A in contact with it. This buried n$^+$-type semiconductor region 31A is used as part of the n$^-$-type well region 34A and has a higher impurity concentration than the latter. The buried n$^+$-type semiconductor region 31A is constituted in such a manner as to reduce the specific resistance value of the bottom portion of the n$^-$-type well region 34A and to prevent the parasitic thyristor operation in the same way as the buried type p$^+$-semiconductor region 32. The n$^-$ = well region 34A and the buried n$^+$-type semiconductor region 31A are formed by substantially the same layer as the n$^-$-type well region (intrinsic collector region) 34B of the bipolar transistor region Bi and the buried n$^+$-type semiconductor region (buried collector region) 31B, respectively. The buried n$^+$-type semiconductor region 31A has a greater size in the direction of depth of the substrate than the buried n$^+$-type semiconductor region 31B of the bipolar transistor region Bi. In other words, the buried n$^+$-semiconductor region 31A causes the n-type impurity (P, in this case) to positively spring up towards the n$^-$-type well region 34A. As a result, the depth of the n$^-$-type well region 34A, in which the p-channel MISFET Qp is formed, from the surface (or the depth to the buried n+-type semiconductor region 31A) is smaller than the depth of the n⁻-type well region 34B of the bipolar transistor region Bi.

The p-channel MISFET Qp comprises mainly the n⁻-type well region (channel formation region) 34A, the gate insulation film 43, the gate electrode 44, a pair of p-type semiconductor regions 46 and a pair of p+-type semiconductor regions 49 as the source and drain regions. The p-channel MISFET Qp has the LDD structure in the same way as the n-channel MOSFET Qn.

The n⁻-type well region 34A in which the p-channel MISFET Qp is formed has a small depth as described above, and the region having a depth twice the junction depth (xj) from the surface of the n⁻-type well region 34A to the p+-type semiconductor region 49 of the p-channel MISFET Qp has a higher impurity concentration than the n⁻-type well region 34B of the bipolar transistor region Bi. The impurity concentration of this n⁻-type well region 34A is increased by the spring of the n-type impurity of the buried n+-type semiconductor region 31A as the lower layer of the former. The region having the depth twice the junction depth from the surface of the n⁻-type well region 34A is the region where a depletion region formed from the p-n junction portion between the p+-type semiconductor region 49 of the p-channel MISFET Qp and the n⁻-type well region 34A extends and where punch-through occurs. In the hybrid semiconductor integrated circuit device 1 of this embodiment, punch-through occurs in the region within the range of from about 0.2 [μm] to about 0.8 [μm] of the surface. Therefore, the n⁻-type well region 34A has a higher impurity concentration in this range than the impurity concentration of the n⁻-type well region 34B in the same range. Incidentally, the junction depth of the p+-type semiconductor region 49 of the p-channel MISFET Qp is about 0.5 [μm] in this embodiment. The wiring 57 is connected to the p+-type semiconductor region 49 as the source and drain regions of the p-channel MISFET Qp through the connection hole 44 formed on the inter-level insulation film 54.

In the hybrid semiconductor integrated circuit device 1 including the bipolar transistors T (T1, T2) whose n⁻-type well region (intrinsic collector region) 34B and buried n+-type semiconductor region (buried collector region) 31B are sequentially disposed in the direction of the depth of the substrate and the p-channel MISFET Qp whose n⁻-type well region 34A and buried n+-type semiconductor region 31A, which are the same layer as the n⁻-well region 34B and buried n+-type semiconductor region 31B and have the same conductivity as that of the latter, are disposed sequentially in the direction of the depth of the substrate, the depth of the n⁻-type well region 34A forming the p-channel MISFET Qp from the substrate surface is made to be smaller than the depth of the n⁻-type well region (intrinsic collector region) 34B of the bipolar transistor T from the substrate surface. According to this structure, the n⁻-type well region 34A forming the p-channel MISFET Qp is made shallow and in this manner, the depth of the buried n+-type semiconductor region 31A having a higher impurity concentration than this n⁻-type well region 34A from the substrate surface can be made small. Accordingly, it is possible to reduce punch-through of the p-channel MISFET Qp by increasing the impurity concentration of the n⁻-type well region 34A on the surface side (or by reducing the short-channel effect) and to attain a higher integration density of the p-channel MISFET Qp. It is also possible to isolate the p-type base region (p-type semiconductor region 42 and p+-type semiconductor region 49) to be formed on the main plane of the n⁻-type well region 34B and the buried n+-type semiconductor region 31B from each other by making the n⁻-type well region 34B as the intrinsic collector region of the bipolar transistor T deep. Thus, it is possible to improve the p-n junction withstand voltage between the p-type base region and the n-type collector region and to improve the withstand voltage of the bipolar transistor T.

Since it is not necessary to introduce (counter-dope) the n-type impurity in a high concentration into the main plane portion of the n⁻-type well region (channel formation region) 34A so as to reduce punch-through in the p-channel MISFET Qp, it is possible to reduce the impurity scatter effect and to increase the source-drain current quantity Ids. Therefore, the operation speed can be improved.

Figure 10:
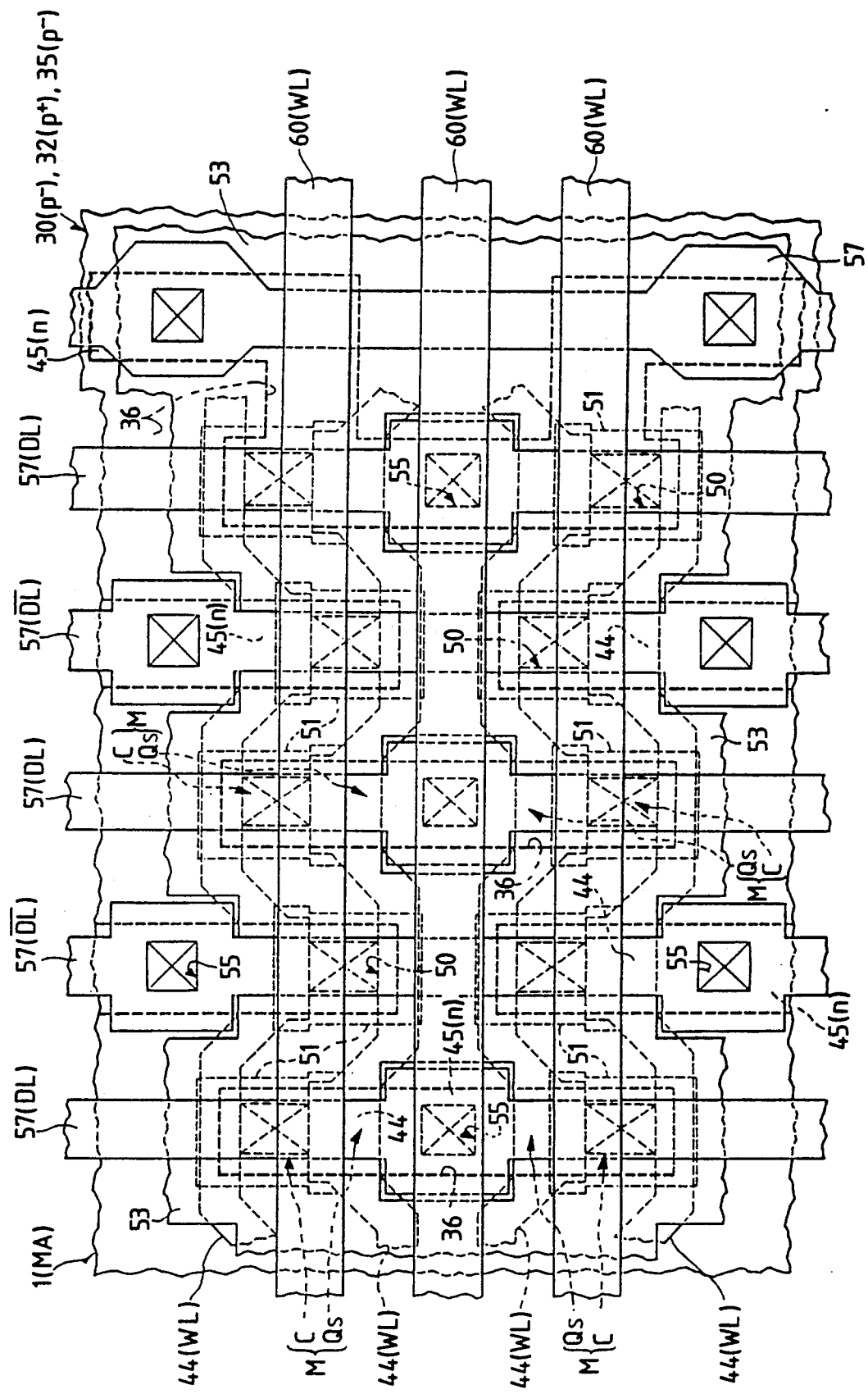
FIG. 10 is a plan view of the principal portions of DRAM mounted to the hybrid semiconductor integrated circuit device.

A plurality of memory cells M are disposed in matrix in the memory cell array MA of DRAM of the hybrid semiconductor integrated device 1 as shown in FIGS. 1 and 10 (plan view of the principal portions).

Figure 11:
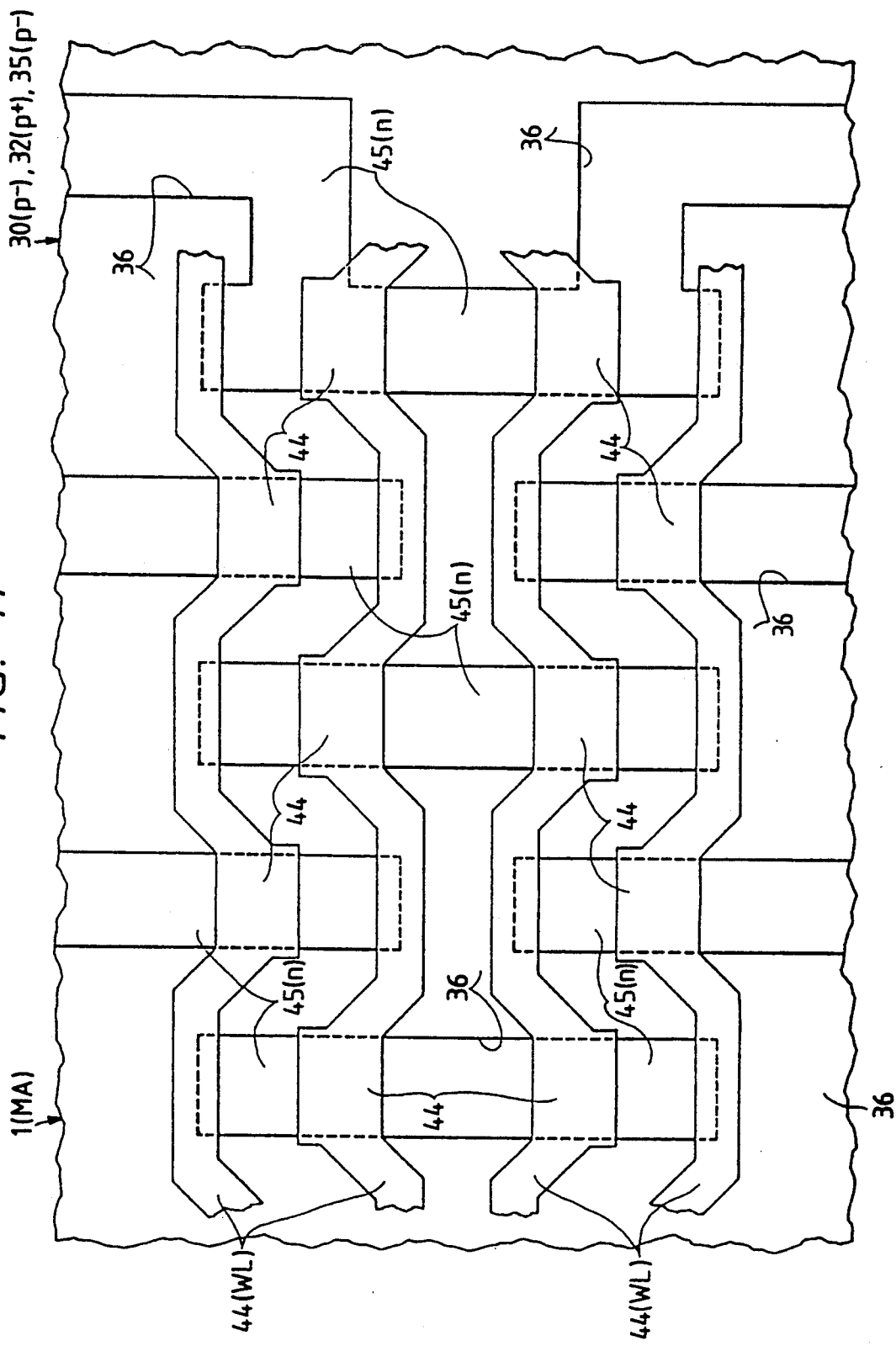
FIGS. 11 and 12 are plan views of the principal portions at predetermined fabrication steps of DRAM.

As shown in FIGS. 1, 10 and 11 (which is a plan view of the principal portions at a predetermined fabrication step), the memory cell selection MISFET Qs of the memory cell M is formed on the main plane portion of the p⁻-type well region 35 inside the region whose periphery is encompassed by the device isolation insulation film 36 and by the p-type channel stopper region 37. A buried p+-type semiconductor region 32 is disposed at the bottom of the p⁻-type well region 35 in the same way as the p⁻-type well region 35 in which the n-channel MISFET Qn is formed.

The memory selection MISFET Qs comprises mainly the p⁻-type well region (channel formation region) 35, the gate insulation film 43, the gate electrode 44 and a pair of n-type semiconductor regions 45 as the source and drain regions. This memory cell selection MISFET Qs has substantially the same structure as the n-channel MISFET Qn described already except for the source and drain regions. The n-type semiconductor region 45 as the source and drain regions of the memory cell selection MISFET Qs is formed by implanting an n-type impurity ion (e.g. As) in a concentration of up to $10^{14}$ [atoms/cm$^2$]. In other words, the n-type semiconductor region 45 is constituted in such a manner as to reduce the number of crystal defects due to the introduction of the n-type impurity, to sufficiently recover the crystal defects by heat-treatment after ion implantation and to reduce a leakage quantity at the p-n junction, that is, the leakage quantity of charges as the data of the data storage capacitance element C. Since this n-type semiconductor region 45 has a low impurity concentration, the memory cell selection MISFET Qs has the LDD structure in the same way as the n-channel MISFET Qn.

The gate electrode 44 is formed integrally with the word line (WL) 44 that extends in the row direction as shown in FIGS. 10 and 11. In other words, each of the gate electrode 44 and the word line 44 is formed by the same conductor layer. The word line 44 is arranged to connect the gate electrodes of memory cell selection MISFETs Qs of a plurality of memory cells M disposed in the row direction.

The gate length of the gate electrode 44 of each memory cell selection MISFET Qs is greater than the width of the word line 44. For instance, the gate length of the gate electrode 44 is 1.0 [μm], whereas the width of the word line 44 is 0.6 [μm]. In the hybrid semiconductor integrated circuit device 1 of this embodiment, the minimum fabrication size is 0.6 [μm].

The complementary data lines (DL) 57 are connected to one of the n-type semiconductor regions 45 (on the connection side of the complementary data lines) of the memory cell selection MISFET Qs through the connection hole 55 bored in the inter-level insulation film 54. One of the n-type semiconductor regions 45 and the complementary data line 57 are connected through the n+-type semiconductor region 56. They are formed integrally with each other. The n+-type semiconductor region 56 is formed by introducing an n-type impurity into the main plane portion of the p−-type well region 35 inside the region which is defined by the connection hole 55. This n+-type semiconductor region 56 is formed in such a manner as not to cause short-circuit between the complementary data line 57 and the p−-type well region 35 even when deviation of mask registration occurs at the fabrication step of each of the connection hole 55 and the device isolation insulation film 36. The n+-type semiconductor region 56 can reduce the connection resistance value of the complementary data line 57 and one of the n-type semiconductor regions 45.

The other n-type semiconductor region 45 (on the connection side of the data storage capacitance element C) of the memory cell selection MISFET Qs is connected to the lower electrode layer 51 of the later-appearing data storage capacitance element C and the n+-type semiconductor region 51A is interposed for the connection between them. This n+-type semiconductor region 51A is formed integrally with the other n-type semiconductor region 45. The n+-type semiconductor region 51A is formed by diffusing the n-type impurity, which is introduced into the lower electrode layer 51, into the main plane portion of the p−-type well region 35 inside the region defined by the connection hole 50 which connects the lower electrode layer 51. This n+-type semiconductor region 51A is constituted so that it can reduce the connection resistance value between the other n-type semiconductor region 45 and the lower electrode layer 51. The +-type semiconductor region 51A is constituted in such a manner as to increase the parasitic capacitance added to the p-n junction portion between the other n-type semiconductor region 45 and the p−-type well region 35, and to increase the charge storage quantity of the data storage capacitance element C.

An insulation film (silicon dioxide film) without reference symbol is disposed on the gate electrode 44 of the memory cell selection MISFET Qs and a sidewall spacer 47 is disposed on the sidewall of each of the insulation film and the gate electrode 44.

Figure 12:
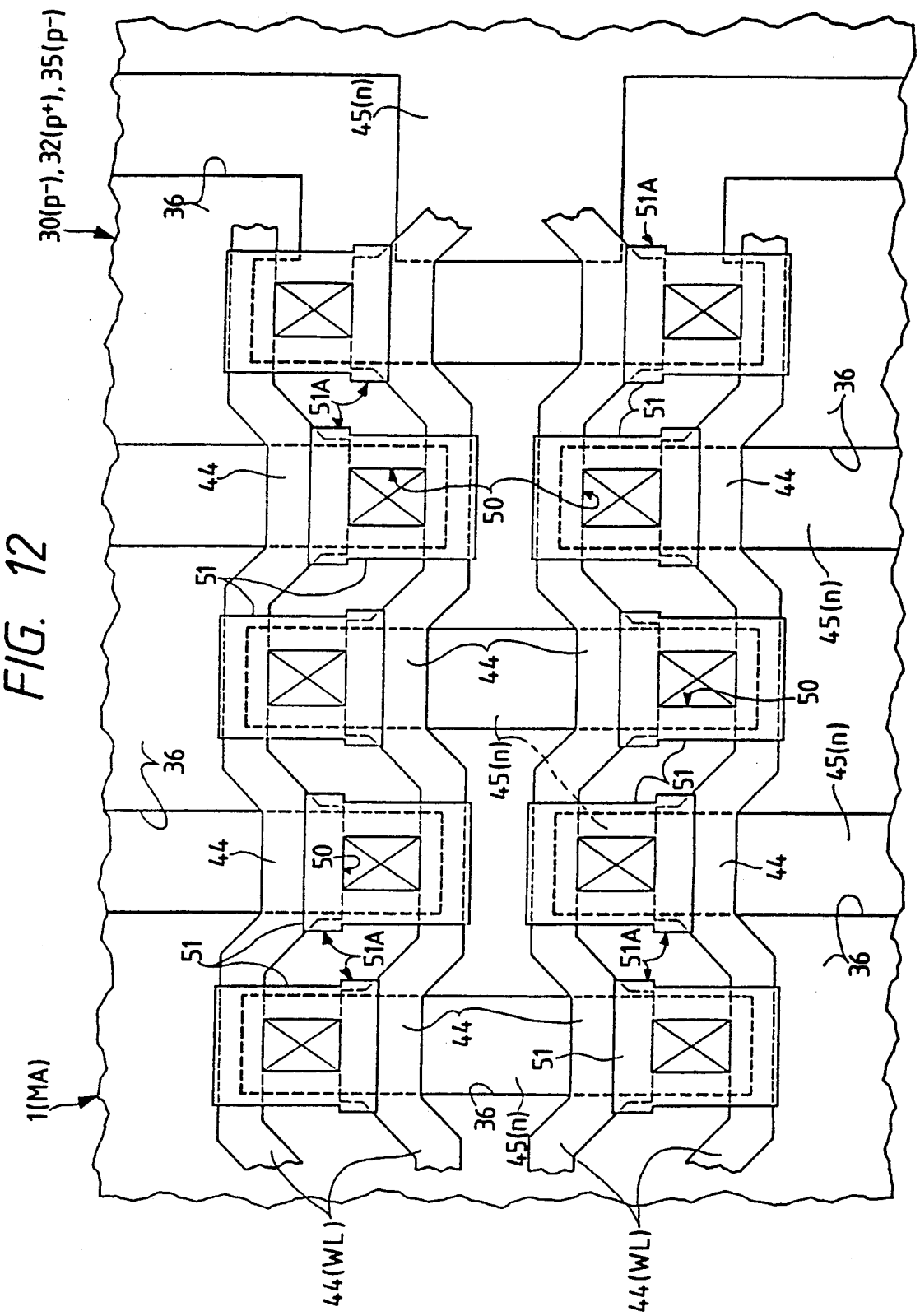

As shown in FIGS. 1, 10 and 12 (which is a plan view of the principal portions at a predetermined fabrication step), the data storage capacitance element C of the memory cell M is formed by mainly laminating sequentially a lower electrode layer 51, a dielectric film 52 and an upper electrode layer 53. In other words, the data storage capacitance element C has the so-called "stacked structure" (lamination type: STC).

Part of the lower electrode layer 51 (central portion) of the data storage capacitance element having the stacked structure is connected to the other n-type semiconductor region 45 of the memory selection MISFET Qs. This connection is made through the connection hole which is formed in the inter-level insulation film, not shown, and the connection hole 50 which is defined by the sidewall spacer 47. The open size of the connection hole 50 in the columnar direction is determined by the isolation dimension between the gate electrode 44 of the memory cell selection MISFET Qs and the word line 44 adjacent to the former.

The lower electrode layer 51 of the data storage capacitance element C of the stacked structure is formed by a polycrystalline silicon film deposited by CVD, for example, and an n-type impurity (As or P) for reducing the resistance value is introduced in a high concentration into this polycrystalline silicon film. In order to utilize the step of the base and to increase the charge storage quantity of the data storage capacitance element C of the stacked structure by utilizing the sidewall, the lower electrode layer 51 is formed in a relatively large thickness of from about 200 to 400 [nm], for example. This lower electrode layer 51 is formed by the gate wiring formation step of the second layer in the fabrication process. As shown in FIGS. 10 and 12, the planar shape of the lower electrode layer 51 is elongated in the columnar direction in which the complementary data lines 57 extend.

A correction pattern 51A which projects in the planar direction from the region formed in a planar shape towards the connection side between the n-type semiconductor region 45 and the complementary data line 57 is disposed on the lower electrode layer 51 as shown in FIG. 12. The size of the etching mask (photoresist film) for fabricating the lower electrode layer 51 is reduced due to diffraction that occurs in the region where the gap of the lower electrode layer 51 is great in the connection region described above. Therefore, since the size of the lower electrode layer 51 becomes thus smaller than a predetermined set value, the charge storage quantity of the data storage capacitance element C of the stacked structure decreases. For this reason, the correction pattern 51A is constituted so as to enlarge in advance the size of the lower electrode layer 51 in consideration of the decrease of the size. Though the correction pattern 51A is disposed on the connection side where a margin can be secured between the lower electrode layers 51 from the layout aspect, this arrangement is not limitative and it may be disposed on the opposite side to the above. Incidentally, the actual planar shape of the lower electrode layer 51 is rounded as a whole because the corner portions of the square are considerably cut off.

Basically, the dielectric film 52 has a two-layered structure of a silicon nitride film deposited by CVD on the upper layer (on the surface) of the lower electrode layer (polycrystalline silicon film) 51 and a silicon dioxide film obtained by oxidizing this silicon nitride film and laminating it at a high pressure. Since a natural silicon dioxide film (which is extremely thin below 5 [nm] and is not therefore shown in the drawing) is formed on the surface of the polycrystalline silicon film as the lower electrode layer 51, the dielectric film 52 has practically a three-layered structure of the natural oxidation film, the silicon nitride film and the silicon dioxide film. Since the silicon nitride film as the lower layer of the dielectric film 34 is deposited by CVD, it can be formed by an independent process condition of the base without being affected by the crystal condition of the lower electrode layer 51 as the base and by its step shape. In other words, the silicon nitride film has a higher dielectric withstand voltage than the silicon nitride film formed by nitriding the surface of the lower electrode layer 51 and has a smaller number of defects per unit area than the latter. Therefore, the leakage current is extremely small. Moreover, the silicon nitride film has the characterizing feature in that it has a higher dielectric constant than that of the silicon dioxide film. Since the silicon dioxide film of the upper layer can be formed by a film having extremely high quality, the characteristics of the silicon nitride film described above can be further improved. As will be described later in detail, the silicon dioxide film is formed by high pressure oxidation (1.5∼10 [tolls]), it can be formed with a shorter oxidation time or a heating-treatment time than normal pressure oxidation.

The conductor film 52 is disposed in such a manner as to extend along the upper surface and sidewall of the lower electrode layer 51 and saves the area in the vertical direction by utilizing the sidewall portion of the lower electrode layer 51. The increase in the area of the dielectric film 52 can improve the charge storage quantity of the data storage capacitance element C having the stacked structure. The planar shape of this dielectric film 52 is defined by the planar shape of the upper electrode layer 53 and has substantially the same shape as the upper electrode layer 53.

The upper electrode layer 53 is disposed on the lower electrode layer 51 in such a manner as to cover the latter through the dielectric film 52. The upper electrode layer 53 is formed integrally with the upper electrode layer 53 of the data storage capacitance element C of the stacked structure of the adjacent memory cell M. The power source voltage $\frac{1}{2} V_{cc}$ is applied to the upper electrode layer 53. The upper electrode layer 53 comprises a polycrystalline silicon film deposited by CVD, for example, and an n-type impurity is introduced into this polycrystalline silicon film to reduce the resistance value. The upper electrode layer 53 is formed by the gate wiring formation step of the third layer in the fabrication process. The upper electrode layer 53 has substantially the same film thickness as the lower electrode layer 51, for example.

As shown in FIGS. 10, 11 and 12, the memory cell M is connected to one other memory cell M which is adjacent to it in the columnar direction. In other words, in the two memory cells M adjacent to each other in the columnar direction, one of the n-type semiconductor regions 45 of each memory cell selection MISFET Qs is formed integrally with the other and each transistor has an inversion pattern with that portion being the center. The two memory cells M are disposed in the row direction and are deviated by a ½ pitch from other two memory cells M that are adjacent to them in the row direction.

The complementary data line 57 is disposed on the upper electrode layer 53 of the data storage capacitance element C of the stacked structure through the inter-level insulation film 54. The complementary data line 57 is formed by the same layer as the wiring 57 described above. A word line (WL) for shunt 60 is disposed on the complementary data line 57 through the inter-level insulation film 58. The shunt word line 60 is connected to the word line (WL) 44 in a predetermined region which corresponds to some dozens to some hundreds of memory cells M, though not shown in the drawings. The word line 44 is divided into a plurality of parts in its extending direction in the memory cell array MA, and the shunt word line 60 is connected to each of these divided word lines 44. The shunt word line 60 is constituted so as to reduce the resistance value of the word line 44 and to improve the selection speed of the memory cell M in each of the data write and read operations. The shunt word line 60 is formed by the same conductor layer as the wiring 60 described above.

Figure 13:
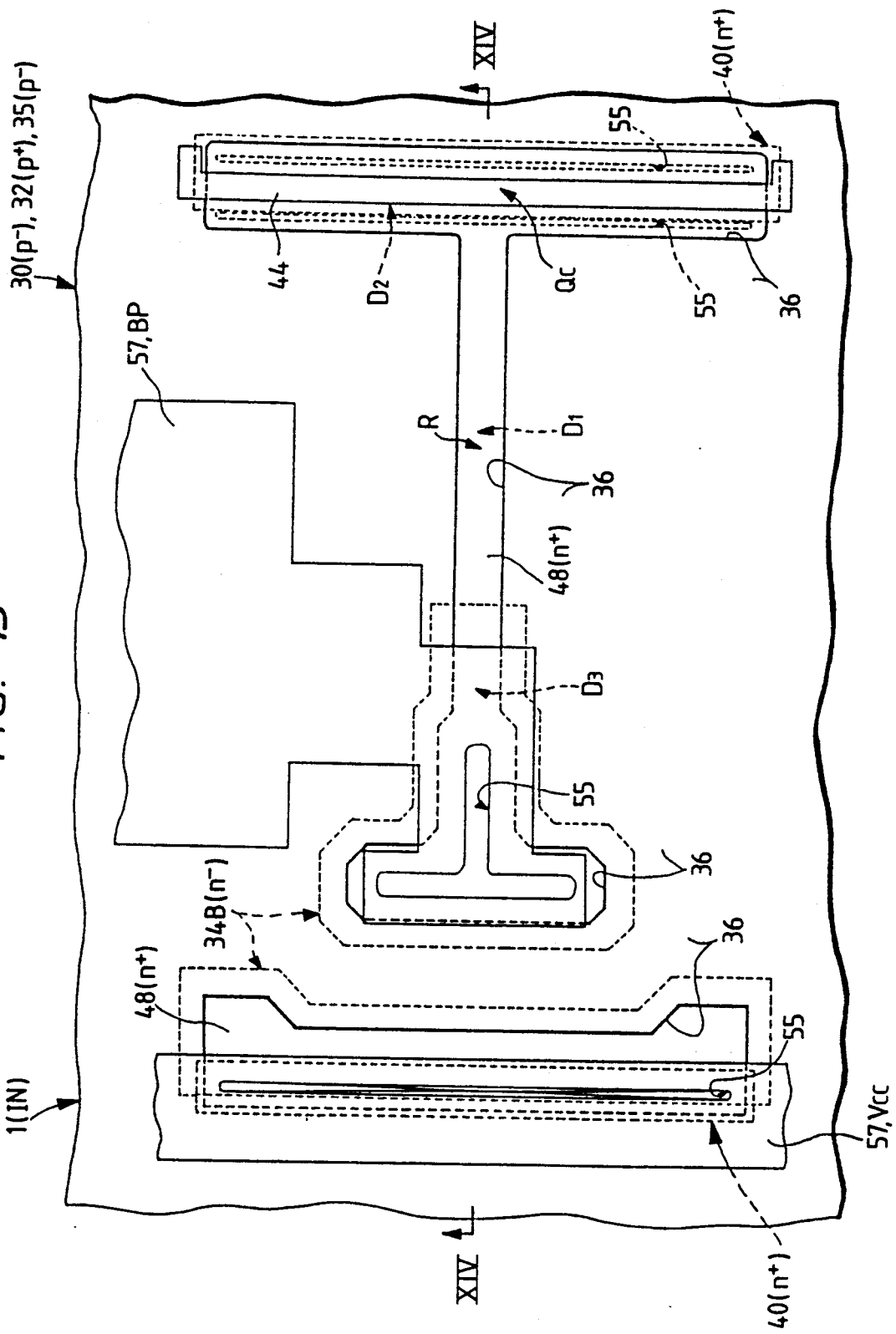
FIG. 13 is a plan view of the principal portions of the input portion of the hybrid semiconductor integrated circuit device.
Figure 14:
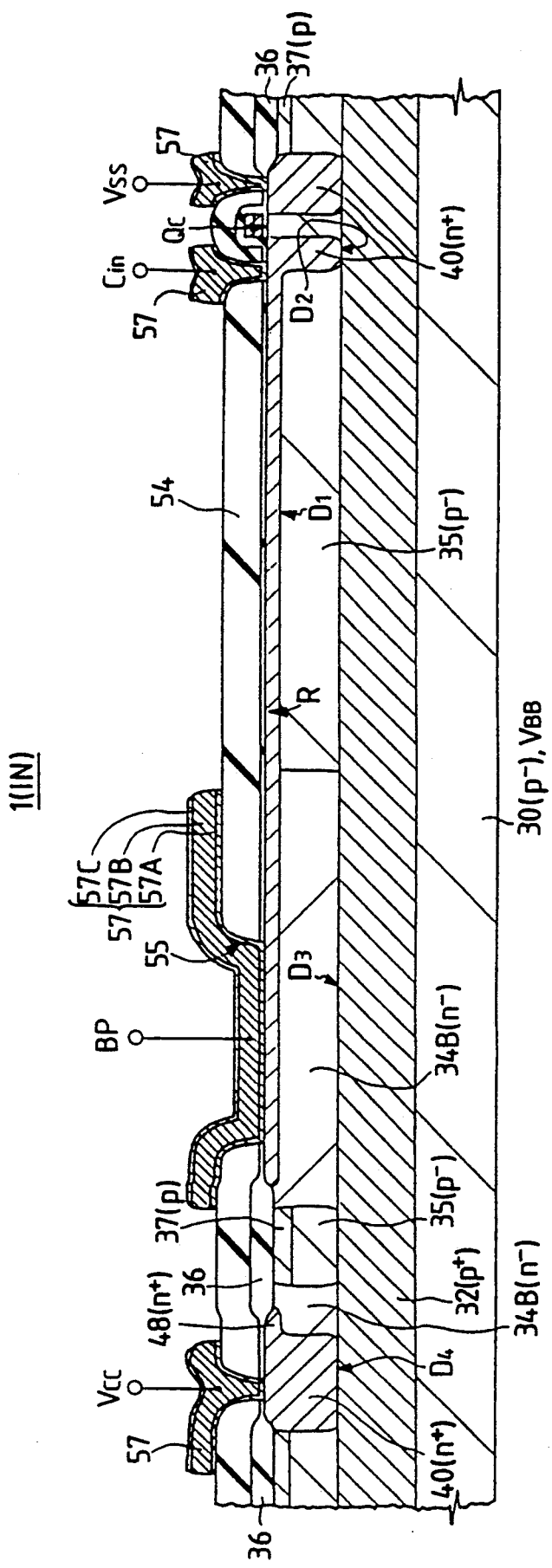
FIG. 14 is a sectional view taken along line XIV—XIV of FIG. 13.
Figure 15:
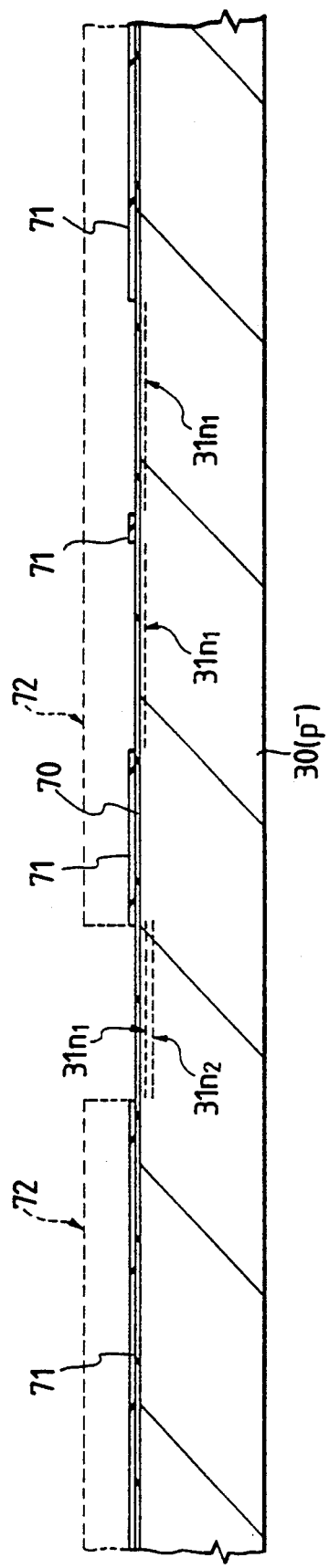

The dielectric breakdown prevention circuit I shown in FIG. 8 is disposed at the input portion IN of the hybrid semiconductor integrated circuit device 1 as shown in FIG. 1. The clamp MISFET Qc of this dielectric breakdown prevention circuit I is disposed on the main plane of the p⁻-type well region 35 inside the region whose periphery is defined by the device isolation insulation film 36 and the p-type channel stopper region 37 as shown in FIGS. 1, 13 definite (plan view of the principal portions of the input portion) and 14 (sectional view taken along line XIV—XIV of FIG. 13). The buried p⁺-type semiconductor region 32 is disposed below this p⁻-type well region 35. The clamp MISFET Qc comprises mainly the p⁻-well region 35 (channel formation region), the gate insulation film 43, the gate electrode 44 and the n⁺-type semiconductor region 40 as the source and drain regions.

The clamp MISFET Qc has basically and substantially the same structure as the n-channel MISFET Qn described above. In other words, the p⁻-type well region 35, gate insulation film 43 and gate electrode 44 of the clamp MISFET Qc are the same as the layers (the same fabrication steps) of the n-channel MISFET Qn. The n⁺-type semiconductor region 40 as the drain and source regions of the clamp MISFET Qc are formed by the same layer (the same fabrication step) as the collector potential pull-up n⁺-type semiconductor region 40 as the n-type collector region of the bipolar transistors T1, T2 described already. The bottom portion of the n⁺-type semiconductor region 40 of this clamp MISFET Qc is in contact with the buried p⁺-type semiconductor region 32 in the same way as the bottom portion of the n⁺-type semiconductor region 40 of the bipolar transistor T. The buried p⁺-type semiconductor region 32 disposed at this input portion IN is formed by the same layer (the same fabrication step) as the buried p⁺-type semiconductor region 32 of the device isolation region encompassing the bipolar transistor T. The collector potential pumping n⁺-type semiconductor region 40 of the bipolar transistor T has a large junction depth while in contact with the buried n⁺-type semiconductor region (buried collector region 31B in order to pump up the collector current therefrom. Since the buried p⁺-type semiconductor region 32 having substantially the same depth as that of the buried n⁺-type semiconductor region 31B is formed, the bottom portion of the n⁺-type semiconductor region 40 can be easily brought into contact with the buried p⁺-type semiconductor region 32.

The n⁺-type semiconductor region 40 as the drain region of the clamp MISFET Qc is connected to the wiring 60 which is used as the external terminal BP for the input signal, through the n⁺-type semiconductor region 48 and through the wiring 57. On the other hand, the n⁺-type semiconductor region 40 as the source region of the clamp MISFET Qc and its gate electrode 44 are connected to the reference potential $V_{ss}$ through the wiring 57 (which is not shown on the gate electrode side 44).

The insulation film 41 having a greater thickness than the gate insulation film 43 is disposed at the end portion of the gate insulation film 43 of the clamp MISFET Qc in the direction of the gate length as shown in FIG. 1.

The insulation film 41 comprises the silicon dioxide film formed by oxidizing the main plane of the n+-type semiconductor region 40 as the source and drain regions. This insulation film 41 can reduce the mirror capacitance that occurs between the gate electrode 44 and the n+-type semiconductor region 40 as the drain region. In the clamp MISFET Qc, the insulation film 41 is formed in self-alignment with the n+-type semiconductor region 40 as the source and drain regions, and even when this insulation film 41 and the gate electrode 44 superpose with one another, the gate electrode 44 functions inside the region where the gate length dimension is determined by the insulation film 41. Therefore, the n+-type semiconductor region 40 is formed in self-alignment with this gate electrode 44.

The protective resistor element R of the dielectric breakdown prevention circuit I comprises mainly the n+-type semiconductor region 48 described above. One of the ends of the n+-type semiconductor region 48 as this protective resistor element R is connected to the wiring 57 connected to the external terminal BP for the input signal, through the connection hole 55. The other end of this n+-type semiconductor region 48 is connected to (integrated with) the n+-type semiconductor region 40 as the drain region of the clamp MISFET Qc. The n+-type semiconductor region 48 as the protective resistor element R is formed by the same layer (the same fabrication step) as the n+-type semiconductor region 48 as the source and drain regions of the n-channel MISFET Qn. The n+-type semiconductor region 48 as the protective resistor element R has a smaller junction depth than that of the n+-type semiconductor region 40 of the clamp MISFET Qc. One of the ends of this n+-type semiconductor region 48 as the protective resistor element R, that is, the junction portion with the wiring 57, is disposed on the main plane portion of the n−-type well region 34B. In other words, one of the ends of this n+-type semiconductor region 48 is in contact with the buried p+-type semiconductor region 32 through the n−-type well region 34B having the same conductivity type as, and disposed below, it. The other end of the n+-type semiconductor region 48 as the protective resistor element R, that is, its junction portion with the n+-type semiconductor region 40 as the drain region of the clamp MISFET Qc, is disposed on the main plane portion of the p−-type well region 35.

The diode device $D_1$ of the dielectric breakdown prevention circuit I is formed parastically at the p-n junction portion between the n+-type semiconductor region 48 as the protective resistor element R and the p−-type well region 35. Since this diode device $D_1$ comprises the p-n junction between the n+-type semiconductor region 48 having a high impurity concentration and the p−-type well region 35 having a low impurity concentration, it is formed with a high junction withstand voltage (breakdown voltage). The diode device $D_1$ of this embodiment has a junction withstand voltage of about 20 [V].

The diode device $D_2$ is formed parastically at the p-n junction between the n+-type semiconductor region 40 as the drain region of the clmap MISFET Qc and the buried p+-type semiconductor region 32. Since this diode device $D_2$ is formed by the p-n junction between the n+-type semiconductor region 40 having a high impurity concentration and the buried p+-type semiconductor region 32 having a high impurity concentration, it is formed with a low junction withstand voltage.

The diode device $D_2$ has a junction withstand voltage of about 15 [V].

The diode device $D_3$ is formed parastically at the p-n junction portion between the n−-type well region 34B connected to the n+-type semiconductor region 48 as the protective resistance element R and the buried p+-type semiconductor region 32. Since this diode device $D_3$ is formed by the p-n junction between the n−-type well region 34B having a low impurity concentration and the buried p+-type semiconductor region 32 having a high impurity concentration, it has a higher withstand voltage than the diode device $D_1$. The diode device $D_3$ has a junction withstand voltage of about 25 [V].

In the dielectric breakdown prevention circuit I, the diode devices $D_3$, $D_2$ and $D_1$ are disposed sequentially from the external terminal for the input signal to the input stage circuit Cin so as to reduce step-wise the junction withstand voltage. In this embodiment the gate insulation film 44 of the clamp MISFET Qc comprises a 18∼22 [nm] thick silicon dioxide film. Since the dielectric withstand voltage of the gate insulation film 44 is about 19 [V], the junction withstand voltage of the diode device $D_2$ is set to be lower than this dielectric withstand voltage.

A diode device $D_4$ of the dielectric breakdown prevention circuit I is disposed near the connection portion between the wiring 57 connected to the external terminal BP for the input signal and the $n^{30}$-type semiconductor region 48 as the protective resistor element R. This diode device $D_4$ is formed mainly and parastically at the p-n junction portion between the n+-type semiconductor region 40 and the buried p+-type semiconductor region 32 which is in contact with the bottom portion of the former.

The n+-type semiconductor region 40 as the cathode region of this diode device $D_4$ is connected to the power source voltage $V_{cc}$ through the wiring 57.

In the hybrid semiconductor integrated circuit 1 having the dielectric breakdown prevention circuit I between the external terminal BP for the input signal and the input stage circuit Cin connected directly to the former, the dielectric breakdown prevention circuit I comprises the diode device $D_3$ comprising the buried p+-type semiconductor region 32 of a high impurity concentration formed by the same layer as the device isolation region of the bipolar transistor T buried in the substrate, and the n−-type well region 34B formed by the same layer as the n−-type well region 34B of the p-channel MISFET Qp on the main plane portion of the substrate with its bottom portion being in contact with the buried p+-type semiconductor region 32; the diode device $D_2$ comprising the p−-type well region 35 of a low impurity concentration formed by the same layer as the p−-type well region 35 of the n-channel MISFET Qn, on the main plane portion of the substrate, and the n+-type semiconductor region 48 of a high impurity concentration formed by the same layer as the n+-type semiconductor region 48 as the source and drain regions of the n-channel MISFET Qn, on the main plane portion of the substrate; and the diode device $D_2$ comprising the buried p+-type semiconductor region 32 buried in the substrate and the n+-type semiconductor region 40 of a high impurity concentration formed by the same layer as the collector potential pumping n+-type semiconductor region 40 of the bipolar transistor disposed on the main plane portion of the substrate with its bottom surface in contact with the p+-type semiconductor region 32; wherein the diode devices $D_3$, $D_1$ and $D_2$ are disposed sequentially and in parallel from the external terminal BP for the input signal to the input stage circuit Cin. According to this structure, it is possible to reduce step-wise the excessive current inputted to the external terminal BP for the input signal by the diode devices $D_3$, $D_1$ and $D_2$ and moreover, to make the p-n junction withstand voltage of the diode device $D_2$ lower than the dielectric breakdown withstand voltage of the gate insulation film 43 of the input stage circuit Cin. Therefore, it is possible to prevent the dielectric breakdown of the input stage circuit Cin and to improve the dielectric breakdown withstand voltage of the hybrid semiconductor integrated circuit device 1. Since the formation steps of the bipolar transistor T, the n-channel MISFET Qn and the p-channel MISFET Qp can be used commonly as the formation steps of the diode devices $D_1 \sim D_3$ of the dielectric breakdown prevention circuit I, respectively, the number of fabrication steps of the hybrid semiconductor integrated circuit device 1 can be reduced by the number of the formation steps of this dielectric breakdown prevention circuit I.

The source and drain region of the clamp MISFET Qc of the dielectric breakdown prevention circuit I are formed by the n+-type semiconductor region 40 which is the same layer as the cathode side region of the diode device $D_2$. According to this structure, isolation dimension between the n+-type semiconductor regions 40 as the source and drain regions can be determined by the impurity introduction mask and for this reason, variance of the channel length of the clamp MISFET Qc can be reduced.

The insulation film 41 which is thicker than the gate insulation film 43 is disposed at the end of the gate electrode 44 of the clamp MISFET Qc in the direction of the gate length. According to this structure, the mirror capacitance that occurs between the gate electrode 44 of the clamp MISFET Qc and the n+-type semiconductor region 40 as the drain region can be reduced, so that the transmission speed of the input signal can be improved and hence, the operation speed of the hybrid semiconductor integrated circuit device 1 can be improved.

Though not shown in the drawing, the diode device $D_5$ of the dielectric breakdown prevention circuit II at the output portion shown in FIG. 9 has substantially the same structure as the diode device $D_2$ of the dielectric breakdown prevention circuit I of the input portion IN described above. In other words, the diode device $D_5$ is formed parastically at the p-n junction portion between the n+-type semiconductor region 40 and the buried p+-type semiconductor region 32. The n+-type semiconductor region 40 as the cathode region of this diode device $D_5$ is the source and drain regions of the n-channel MISFET of the push-pull circuit of the output stage circuit Cout on the connection side to the external terminal BP for the output signal.

Next, the definite fabrication method of the hybrid semiconductor integrated circuit device 1 described above will be explained briefly with reference to FIGS. 15 to 31 (each being a sectional view of the principal portions at each fabrication step).

SUBSTRATE FORMATION STEP

First of all, a p--type semiconductor substrate 30 comprising single crystal silicon is prepared. This p--type semiconductor substrate 30 has a resistance value of from about 8 to about 12 [Ω-cm].

Next, a silicon dioxide film 70 and a silicon nitride film 71 are sequentially laminated on the entire main plane of the p--type semiconductor substrate 30. The lower layer silicon dioxide film 70 is constructed so as to be capable of mitigating the stress between the p--type semiconductor substrate 30 as the lower layer and the silicon nitride film 71 as the upper layer and of mitigating the damage at the time of introduction of an impurity at post-steps. The silicon dioxide film 70 is formed by oxidizing the main plane of the p--type semiconductor substrate 30 by steam oxidation, for example, in a film thickness of from about 40 to about 50 [nm]. The silicon nitride film 71 as the upper layer is used primarily as the oxidation-resistant mask. The silicon nitride film 71 is deposited by CVD, for example, in a film thickness of from about 45 to about 55 [nm].

Next, the silicon nitride film 71 as the upper layer is removed partially to form a mask 71 by photography and etching in the formation regions of the bipolar transistors T1, T2 and the p-channel MISFET Qp.

Next, an n-type impurity $n_1$ is introduced into the main plane portion of the p--type semiconductor substrate 30 through the lower layer silicon dioxide film 71 by use of the mask 71 described above and an etching mask (photoresist film) prepared by working the mask 71. Sb in a concentration of about $10^{15}$ [atoms/cm$^2$] is used as the n-type impurity 31 $n_1$ and is implanted at energy of from about 90 to about 110 [KeV].

Next, the impurity introduction mask on the mask 71 is removed and a mask 72 having opened thereon the formation region of the p-channel MOSFET Qp is formed. This mask 72 is used primarily as the impurity introduction mask and comprises a photoresist film formed by photolithography, for example.

In the formation region of the p-channel MISFET Qp, the n-type impurity 31 $n_2$ is introduced into the main plane portion of the p--type semiconductor substrate 30 through the silicon dioxide film 70 by use of the mask 72 described above as shown in FIG. 15. The n-type impurity 31 $n_2$ and the n-type impurity 31 $n_1$ described above are introduced into the formation region of the p-channel MISFET Qp. This n-type impurity 31 $n_2$ uses P having a higher diffusion rate than the n-type impurity 31 $n_1$, in an impurity concentration of about $10^{14}$ [atoms/cm$^2$], for example, and is introduced by ion implantation at energy of about 120 to about 130 [KeV]. The mask 72 is removed after the introduction of this n-type impurity 31 $n_2$.

A high temperature heat-treatment is applied to make extension diffusion of the n-type impurities 31 $n_1$ and 31 $n_2$ that are introduced previously and to form the n+-type semiconductor regions 31a and 31b on the main plane portion of the p--type semiconductor substrate 30. The thermal diffusion treatment described above is effected at a high temperature of from about 1,100° to about 1,300° C. for about 30 minutes. The n+-type semiconductor region 31a is formed in the formation region of the p-channel MISFET Qp. Since the n-type impurity 31 $n_2$ having a high diffusion rate is introduced, this n+-type semiconductor region 31a is formed with a deeper junction depth than the n+-type semiconductor region 31b. The n+-type semiconductor region 31b is formed in the formation regions of the bipolar transistors T1 and T2. This n+-type semiconductor region 31b has a smaller junction depth than the n+-type semiconductor region 31a, on the contrary.

Next, the silicon oxide film 70 on the main plane of each n+-type semiconductor region 31a, 31b is grown by use of the mask 71 as the oxidation-resistant mask to form a silicon dioxide film 70A having a greater film thickness than the silicon dioxide film 70. This silicon dioxide film 70A is formed by steam oxidation at about 1,000° C. in a film thickness of about 300 to about 400 [nm]. The silicon dioxide film 70A is formed in order to constitute a step as an alignment target of each n⁻-type well region 34A, 34B on the main plane of the p⁻-type semiconductor substrate 30 at the subsequent step, for example. The silicon dioxide film 70A is also used as the impurity introduction mask for forming the p⁺-type semiconductor region 32A which is to be formed at the subsequent step.

The mask 71 is then removed. This mask 71 is removed by hot phosphoric acid because it is a silicon nitride film.

Next, a p-type impurity is introduced into the main plane portion of the p⁻-type semiconductor substrate 30 through the silicon dioxide film 70 in each of the formation regions of the n-channel MISFET Qn, the memory cell array MA and the input portion IN by use of the silicon dioxide film 70A as the impurity introduction mask. Boron (B) in an impurity concentration of about $10^{13}$ [atoms/cm$^2$], for example, is used as the p-type impurity and is introduced by ion implantation at energy of from about 20 to about 40 [KeV].

Figure 16:
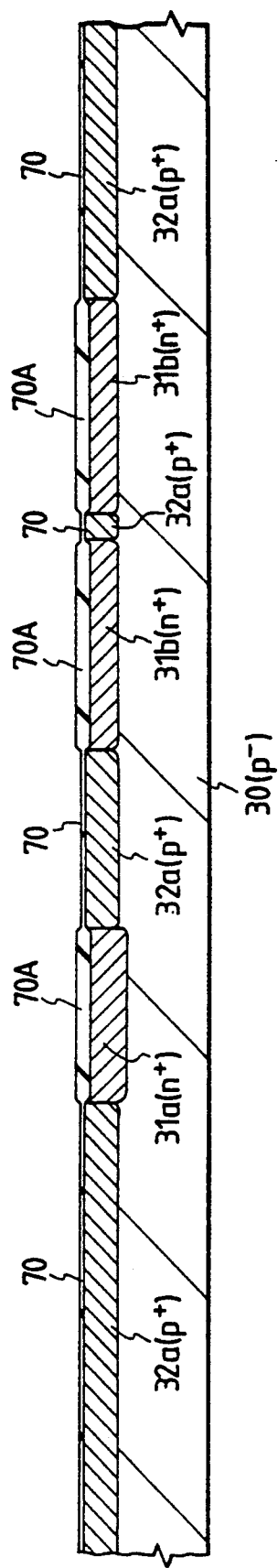

A high temperature thermal diffusion treatment is then conducted so as to apply extension diffusion to the p-type impurity described above and thus to form the p⁺-type semiconductor region 32a as shown in FIG. 16. This p⁺-type semiconductor region 32a is formed in self-alignment with the n⁺-type semiconductor regions 31a and 31b. The thermal diffusion treatment is conducted at a high temperature of about 1,000° C. for about 10 to about 20 minutes.

Next, the silicon dioxide films 70, 70A on the main plane of the p⁻-type semiconductor substrate 30 are removed therefrom and the n⁻-type epitaxial layer 33 is grown on the main plane of the p⁻-type semiconductor substrate 30 from which the silicon dioxide films 70, 70A are removed. The n⁻-type epitaxial layer 33 is formed by the single crystal silicon and has a resistance value of from about 2 to about 4 [Ω-cm]. This n⁻-type epitaxial layer 33 is from about 1.4 to about 1.6 [μm] thick, for example. Due to the growth of the n⁻-type epitaxial layer 33, the n-type impurity is diffused from each n⁺-type semiconductor region 31a, 31b formed on the main plane of the p⁻-type semiconductor substrate 30 into the n⁻-type epitaxial layer 33, and the buried n⁺-type semiconductor regions 31A, 31B are formed. Similarly, the p-type impurity is diffused from the p⁺-type semiconductor region 32a formed on the main plane portion of the p⁻-type semiconductor substrate 30 into the n⁻-type epitaxial layer 33 and the buried p⁺-semiconductor region 32 is formed. Each buried n⁺-type semiconductor region 31A, 31B is formed in self-alignment with the buried p⁺-type semiconductor region 32.

Since the n-type impurity 31 n₂ having a low diffusion rate is introduced, the swell-up quantity of the buried n⁺-type semiconductor region 31A is greater towards the n⁻-type epitaxial layer 33 than to the buried n⁺-type semiconductor region 31B.

WELL FORMATION STEP

After the silicon dioxide film formed on the surface of the n⁻-type epitaxial layer 33 is removed, the silicon dioxide film 73 and the silicon nitride film 74 are laminated sequentially on the main plane of the n⁻-type epitaxial layer 33 thus exposed. The silicon dioxide film 73 is formed by high temperature steam oxidation of from about 900° to about 1,000° C. in a film thickness of from about 40 to about 50 [nm]. This silicon dioxide film 73 is used as the buffer layer. The silicon nitride film 74 is used as the impurity introduction mask and as the oxidation-resistant mask. The silicon nitride film 74 is deposited by CVD, for example, in a film thickness of from about 40 to about 60 [nm].

Next, the silicon nitride film 74 of the upper layer is removed in the formation region of each of the bipolar transistors T1, T2, the p-channel MISFET Qp and the input portion IN to form the mask 74. This mask 74 is produced by photolithography and etching.

An n-type impurity 34 n₁ is introduced into the main plane portion of the n⁻-type epitaxial layer 33 through the silicon dioxide film 73 by use of the mask 74 and the etching mask (photoresist film) prepared by working the mask 74. The n-type impurity 34 n₁ uses P in an impurity concentration of $10^{12}$ [atoms/cm$^2$], for example, and is introduced by ion implantation at energy of from about 120 to about 130 [KeV].

Next, the impurity introduction mask on the mask 74 is removed to form a mask 75 in which the formation region of the bipolar transistor T1 is opened on the mask 74. This bipolar transistor T1 is used for an input/output stage ECL gate circuit or the like, for example, and is constituted as a transistor for which high speed performance is required. The mask 75 described above is used mainly as the impurity introduction mask and is formed by the photoresist film which is formed by photolithography, for example.

Figure 17:
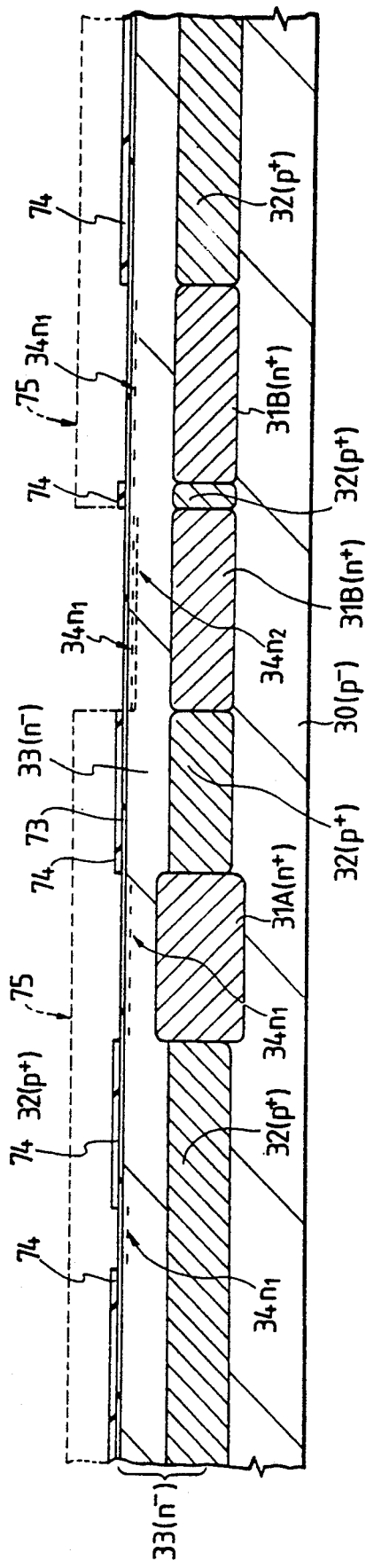

As shown in FIG. 17, an n-type impurity 34 n₂ is then introduced into the main plane portion of the n⁻-type epitaxial layer 33 through the silicon dioxide film 73 in the formation region of the bipolar transistor T1 by use of the mask 75 described above. The n-type impurity 34 n₂ uses P in an impurity concentration of $10^{13}$ [atoms/cm$^2$], for example, and is introduced by ion implantation at energy of from about 120 to about 130 [KeV]. After this n-type impurity 34 n₂ is introduced, the mask 75 is removed. In this formation region of the bipolar transistor T1, the main plane portion of the n⁻-type epitaxial layer 33 has a higher n-type impurity concentration than the other regions because the n-type impurities 34 n₁ and 34 n₂ are introduced. Since each n-type impurity 34 n₁, 34 n₂ forms the intrinsic collector region (n-type well region 34B) of the bipolar transistor T1 by the subsequent step, it can reduce the resistance value of the intrinsic collector region and can improve the frequency characteristics of the bipolar transistor T1 as described already.

Next, the silicon dioxide film 73 exposed from the mask 74 is grown by use of the mask 74 as the oxidation-resistant mask and the silicon dioxide film 73A thicker than the former is formed. The silicon dioxide film 73A is used as the mask for removing the mask 74 and as the impurity introduction mask. The silicon dioxide film 73A forms the step which is used as the alignment target of the device isolation insulating film 36 of the subsequent step, for example. The silicon dioxide film 73A is formed by steam oxidation of a high temperature of from about 900° to about 1,000° C. and in a film thickness of from about 110 to about 130 [nm], for example.

Next, the mask 74 is removed selectively. The mask 74 is removed by hot phosphoric acid, for example.

A p-type impurity is introduced into the main plane portion of the n⁻-type epitaxial layer 33 through the silicon dioxide film 73 by use of the silicon dioxide film 73A as the impurity introduction mask. The p-type impurity uses $BF_2$ (or B) of an impurity concentration of $10^{12}$ [atoms/cm²], for example, and is introduced by ion implantation at energy of about 50 to about 70 [KeV]. Since this p-type impurity increases the film thickness of the silicon dioxide film 73A, it is not introduced into the region into which the n-type impurities 34 n₁, 34 n₂ are introduced, but is introduced in self-alignment with these n-type impurities 34 n₁ and 34 n₂.

Figure 18:
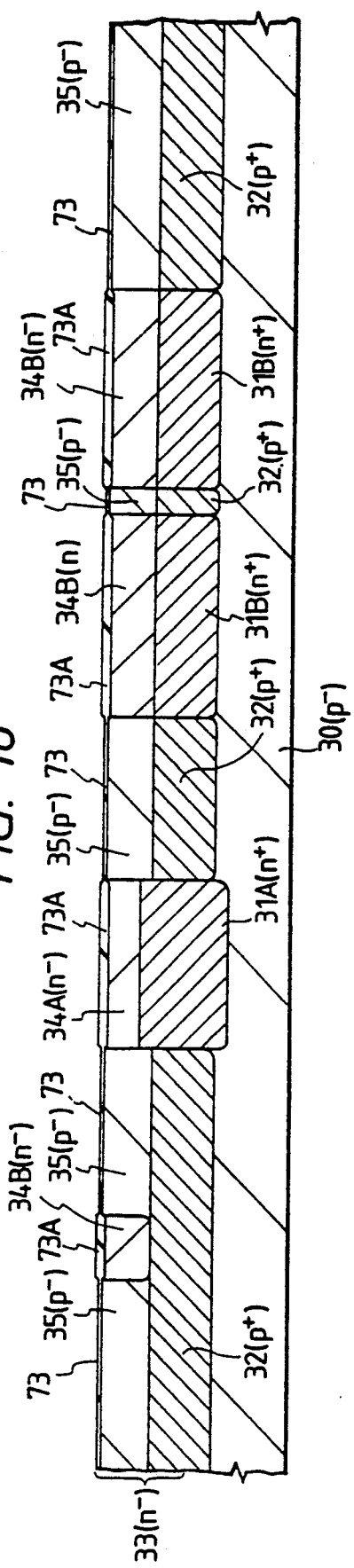

Next, the thermal diffusion treatment of a high temperature is conducted to apply extension diffusion to each of the n-type impurities 34 n₁, 34 n₂ and to the p-type impurity, thereby forming the n⁻-type well region 34A, the n-type well region 34B, the n⁻-type well region 34B and the p⁻-type well region 32 as shown in FIG. 18. The thermal diffusion treatment described above is conducted in a high temperature atmosphere of from about 1,100° to about 1,300° C., for example, for about 20 to about 40 minutes. Each of the n⁻-type well regions 34A, 34B and the n-type well region 34B is formed in self-alignment with the p⁻-type well region 32.

Since the n-type well region 34B used as the intrinsic collector region of the bipolar transistor T1 has a high impurity concentration as described already, high cut-off frequency characteristics of 6 [GHz], for example, can be obtained. Since the n⁻-type well region 34B used as the intrinsic collector region of the bipolar transistor T2 has a low impurity concentration, the base-collector withstand voltage can be improved to about 10 [V]. In other words, the hybrid semiconductor integrated circuit device 1 is equipped with two kinds of bipolar transistors T1 and T2.

ISOLATION REGION FORMATION STEP

Next, the silicon nitride film 76 is formed on the entire surface of the substrate including the silicon dioxide films 73 and 73A. This silicon nitride film 76 is used as the impurity introduction mask and as the oxidation-resistant mask. The silicon nitride film 76 is deposited by CVD, for example, and is from about 100 to about 150 [nm] thick. The silicon nitride film 76 is used as the oxidation-resistant mask for forming the device isolation insulation film 36 and the thick silicon nitride film 76 can reduce the oxidation quantity in the horizontal direction or so-called "bird's beak" when the device isolation insulation film 36 is formed.

Next, the mask 77 having opened thereon the device isolation region is formed on the silicon nitride film 76. The mask 77 is formed by photolithography. In other words, the mask 77 is formed by coating a photoresist film, then applying sequentially exposure and development treatments to open a predetermined portion and curing the photoresist film by baking or ultraviolet ray irradiation. Since the mask 77 is cured by baking or ultraviolet ray irradiation, it is not removed even when the mask is further formed thereafter by a photoresist. The baking treatment is carried out at a temperature of from about 100° to about 120° C.

Next, silicon nitride film 76 exposed from the mask 77 is etched to form a mask 76 by use of the mask 77 as an etching mask.

A mask 78 on which the region of the p⁻-type well region 35 is open is formed on the mask 77. The mask 78 comprises a photoresist film utilizing photolithography.

The mask 78 is mainly used as the impurity introduction mask. When this mask 78 is formed, the mask 77 below it is not removed because the mask 77 is cured as described already.

Figure 19:
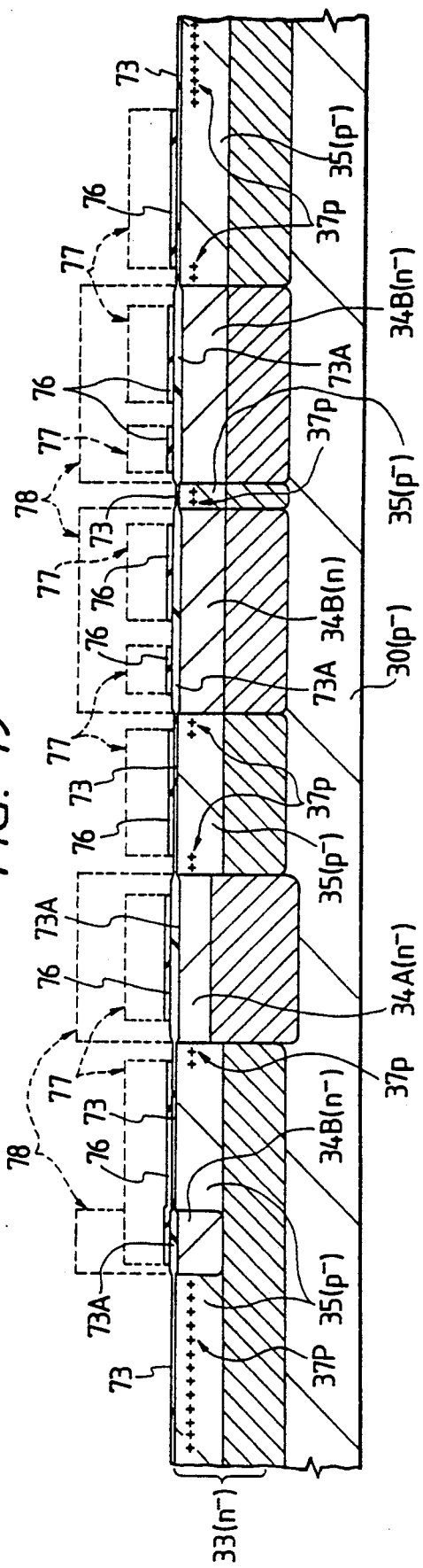

As shown in FIG. 19, a p-type impurity 37p is introduced into the main plane portion of the inactive region of the p⁻-type well region 35 by use of the masks 77, 78 and the thick silicon dioxide film 73A as the impurity introduction masks. Since the mask 77 and the silicon dioxide film 73A exist on the main plane portion of the active region of the p⁻-type well region 35, the p-type impurity 37p is not introduced into it. Since the masks 77, 78 and the silicon dioxide film 73A exist on the main plane portions of the active and inactive regions of the n⁻-type well regions 34A, 34B and the n-type well region 34B, the p-type impurity 37p is not introduced into it. This p-type impurity 37p uses B in an impurity concentration of about $10^{13}$ [atoms/cm²], for example, and is introduced by ion implantation at high energy of about 100 to about 150 (in this embodiment, 120~130) [KeV]. In other words, this p-type impurity 37p is introduced in such a manner as to have a peak of its impurity concentration at the bottom portion of the device isolation insulation film 36 to be formed thereafter (the peak of the impurity concentration exists at a position of a depth corresponding to ½ of the film thickness of the device isolation region from the surface of the p⁻-type well region 35).

Figure 20:
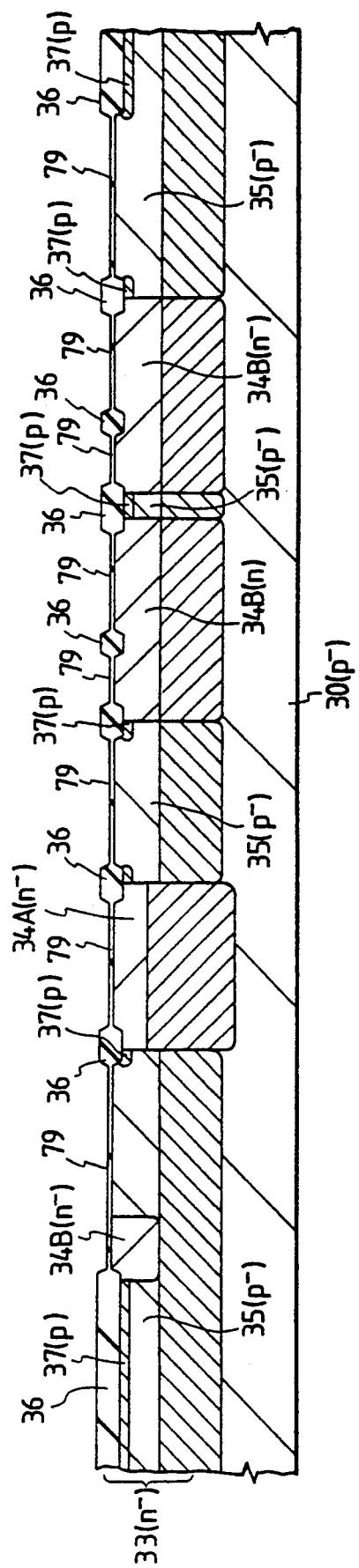

Next, the masks 78 and 77 are sequentially removed by ashing or the like to expose the mask 76. This mask 76 is used as the oxidation-resistant mask. The device isolation film 36 can be formed by growing the silicon dioxide films 73, 73A exposed from the mask 76. The device isolation insulation film 36 is formed by steam oxidation at a high temperature of about 1,000° C. in a film thickness of about 600 to about 800 [nm]. Extension diffusion is applied to the p-type impurity which is introduced previously, by the high temperature steam oxidation for forming this device isolation insulation film 36, and the p-channel stopper region 37 is thus formed. Since the p-type impurity forming the p-type channel stopper region 37 is introduced mainly by use of the mask 76 forming the device isolation region 37, the p-type channel stopper region 37 is formed in self-alignment with the device isolation insulation film 36. Thereafter, the mask 76 is removed by use of hot phosphoric acid (see FIG. 20), for example. The silicon dioxide film 79 is then formed on the main plane of the active region of each of the n⁻-type well regions 34A, 34B, the n-type well region 34B and the p⁻-type well region 35 as shown in FIG. 20. This silicon dioxide film 79 is formed in order to remove a nitride which is a so-called "white ribbon" and is formed at the end portion of the device isolation insulation film 36 when this film 36 is formed. The silicon dioxide film 79 is formed by steam oxidation at about 900° to 1,000° C. in a film thickness of from about 50 to about 70 [nm].

Figure 32:
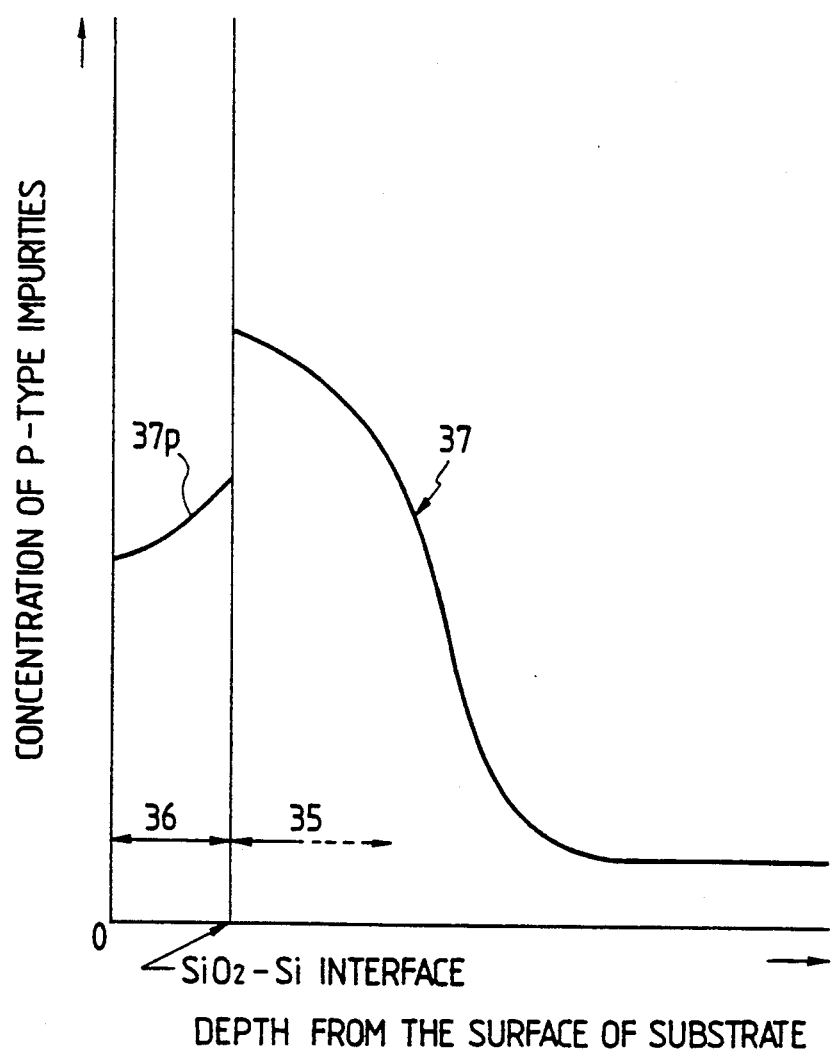
FIG. 32 is an impurity concentration distribution diagram of the device isolation region of the hybrid semiconductor integrated circuit device.

Since the p-type impurity 37p is introduced from the surface of the p⁻-well region 35 into a deep position by ion implantation at high energy as shown in FIG. 32 (a diagram showing the impurity concentration from the substrate surface), the p-type channel stopper region 37 described above has the maximum impurity concentration on the surface of the p⁻-type well region 35 at the interface portion between the device isolation insulation film 36 and the p⁻-type well region 35. The quantity of the p-type impurity 37p of the p-type channel stopper region 37 which is entrapped in the device isolation insulation film 36 at the time of its oxidation is small. In other words, as shown in FIG. 32, the impurity concentration on the surface of the p-type channel stopper region 37 is higher than the impurity concentration taken into the device isolation insulation film 36. Accordingly, since the impurity concentration on the surface below the device isolation insulation film 36 can be increased, the p-type channel stopper region 37 can increase the threshold voltage of the parasitic MOS and improve the device isolation capacity. Furthermore, the p-type channel stopper region 37 can increase the impurity concentration of the surface and eliminates the necessity for introducing the p-type impurity 37p in a quantity to compensate for the quantity taken into the device isolation insulation film 36. In this manner, the diffusion quantity in the horizontal direction (the leaking quantity of the p-type impurity 37p towards the active region side) can be reduced.

In the hybrid semiconductor integrated circuit device 1 wherein the n-channel MISFET Qn is constituted on the main plane of the active region whose periphery is defined by the p-type channel stopper region 37 formed on the main plane of the inactive region of the $p^-$-type well region 35 and the device isolation insulation film 36, the impurity concentration of the p-channel stopper region 37 at the boundary portion between the p-type channel stopper region and the device isolation insulation film 36 is made to be higher than the concentration of the p-type impurity taken into the device isolation insulation film 36 of the p-type impurity 37b forming the p-type channel stopper region 37 (see FIG. 32). This structure can be formed by introducing the p-type impurity 37p forming the p-type channel stopper region 37 by ion implantation at high energy. According to this structure, it is possible to reduce the quantity of the p-type impurity 37p taken into the device isolation insulation film 36 and to increase the impurity concentration of the p-type channel stopper region 37 below the device isolation insulation film 36. Accordingly, the device isolation capacity can be improved by increasing the threshold voltage of the parasitic MOS and the integration density of the hybrid semiconductor integrated circuit device 1 can thus be improved. Since it is possible to reduce the quantity of the p-type impurity 37p taken into the device isolation insulation film 36 and it is not necessary to excessively increase the impurity concentration of the p-type channel stopper region 37, the narrow channel effect of the n-channel MISFET Qn can be reduced by reducing the detour quantity of the p-type impurity 37p forming the p-type channel stopper region 37 towards the active region side, and the integration density of the hybrid semiconductor integrated circuit device 1 can be more improved.

FORMATION STEP OF SEMICONDUCTOR REGION FOR COLLECTOR POTENTIAL PUMPING

Figure 21:
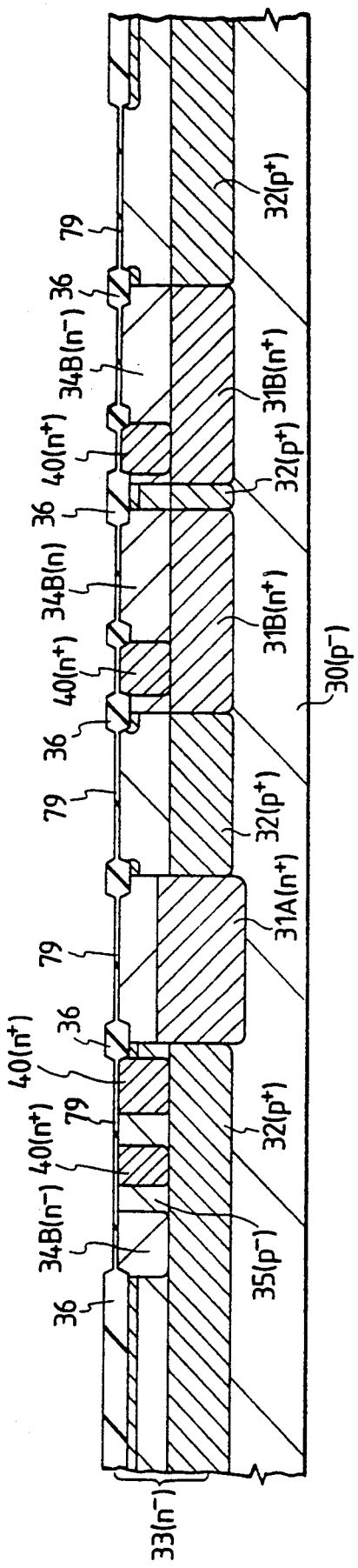

Next, the collector potential pumping $n^+$-type semiconductor region 40 is formed on the main plane portion of the n-type well region 34B in the formation region of the bipolar transistor T1 and on the main plane portion of the $n^-$-type well region 34B in the formation region of the bipolar transistor T2 as shown in FIG. 21, and the $n^+$-type semiconductor region 40 is formed on the main plane portion of the $n^-$-type well region 34B in the formation region of the clamp MISFET Qc of the dielectric breakdown prevention circuit I at the input portion IN. In other words, the collector potential pumping $n^+$-type semiconductor region 40 and the $n^+$-type semiconductor region 40 are formed by the same fabrication step. The collector potential pumping $n^+$-type semiconductor region 40 and the $n^+$-type semiconductor region 40 use P in an impurity concentration of from about $10^{15}$ to about $10^{16}$ [atoms/cm$^2$], for example, which impurity is introduced by ion implantation at energy of from about 90 to about 110 [KeV]. Each of the collector potential pumping $n^+$-type semiconductor region 40 and the $n^+$-type semiconductor region 40 uses P having a high diffusion rate as the n-type impurity in such a manner that it can come into contact with the buried $n^+$-type semiconductor region 31B and the buried $p^+$-type semiconductor region 32, respectively. This n-type impurity is used for the purpose of activation. Also, in order to reduce the damage due to the introduction of the impurity and to obtain a great junction depth, heat treatment at a high temperature of about 1,000° C. is made for about 20 to about 30 minutes after the introduction of the impurity. The n-type impurity described above is introduced by use of the impurity introduction mask (photoresist film) formed by photolithography.

THRESHOLD VOLTAGE ADJUSTMENT STEP

An impurity for the first threshold voltage adjustment is introduced into the entire surface of the substrate including the main plane portion of the $p^-$-type well region 35 in the formation region of the n-channel MISFET Qn and the main plane portion of the $n^-$-type well region 34A in the formation region of the p-channel MISFET Qp. This impurity for the threshold voltage adjustment uses B in an impurity inactive region of the $p^{--}$-type well region 35 and concentration of about $10^{12}$ [atoms/cm$^2$], for example, and is introduced by ion implantation at energy of from about 20 to about 40 [KeV]. This impurity for the threshold voltage adjustment is the one that adjusts the threshold voltage of the n-channel MISFET Qn having a reference threshold voltage and that of the p-channel MISFET Qp having a high threshold voltage of a predetermined absolute value. In this embodiment, the n-channel MISFET Qn is adjusted to a low threshold voltage of a standard absolute value of about 0.6 [V], and the p-channel MISFET Qp, to a high threshold voltage of an absolute value of about −0.8 [V]. In the Bi-CMOS gate circuit III wherein the bipolar transistors and CMOSs exist in mixture shown in FIG. 33 (equivalent circuit diagram) and the CMOS gate circuit IV of the next stage, for example, all the p-channel MISFET Qp are adjusted to the high threshold voltage described above.

Figure 33:
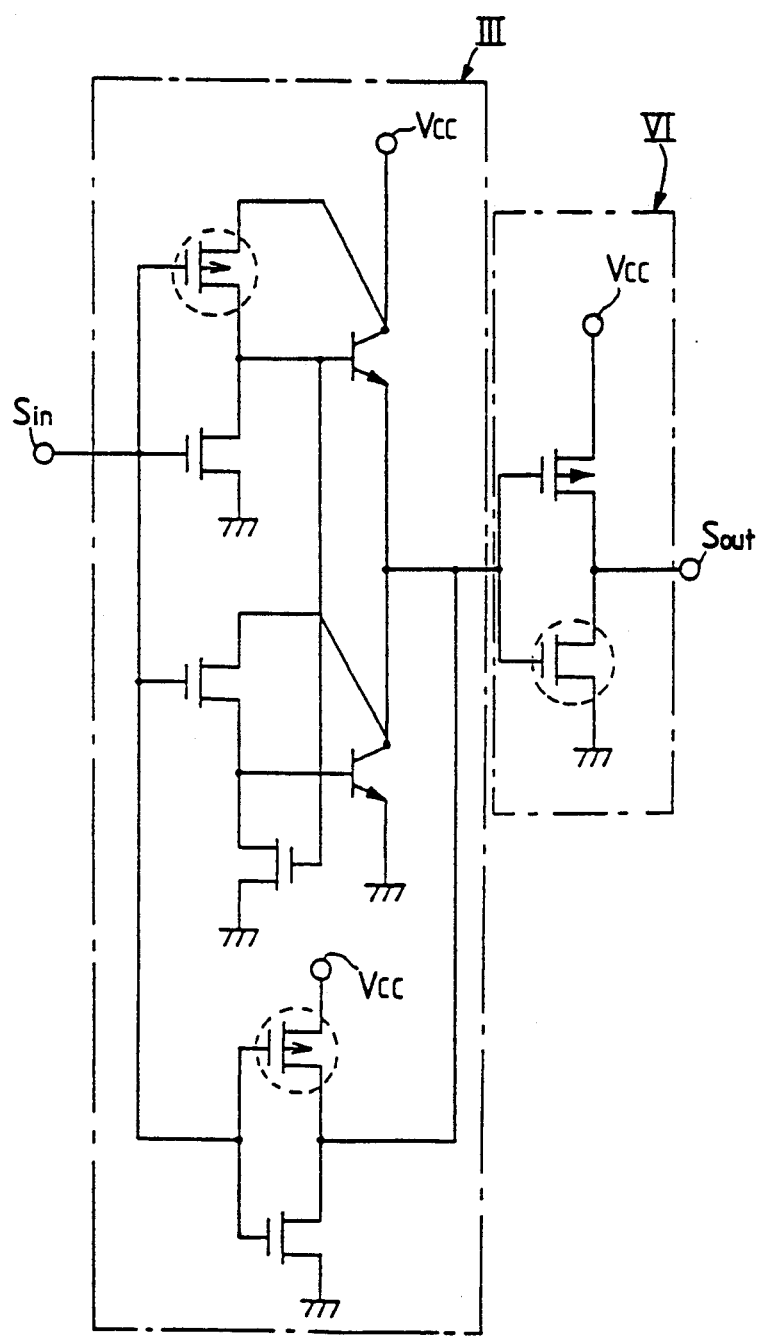
FIG. 33 is an equivalent circuit diagram of the principal portions of the hybrid semiconductor integrated circuit device.

Next, the impurity for the second threshold voltage adjustment is introduced into the main plane portions of the $p^-$-type well region 35 in the formation region of a specific MISFET Qn and into the main plane of the $n^-$-type well region 34A in the formation region of the p-channel MISFET Qp other than a specific p-channel MISFET Qp. This impurity for the threshold voltage adjustment uses B in an impurity concentration of from about $10^{11}$ to about $10^{12}$ [atoms/cm$^2$] and is introduced by ion implantation at energy of from about 20 to about 40 [KeV]. In FIG. 33 (equivalent circuit diagram), the regions into which the impurity for the second threshold voltage adjustment are encompassed by dash lines. The specific n-channel MISFET Qn is the n-channel MISFET Qn of the CMOS gate circuit IV of the next stage. This specific n-channel MISFET Qn is set to a high threshold voltage of about 0.8 [V] by the introduction of the impurity for the second threshold voltage adjustment. The specific p-channel MISFET Qp is the p-channel MISFET Qp of the CMOS gate circuit IV of the next stage. This specific p-channel MISFET Qp is set to a high threshold voltage in an absolute value by the introduction of the impurity for the first threshold voltage adjustment. The impurity for the second threshold voltage adjustment is introduced to the p-channel MOSFETs Qp other than the specific MISFET Qp described above, and the low threshold voltage in the standard absolute value is set to be about $-0.6$ [V].

In the Bi-CMOS gate circuit III shown in FIG. 33, the input signal voltage Sin is about 0 or about 5 [V] whereas the output signal voltage is about 0.8 or about 4.2 [V]. In other words, when each of the n- and p-channel MISFETs Qn, Qp is set to the reference threshold voltage, the CMOS gate circuit IV of the next stage is always conductive and since the penetration current flows between the power source voltage Vcc and the reference voltage Vss, the threshold voltage is set to the high threshold voltage described above.

When the first threshold voltage adjustment for setting the reference threshold voltage of all the n-channel MISFETs Qn is made, the threshold voltage of all the p-channel MISFETs Qp is in advance set to a higher threshold voltage and when the second threshold voltage adjustment is made, the specific n-channel MISFET Qn is set from the standard reference voltage to a high threshold voltage and the p-channel MISFETs Qp other than the specific MISFET Qp are set from the high threshold voltage to the low standard threshold voltage so that four kinds of threshold voltages can be set by the introduction of the threshold voltage adjustment impurities of two times. In other words, since this threshold voltage adjustment step can reduce the number of introduction steps of the impurity for the threshold voltage adjustment and fabrication step of the impurity introduction masks, the number of fabrication steps of the hybrid semiconductor integrated circuit device 1 can be reduced.

GATE INSULATION FORMATION STEP

Next, the silicon dioxide film 79 on the main plane portion of the each of the $n^-$-type well regions 34A, 34B, n-type well region 34B and $p^-$-type well region 35 is removed so as to expose the main plane portion.

The gate insulation film 43 is then formed on the main plane portion of each of the $n^-$-type well regions 34A, 34B, n-type well region 34B and $p^-$-type well region 35 thus exposed. This gate insulation film 43 is formed by steam oxidation at a high temperature of from about 800° to 900° C., for example, in a film thickness of about 15 to 25 [nm]. The formation step of this gate insulation film 43 can form particularly the thick insulation film 41 on the main plane of the $n^+$-type semiconductor region 40 of the clamp MISFET Qc of the dielectric breakdown prevention circuit I at the input portion IN. Since this insulation film 41 has a high impurity concentration on the main plane portion of the $n^+$-type semiconductor region 40, it can be formed in a greater film thickness than the gate insulation film 43 by propagation oxidation. The insulation film 41 is formed in a film thickness of from about 80 to about 100 [nm].

GATE WIRING FORMATION STEP

Next, a polycrystalline silicon film is formed on the entire surface of the substrate including the gate insulation film 43 and the device isolation insulation film 36. The polycrystalline silicon film is deposited by CVD in a film thickness of from about 200 to 300 [nm]. An n-type impurity such as P is introduced by thermal diffusion into the polycrystalline silicon film so as to reduce the resistance value.

A transition metal silicide film such as a $WSi_2$ film is then formed on the polycrystalline silicon film. This transition metal silicide film is deposited by CVD or spattering, for example, in a film thickness of from about 90 to about 110 [nm]. The transition metal silicide film and the polycrystalline silicon film are formed as the gate wiring formation step of the first layer in the fabrication process.

Next, an inter-level insulation film 80 is formed on the entire surface of the transition metal silicide film described above. This inter-level insulation film 80 is formed by a silicon dioxide film deposited by CVD using inorganic silane gas ($SiH_4$ or $Si\ H_2Cl_2$) and nitrogen dioxide gas ($N_2O$) as the source gas. This silicon dioxide film is characterized in that its step coverage is high at the step portion and moreover, contraction of the film is small. The inter-level insulation film 80 is from about 350 to about 450 [nm] thick.

Figure 22:
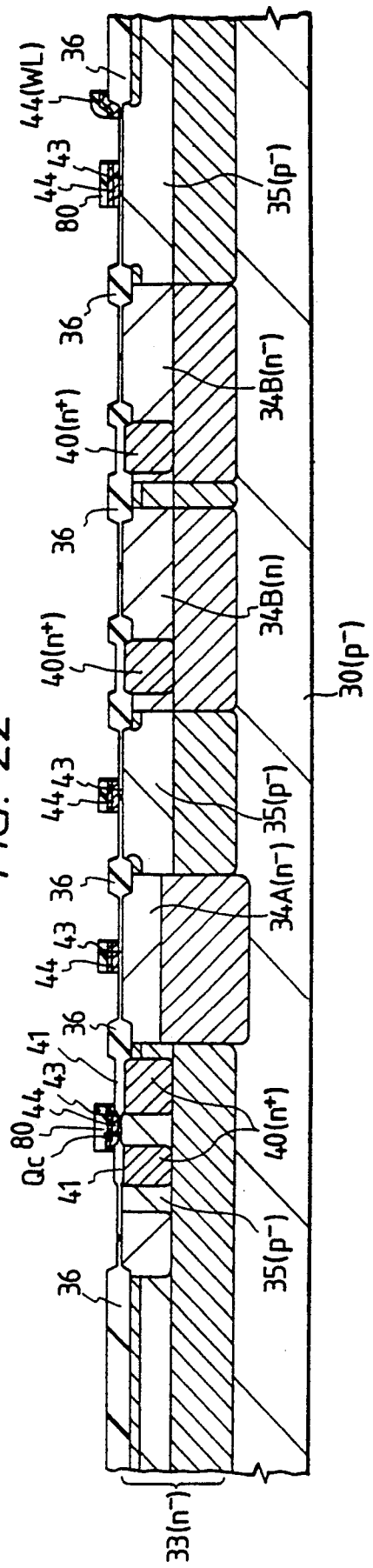

Next, as shown in FIG. 22, each of the inter-level insulation film 80, the transition metal silicide film and the polycrystalline silicon film is sequentially etched in a predetermined shape to form the gate electrode 44 and the word line (WL) 44. The inter-level insulation film 80 on the gate electrode 44 and the word line 44 is left as such. Etching described above is made by anisotropic etching such as RIE using an etching mask (photoresist film) formed by photolithography. When this gate electrode 44 is formed, the clamp MISFET Qc of the dielectric breakdown prevention circuit I at the input portion IN is substantially complete.

High temperature heat-treatment is then conducted to make density treatment of the transition metal silicide film and to recover the etching damage. The heat-treatment is conducted at a high temperature of from about 900° to about 1,000° C. for about 30 minutes.

Next, high temperature oxidation treatment is conducted in order to oxidize the exposed surfaces of the gate electrode 44 and word line 44 and particularly, to improve the dielectric withstand voltage of the gate insulation film 43 at the end portion of the gate electrode 44. This oxidation treatment is made by dry oxidation at a high temperature of from about 850° to about 900° C.

FORMATION STEP OF LOW CONCENTRATION SEMICONDUCTOR REGION

Next, the n-type impurity 45 n is introduced into the main plane portion of the $p^-$-type well region 35 in the formation region of each of the n-channel MISFET Qn, the clamp MISFET Qc of the input portion IN and the memory cell selection MISFET Qs of the memory cell array MA by use of the device isolation insulation film 36 and the inter-level insulation film 80 (and the gate electrode 44) as the impurity introduction mask. This n-type impurity $45n$ is introduced in self-alignment with the gate electrode 44. This n-type impurity $45n$ is introduced into the main plane portion of each of the $n^-$-type well region 34B and the n-type well region 34B in the formation region of the p-type base region of each bipolar transistor T1, T2, too. The n-type impurity $45n$ uses P in an impurity concentration of about $10^{13}$ [atoms/$cm^2$], for example, and is introduced by ion implantation at energy of from about 50 to about 70 [KeV].

The n-type impurity 45n forming the n-type semiconductor region 45 of the stacked structure of the memory cell selection MISFET Qs of the memory cell M on at least the connection side to the data storage capacitance element C is introduced by ion implantation in a low impurity concentration of less than $10^{14}$ [atoms/cm$^2$], as described already. Accordingly, the leakage quantity of the charge as the data of the data storage capacitance element C of the stacked structure can be reduced. Since the n-type impurity 45n is introduced in a low impurity concentration, each of the n-channel MISFET Qn and the memory cell selection MISFET Qs can be constituted in the LDD structure.

Since the n-type impurity 45n introduced into the bipolar transistors T1, T2 can reduce the impurity concentration on the surface of the p-type base region, it can reduce the parasitic capacitance added to the p-n junction at the surface portion between this p-type base region and the n-type emitter region to be formed by the subsequent step. In other words, the high frequency characteristics of the bipolar transistors T1, T2 can be improved. Furthermore, the n-type impurity 45n can improve the p-n junction withstand voltage at the surface portion between the p-type base region and the n-type emitter region. In other words, the withstand voltages of the bipolar transistors T1, T2 can be made higher. Moreover, since the n-type impurity 45n introduced into each of the bipolar transistors T1, T2 can be introduced by the step of introducing the n-type impurity 45n into the n-channel MISFET Qn and into the memory cell selection MISFET Qs, the number of fabrication steps of the hybrid semiconductor integrated circuit device 1 can be reduced.

In order to form basically the p-type semiconductor region 42 (approx. $10^{14}$ [atoms/cm$^2$] as the intrinsic base region of the p-type base region, it is necessary that the n-type impurity 45n, which is to be introduced into each bipolar transistor T1, T2, be introduced in a lower impurity concentration than the former. On the other hand, in order to reduce the parasitic capacitance formed at the surface portion of the boundary between the p-type base region and the n-type emitter region described already by at least about 10 [%], the n-type impurity 45n must be introduced in an impurity concentration of about $10^{12}$ [atoms/cm$^2$]. Therefore, the optimum impurity concentration of the n-type impurity, which is introduced into each bipolar transistor T1, T2, is the impurity concentration of the n-type impurity 45n for accomplishing the LDD structure of each of the n-channel MISFET Qn and the memory cell selection MISFET Qs. Moreover, the introduction condition of the n-type impurity 45n is optimum in order to lower the impurity concentration of the p-type base region of the shallower region (up to about 0.2 [μm] from the surface) than the n-type emitter region. Accordingly, this embodiment uses this n-type impurity 45n.

When this n-type impurity 45n is introduced, the formation region of the p-channel MISFET Qp is covered with the impurity introduction mask (photoresist film).

Next, as shown in FIG. 23, a p-type impurity 46p is introduced into the main plane portion of the n$^-$-type well region 34 in the formation region of the p-channel MISFET Qp by use of the device isolation insulation film 36 and the inter-level insulation film 80 (and the gate electrode 44) as the impurity introduction mask. This p-type impurity 46p is introduced in self-alignment with the gate electrode 44. The p-type impurity 46p uses BF$_2$ (or B) in an impurity concentration of from about $10^{12}$ to about $10^{13}$ [atoms/cm$^2$], for example, and is introduced by ion implantation at energy of from about 40 to about 60 [KeV]. When the p-type impurity 46p is introduced, the formation region of each of the n-channel MISFET Qn, the memory cell selection MISFET Qs, the clamp MISFET Qc and the bipolar transistors T1, T2 is covered with the impurity introduction mask (photoresist film).

SPACER FORMATION STEP

Next, as shown in FIG. 24, a sidewall spacer 47 is formed on the sidewall of each of the gate electrode 44, the word line 44 and the inter-level insulation film 80 as their upper layer. The sidewall spacer 47 can be formed by depositing a silicon dioxide film and applying anisotropic etching such as RIE in a film thickness corresponding to the deposited film thickness. The silicon dioxide film of the sidewall spacer 47 is formed by the same film as the inter-level insulation film 80 or in other words, by CVD using the inorganic silane gas and the nitrogen oxide gas as the source gas. The silicon dioxide film is from about 400 to about 500 [nm], for example. The length of the sidewall spacer 47 in the gate length direction (channel length direction) is from about 250 to about 300 [nm].

INTER-LEVEL INSULATION FILM FORMATION STEP 1

Next, the inter-level insulation film (without reference numeral) is formed on the entire surface of the substrate including the portions on the inter-level insulation film 80 and on the sidewall spacers 47. This inter-level insulation film is used as an etching stopper layer when each electrode layer of the data storage capacitance element C having a stacked structure is formed. It is formed also to isolate electrically the lower electrode layer 51 of the data storage capacitance element C of the stacked structure from the gate electrode 44 of the memory cell selection MISFET Qs and from the word line 44. In other words, the inter-level insulation film is formed in a film thickness which takes the cut quantity due to over-etching at the time of formation of the upper conductor layer, the cut quantity at the washing step, into consideration. The inter-level insulation film comprises a silicon dioxide film which is deposited by CVD using the inorganic silane gas and the nitrogen oxide gas as the source gas. In other words, this inter-level insulation film can reduce the stress generated on the basis of the difference of linear coefficients of expansion between the dielectric film 52 of the data storage capacitance element C of the stacked structure and the inter-level insulation film 80 as the base. The inter-level insulation film is from about 150 to about 250 [nm] thick, for example.

Figure 25:
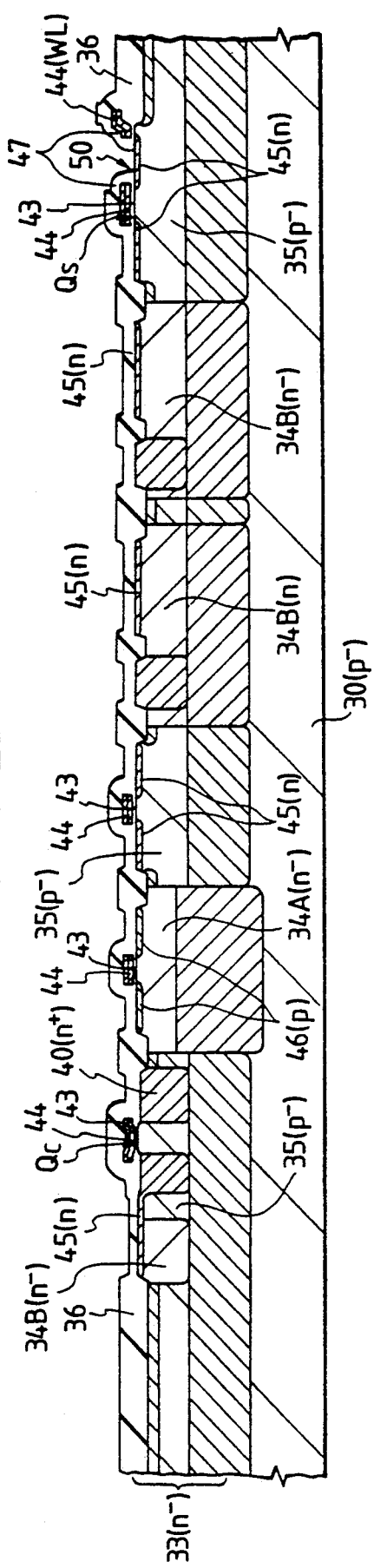

Next, as shown in FIG. 25, the inter-level insulation film on the n-type semiconductor region (on the side where the lower electrode layer 51 of the data storage capacitance element C is connected) of the other of the memory cell selection MISFET Qs of the memory cell M formation region, and a connection hole 50 is formed. This connection hole 50 is bored by photolithography and etching. After the connection hole 50 is bored, the etching mask used hereby is removed. After this etching mask is removed, high temperature heat-treatment is conducted to remove any etching damage. This heat-treatment is conducted at a high temperature of from about 900° to about 1,000° C. for about 10 minutes. Extension diffusion of the n-type impurity 45n that is introduced previously is made by this heat-treatment step and the n-type semiconductor region 45 having a low impurity concentration is formed. When this n-type semiconductor region 45 is formed, the memory cell selection MISFET Qs of the memory cell M is complete. Due to this heat-treatment, the p-type impurity 46p introduced previously is extended and diffused, thereby forming the low impurity concentration p-type semiconductor region 46.

GATE HAVING FORMATIONS STEP 2

Figure 26:
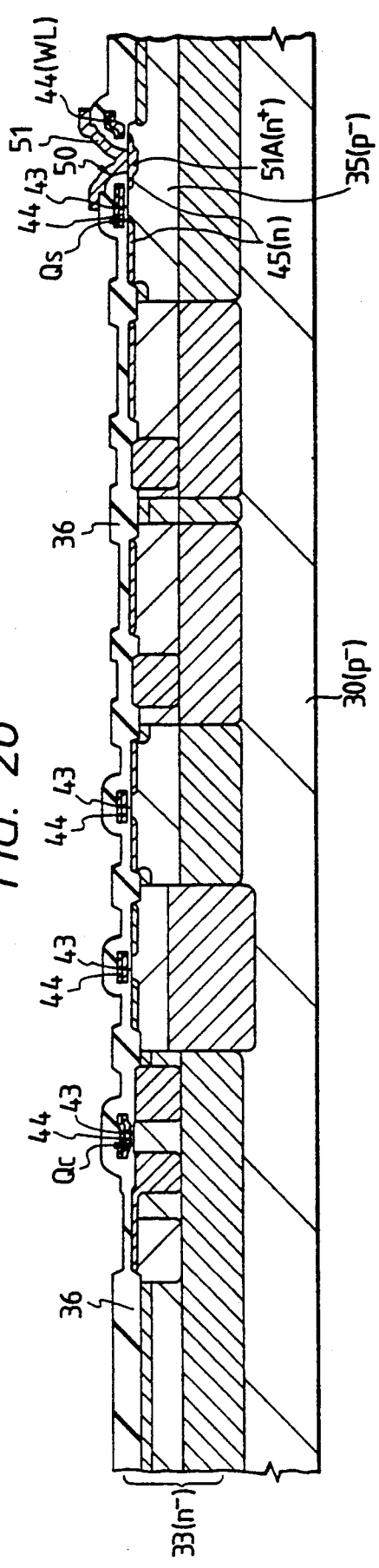

Next, the lower electrode layer 51 of the data storage capacitance element C of the stacked structure of the memory cell M is formed as shown in FIG. 26. Part of this lower electrode layer 51 is connected to the n-type semiconductor region 45 through the connection hole 50 described above and its other end is extended on the sidewall spacer 47 and on the inter-level insulation film 80. The lower electrode layer 51 comprises a polycrystalline silicon film deposited by CVD, for example, and has a relatively great thickness of from about 200 to about 300 [nm]. This polycrystalline silicon film is formed by the gate wiring formation step of the second layer in the fabrication process. The lower electrode layer 51 is formed by introducing n-type impurity such as P for reducing the resistance value into the polycrystalline silicon film by thermal diffusion, and then etching the polycrystalline silicon film by photolithography and etching. The n-type impurity introduced into the lower electrode layer 51 is diffused into the main plane portion of the other n-type semiconductor region 45 of the memory cell selection MISFET Qs, forming the high impurity concentration n+-type semiconductor region 51A. This n+-type semiconductor region 51A can improve the ohmic characteristics between the other n-type semiconductor region 45 of the memory cell selection MISFET Qs and the lower electrode layer 51 (reduction of the contact resistance).

DIELECTRIC FILM FORMATION STEP

Next, the dielectric film 52 is formed on the entire surface of the substrate including the portion on the lower electrode layer 51 of the data storage capacitance element C. As described already the dielectric film 52 has basically the two-layered structure formed by sequentially laminating the silicon nitride film and the silicon dioxide film. The silicon nitride film of the lower layer is deposited by CVD, for example, in a film thickness of from about 5 to about 10 [nm]. Entrapping of oxygen is limited as much as possible when this silicon nitride film is formed. When the silicon nitride film is formed on the polycrystalline silicon film as the lower electrode layer 51 at an ordinary production level, entrapping of a trace amount of oxygen occurs. Therefore, a thin natural silicon dioxide film (not shown) which is below 3 [nm] thick is formed between the lower electrode layer 51 and the silicon nitride film.

The silicon dioxide film of the upper layer of the dielectric film 52 is formed by applying high pressure oxidation to the silicon nitride film of the lower layer and it is from about 1 to about 6 [nm] thick. When the silicon dioxide film is formed, the thickness of the silicon nitride film of the lower layer somewhat drops. Basically, the silicon dioxide film is formed by high pressure steam oxidation in an oxygen gas atmosphere at a high pressure of from about 1.5 to about 10 [Torrs] and at a high temperature of from about 800° to about 1,000° C. The silicon dioxide film of this embodiment is formed by high pressure steam oxidation at a high pressure of 3 to 3.8 [Torrs], an oxygen flow rate (source gas) of 2 [l/min] at the time of oxidation, and a hydrogen flow rate (source gas) of 3 to 8 [l/min]. In comparison with the silicon dioxide film formed at a normal pressure (1 [Torr]), the silicon dioxide film by high pressure steam oxidation can be formed in a desired film thickness within a shorter time. In other words, since high pressure steam oxidation can shorten the high temperature heat-treatment time, the p-n junction depth of the source and drain regions of the memory cell selection MISFET Qs and the like can be made small. Particularly because the hybrid semiconductor integrated circuit device 1 includes the buried n+-type semiconductor regions 31A, 31B and the buried p+-type semiconductor region 32, the decrease in the junction depth of the source and drain regions of MISFET Q results in the decrease in the parasitic capacitance and in a higher operation speed.

Eventually, the dielectric film 52 has the three-layered structure formed by sequentially laminating the natural silicon dioxide film, the silicon nitride film and the silicon dioxide film. The natural silicon dioxide film can be made thin if the entrapping quantity of oxygen can be reduced. Though the number of fabrication steps increases, the dielectric film 52 can be constituted in the two-layered structure by nitriding the natural silicon dioxide film.

GATE WIRING FORMATION STEP

Next, the polycrystalline silicon film is deposited on the entire surface of the substrate including the portion on the dielectric film 52. The polycrystalline silicon film is deposited by CVD in a film thickness of from about 150 to about 250 [nm]. This polycrystalline silicon film is formed by the gate wiring formation step of the third layer in the fabrication process. Thereafter, an n-type impurity for reducing the resistance value, such as P, is introduced into the polycrystalline silicon film by thermal diffusion.

An etching mask is then formed on the polycrystalline silicon film on the entire surface of the memory cell array MA except for the connection portion between one of the n-type semiconductor regions 45 of the memory cell selection MISFET Qs and the complementary data line 57. The etching mask comprises a photoresist film formed by photolithography, for example. Thereafter, the polycrystalline silicon film and the dielectric film 52 are sequentially etched by use of the etching mask described above to form the upper electrode layer 53 by the polycrystalline silicon film. The polycrystalline silicon film is etched by anisotropic etching, for example. When this upper electrode layer 53 is formed, the data storage capacitance element C having the stacked structure is substantially complete and as a result, the memory cell M of DRAM is complete. After completion of this memory cell M, the etching mask described above is removed.

Figure 27:
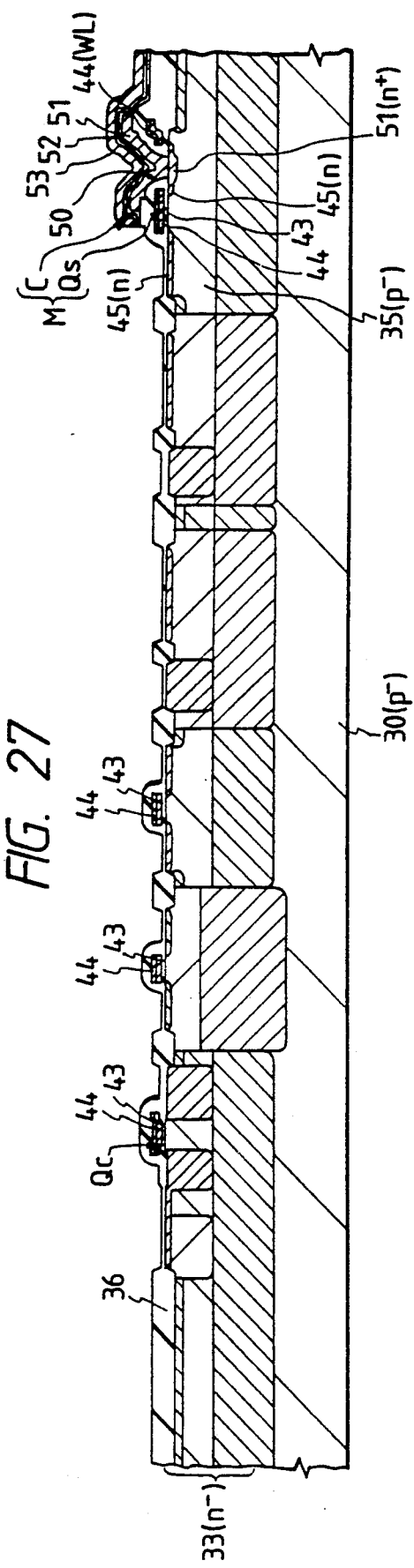

Next, as shown in FIG. 27, the inter-level insulation film formed between each device and the lower electrode layer 51 of the data storage capacitance element C of the stacked structure in the region other than that of the memory cell array MA is removed.

BASE REGION FORMATION STEP

Though not shown in the drawing, a silicon dioxide film is deposited onto the entire surface of the substrate as a through-film for the introduction of an impurity. This silicon dioxide film is deposited by CVD using an inorganic silane gas and a nitrogen oxide gas as the source gas, for example, in a film thickness of from about 20 to about 40 [nm].

Figure 28:
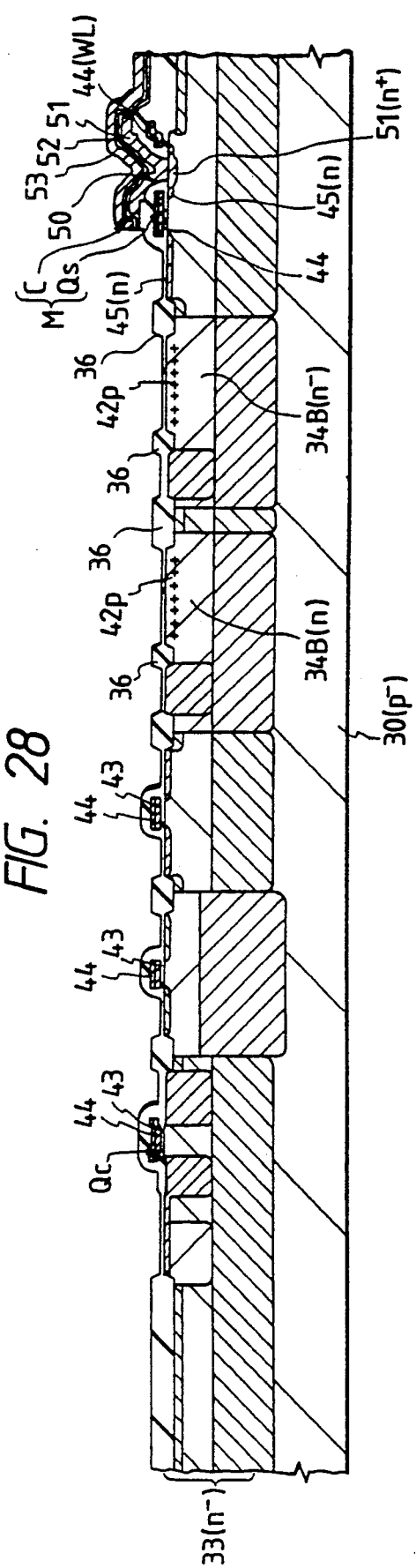

Next, as shown in FIG. 28, a p-type impurity 42p is introduced into the main plane portion of each of the $n^-$-type well region 34B and the n-type well region 34B in the formation region of the p-type base region of the bipolar transistor T1, T2. This p-type impurity 42p forms the intrinsic base region of the p-type base region. The p-type impurity 42p uses B in an impurity concentration of about $10^{14}$ [atoms/cm$^2$] and is introduced by ion implantation at energy of from about 20 to about 40 [KeV]. An impurity introduction mask (photoresist film) formed by photolithography is used for introducing this p-type impurity 42p.

FORMATION STEP OF HIGH CONCENTRATION SEMICONDUCTOR REGION

Next, an n-type impurity is introduced into the main plane portion of the $p^-$-type well region 35 in the formation region of each of the n-channel MISFET Qn and the protective resistor element R of the input portion IN. The gate electrode 44, the inter-level insulation film 80 as the upper layer of the former and the sidewall spacer 47 are used as the impurity introduction mask to introduce the n-type impurity. When this n-type impurity is introduced, the formation region of each of the memory cell array MA, the p-channel MISFET Qp and the bipolar transistors T1, T2 is covered with the impurity introduction mask (photoresist film). The n-type impurity forms primarily the source and drain regions of the high impurity concentration of the n-channel MISFET Qn. As the n-type impurity, arsenic (As) having an impurity concentration of from about $10^{15}$ to $10^{16}$ [atoms/cm$^2$], for example, is used and it is introduced by ion implantation at energy of from about 70 to about 90 [KeV].

Next, a p-type impurity is introduced into the main plane portion of each of the $n^-$-type well regions 34A, 34B and the n-type well region 34B in the formation region of each of the p-channel MISFET Qp and the p-type base region of the bipolar transistor T. In the formation region of the p-channel MISFET Qp, the gate electrode 44, the inter-level insulation film 80 as the upper layer of the former and the sidewall spacer 47 are used as the impurity introduction mask to introduce the p-type impurity. When the p-type impurity is introduced, the formation region of each of the memory cell array MA and the n-channel MISFET Qn is covered with the impurity introduction mask. This p-type impurity forms the source and drain regions having the high impurity concentration of the p-channel MISFET Qp and the graft base region of the p-type base region of the bipolar transistor T. The p-type impurity uses BF$_2$ having an impurity concentration of about $10^{15}$ [atoms/cm$^2$], for example, and is introduced by ion implantation at energy of from about 70 to about 90 [KeV].

Thereafter, extension diffusion is applied to each of the n- and p-type impurities described above, the $n^+$-type semiconductor region 48 is formed on the main plane portion of the $p^-$-type well region 35 as shown in FIG. 29 and the $p^+$-type semiconductor region 49 is formed on the main plane portion of each of the $n^-$-type well regions 34A, 34B and the n-type well region 34B. Extension diffusion described above is made at a high temperature of from about 900° to about 1,000° C. for about 10 minutes. The formation step of this $n^+$-type semiconductor region 48 completes substantially the n-channel MISFET Qn and the protective resistor device R of the dielectric breakdown prevention circuit I. The formation step of the $p^+$-type semiconductor region 49 completes substantially the p-channel MISFET Qp. Since the hybrid semiconductor integrated circuit device 1 of this embodiment can form the $p^+$-type semiconductor region 49 as the graft base region of the p-type base region of each bipolar transistor T1, T2 by the formation step of the $p^+$-type semiconductor region 49 as the source and drain regions of the p-channel MISFET Qp, the number of fabrication steps can be reduced by the number of the formation steps of the latter.

INTER-LEVEL INSULATION FILM FORMATION STEP 2

Next, the inter-level insulation film 54 is formed on the entire surface of the substrate including each of the devices described above. The inter-level insulation film 54 has the two-layered structure formed by laminating sequentially a silicon dioxide film 54A and a BPSG film 54B. The silicon dioxide film 54A as the lower layer of this inter-level insulation film 54 is deposited by CVD using an organic silane gas as the source gas, for example. Also, the silicon dioxide film 54 is deposited by CVD using an inorganic silane gas and a nitrogen oxide gas as the source gas. The silicon dioxide film 54A is from about 150 to about 250 [nm] thick in order to prevent the leakage of the impurity (each of P and B) from the BPSG film 54B as the upper layer. The BPSG film 54B as the upper layer is deposited by CVD, for example. It is from about 500 to about 700 [nm] thick, for example. Density treatment and reflow treatment are applied to the BPSG film 54B in a nitrogen gas atmosphere at a temperature of from about 900° to about 1,000° C. Due to this reflow, the surface of the BPSG film 54B is made flat.

CONNECTION HOLE FORMATION STEP

Next, the connection hole 55 is formed by removing the upper part of each of the semiconductor regions 40, 42, 45, 48, 49 of the inter-level insulation film 54, the gate electrode 44 and the word line 44. This connection hole 55 is formed by isotropic etching in combination with anisotropic etching in order to reduce the occupying area and to improve step coverage of the upper layer wiring at the step portion. The connection hole 55 may be formed by anisotropic etching.

Next, heat-treatment is conducted at a low temperature of from about 750° to about 850° C. for about 10 minutes in a nitrogen gas atmosphere. This heat-treatment is conducted in order to recover the damage due to etching for forming the connection hole 55. Since the heat-treatment is conducted at a low temperature, activation does not occur even when the impurity added to the BPSG film 54B as the upper layer of the inter-level insulation film 54 is out-diffused into each semiconductor region 40, 42, 45, 48, 49 and the effective impurity concentration of the surface does not drop.

A silicon dioxide film (not shown) is then formed on the main plane of each of the semiconductor regions 40, 42, 45, 48, 49 exposed from the connection hole 55. This silicon dioxide film can prevent the introduction of the impurity added to the BPSG film 54B as the upper layer of the inter-level insulation film 54 into each semiconductor region 40, 42, 45, 48, 49 through the connection hole 55 by the post-stage heat-treatment (extension diffusion of the impurity constituting the n+-type semiconductor region 56). If B among the impurities is introduced into the main plane portion of each n-type semiconductor region 40, 45, 48 or P is introduced into the main plane portion of each p-type semiconductor region 42, 49, the effective impurity concentration will drop and the contact resistance value between each semiconductor region and the wiring 57 connected thereto increases. The silicon dioxide film is a thin film of from about 12 to about 32 [nm]. The silicon dioxide film formed on the main plane of each n-type semiconductor region 40, 45, 48 is thicker than the silicon dioxide film formed on the main plane portion of each p-type semiconductor region 42, 49.

EMITTER REGION FORMATION STEP

An impurity introduction mask on which each of the n-type emitter region (inclusive of the collector potential pumping n+-type semiconductor region 40) of each bipolar transistor T1, T2 and one of the n-type semiconductor regions 45 of the memory cell selection MISFET Qs of the memory cell array MA are open is formed. This impurity introduction mask is formed by a photoresist film using photolithography, for example, in an open size permitting the exposure of the connection hole 55 described above.

Next, an n-type impurity is introduced into the main plane portion of the p-type semiconductor region 42 of the bipolar transistors T1, T2, the main plane portion of the collector potential pumping n+-type semiconductor region and the main plane portion of one of the n-type semiconductor region 45 of the memory cell selection MISFET Qs by use of the impurity introduction mask described above and the inter-level insulation film 54 below the former as the impurity introduction mask. Since this n-type impurity is introduced into the region defined by the connection hole 55, it is introduced in self-alignment with this connection hole 55. The n-type impurity is directed mainly to form the n-type emitter region of each bipolar transistor T1, T2. Accordingly, the n-type impurity uses Sb in an impurity concentration of from about $10^{15}$ to about $10^{16}$ [atoms/cm$^2$], for example, and is introduced by ion implantation at energy of from about 100 to 120 [KeV]. As the n-type impurity, Sb is characterized in that it has a higher diffusion rate than As as another n-type impurity but has a lower diffusion rate than P.

The n-type impurity introduced into the main plane portion of the p-type semiconductor region 42 of the p-type base region of each bipolar transistor T1, T2 forms the n-type emitter region as described already. The n-type impurity introduced into the main plane portion of the collector potential pumping n+-type semiconductor region 40 of each bipolar transistor T1, T2 is introduced in order to reduce the contact resistance value between the collector potential pumping n+-type semiconductor region 40 and the wiring 57 connected thereto. The n-type impurity introduced into the main plane portion of one of the n-type semiconductor regions 45 of the memory cell selection MISFET Qs is introduced in order to prevent the short-circuit between the complementary data line 57 passed through the connection hole 55 and the p−-type well region 35 when the n-type semiconductor region 45 and the connection hole 55 deviate from each other at the time of mask registration during the fabrication process.

The n-type impurity described above is not basically introduced into the main plane portion of the n+-type semiconductor region of the n-channel MISFET Qn and into the main plane portion of the n+-type semiconductor region 40 of the clamp MISFET Qc. The p-type impurity is not introduced into the main plane portion of the p+-type semiconductor region 49 of the p-channel MISFET Qp. In other words, the hybrid semiconductor integrated circuit device 1 includes the buried p+-type semiconductor region 32 and the buried n+-type semiconductor region 31A and the impurity is not introduced in order to reduce the parasitic capacitance added to the source and drain regions.

After the impurity introduction mask described above is removed, high temperature heat-treatment is carried out and extension diffusion is applied to the n-type impurity that is formed previously, as shown in FIG. 30, thereby forming the n+-type semiconductor region 56. This heat treatment is conducted at a high temperature of from about 900° to about 1,000° C. for about 15 to about 25 minutes. As described already, the n+-type semiconductor region 56 formed in the region of each bipolar transistor T1, T2 is used as the n-type emitter region. When this n+-type semiconductor region 56 is formed, each of the bipolar transistors T1, T2 is substantially complete.

WIRING FORMATION STEP

Before the wiring 57 is formed, the surface of each semiconductor region 40, 48, 49, 56 exposed inside the connection hole 55 is exposed by pre-washing. This pre-washing is made by spattering or etching, for example.

Since this pre-washing step cuts off the inner wall of the connection hole 55 of the inter-level insulation film 54, the open size of the connection hole 55 somewhat increases (or the inter-level insulation film 54 is recessed back) In order to improve the high frequency characteristics, the n-type emitter region of each bipolar transistor T1, T2 forms a shallow p-n junction by As having a low diffusion rate. However, when the diffusion quantity of the n-type emitter region formed by As in the lateral direction is small and the increment of the open size of the connection hole 55 due to the pre-washing step is greater than this diffusion quantity, the p-type base region and the wiring 57 cause short-circuit. On the other hand, when the n-type emitter region is formed by P having a high diffusion rate, the junction depth of the p-type base region and its diffusion quantity in the lateral direction increase with the increase in the p-n junction depth of the n-type emitter region. Accordingly, the high frequency characteristics get deteriorated due to the increase of the parasitic capacitance and the integration density drops due to the increase of the area in each operation region. Therefore, the hybrid semiconductor integrated circuit device 1 of this embodiment forms the n+-type semiconductor region 56 as the n-type emitter region of each bipolar transistor T1, T2 by Sb having a higher diffusion rate than As but a a lower diffusion rate than P. Moreover, this Sb and its introduction step are used commonly as the formation step of the n+-type semiconductor region 56 formed integrally with one of the n-type semiconductor regions 45 of the memory cell selection MISFET Qs of the memory cell array MA.

Figure 31:
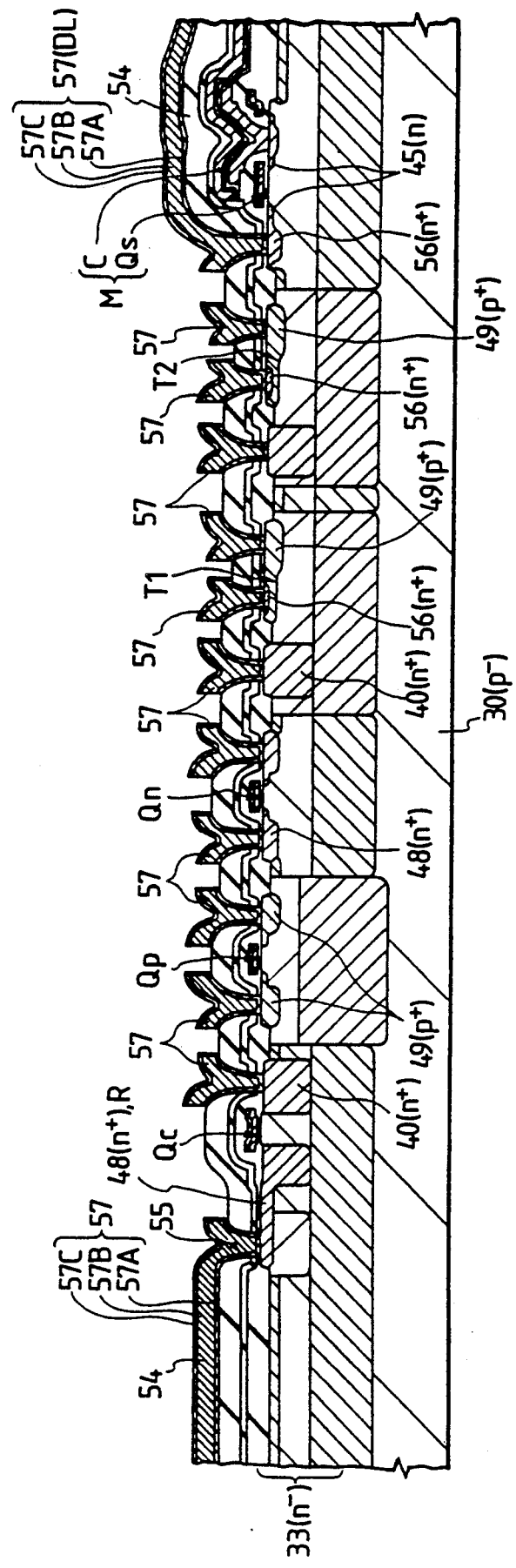

Next, the wiring 57 which connects to each semiconductor region 40, 48, 49, 56 through the connection hole 55 and extends on the inter-level insulation film 54 is formed as shown in FIG. 31. This wiring 57 is used as the complementary data line 57 on the memory cell array MA. The wiring 57 is formed by the wiring formation step of the first layer in the fabrication process. It has a three-layered structure obtained by laminating sequentially the transition metal silicide film 57A, the aluminum alloy film 57B and the transition metal silicide film 57C.

The transition metal silicide film 57A as the lower layer of the wiring 57 is formed by a MoSi$_2$ film deposited by spattering, for example, and is from about 10 to about 60 [nm] thick. It may also be formed by a WSi$_2$ film deposited by CVD, for example, in order to improve step coverage, and is from about 50 to about 70 [nm] thick.

The aluminum alloy film 57B of the intermediate layer is deposited by spattering, for example, and is from about 400 to about 600 [nm] thick.

The transition metal silicide film 57C of the upper layer is formed by a MoSi$_2$ film deposited by spattering, for example, and is from about 10 to about 20 [nm] thick.

This wiring 57 is formed by photolithography and etching after the transition metal silicide film 57A, the aluminum alloy film 57B and the transition metal silicide film 57C are laminated sequentially.

In the hybrid semiconductor integrated circuit device wherein the bipolar transistors T1, T2 and the memory cell selection MISFET Qs of DRAM are formed on the same substrate as described above, the n+-type semiconductor region 56 as the n-type emitter region of each bipolar transistor T1, T2 and the n+-type semiconductor region 56 as part of the source or drain region of the memory cell selection MISFET Qs are formed by introducing the n-type impurity by ion implantation and activating it by the same step, and the aluminum alloy film 57B is connected to each of the n-type emitter region, the source region and drain region through the transition metal silicide film (barrier metal layer) 57A formed by the same production step. According to this structure, it is possible to use commonly the formation steps of the n+-type semiconductor region 56 as part of the source or drain region of the memory cell selection MISFET Qs of DRAM, the transition metal silicide film (barrier metal layer) 57A and the aluminum alloy film 57B for the formation steps of the n-type emitter region of the bipolar transistor T1, T2, the transition metal silicide film (barrier metal layer) 57A and the aluminum alloy film 57B, respectively. Therefore, the number of the fabrication steps of the hybrid semiconductor integrated circuit device 1 can be reduced. At the same time, since controllability of the impurity concentration can be much more improved by forming the n-type emitter region described above by ion implantation than the introduction of the impurity by thermal diffusion (e.g. a bipolar transistor having a polysilicon emitter structure), it is possible to reduce any fluctuation of the emitter-ground current amplification ratio ($h_{FE}$) of the bipolar transistor T1, T2 and to improve electrical reliability of the hybrid semiconductor integrated device 1. It is also possible to prevent the alloying reaction of the n-type emitter region, source region and drain region with the aluminum alloy film 57B and to prevent the alloy spike phenomenon. Accordingly, electrical reliability of the hybrid semiconductor integrated circuit device 1 can be further improved.

INTER-LEVEL INSULATION FILM FORMATION STEP 3

Next, the inter-level insulation film 58 is formed on the entire surface of the substrate including the wiring 57 described above. The inter-level insulation film 58 has a three-layered structure obtained by laminating sequentially a silicon dioxide film (deposition type insulation film) 58A, a silicon dioxide film (coating type insulation film) 58B and a silicon dioxide film (deposition type insulation film) 58C.

The silicon dioxide film 58A as the lower layer is deposited by plasma CVD, and is from about 150 to about 250 [nm] thick.

The silicon dioxide film 58B of the intermediate layer is formed in order to make flat the surface of the inter-level insulation film 58. The silicon dioxide film 58 is formed by coating several times (2 to 5 times; in a total film thickness of from about 100 to about 150 [nm]), then applying baking treatment and carrying back the surface by etching. Due to this carry-back by etching, the silicon dioxide film 58B is formed only in the recess among the step-like shape on the surface of the silicon dioxide film 58A of the lower layer. Incidentally, the intermediate layer of the inter-level insulation film 58 may be formed by an organic film such as a polyimide type resin film in place of the silicon dioxide film 58B.

The silicon dioxide film 58C of the upper layer is deposited by plasma CVD, for example, in order to improve strength of the film of the inter-level insulation film 58 as a whole, and is from about 500 to about 700 [nm] thick.

CONNECTION HOLE FORMATION STEP 3

Next, a connection hole 59 is formed in the inter-level insulation film 58. The connection hole 59 is formed in a taper-like or step-like shape by isotropic etching in combination with anisotropic etching in the same way as the connection hole 55 described already. The connection hole 59 may be formed by anisotropic etching alone.

After the connection hole 59 is formed, heat-treatment is conducted at a low temperature of about 400° C. for about 10 to about 20 minutes in order to recover the damage due to etching.

WIRING FORMATION STEP 2

As shown in FIG. 1, a wiring 60 extending on the inter-level insulation film 58 is formed in such a manner as to connect to the wiring 57 through the connection hole 59. This wiring 60 is formed by the wiring formation step of the second layer. As described already, the wiring 60 has basically the three-layered structure in the same way as the wiring 57. In other words, the wiring 60 is formed by laminating sequentially the transition metal silicide film 60A, the aluminum alloy film 60B and the transition metal silicide film 60C.

The transition metal silicide film 60A of the lower layer is formed by a MoSi$_2$ film which is deposited by spattering, and is from about 10 to about 60 [nm] thick.

The aluminum alloy film 60B of the intermediate layer is deposited by spattering and is from about 700 to 1,000 [nm] thick and therefore thicker than the aluminum alloy film 57B of the wiring 57 described above.

The transition metal silicide film 60C of the upper layer is formed by a MoSi$_2$ film deposited by spattering, for example, and is from about 10 to about 30 [nm] thick.

This wiring 60 is formed by laminating sequentially the transition metal silicide film 60A, the aluminum alloy film 60B and the transition metal silicide film 60C and then working by photolithography and etching.

After the formation step of the wiring 60 described above, heat-treatment is conducted in order to recover the damage due to etching of the wiring 60.

PASSIVATION FILM FORMATION STEP

Though not shown in FIG. 1, a passivation film is then formed on the entire surface of the substrate including the wiring 60. The passivation film comprises a composite film obtained by laminating sequentially a silane film, a silicon nitride film and a resin film. The silane film as the lower layer of the passivation film is from about 150 to about 250 [nm] thick, for example. The silicon nitride film as the intermediate layer is deposited by plasma CVD, for example, and is from about 1.0 to about 1.2 [μm] thick. The silicon nitride film is formed in order to improve moisture resistance. The resin film as the upper layer is formed by a polyimide type resin film coated by coating, for example, and is from about 8 to about 12 [μm] thick. This resin film is formed in order to improve α-ray soft error withstand voltage of DRAM.

Next, bonding apertures are bored in the passivation film in the formation region of the external terminals BP of the hybrid semiconductor integrated circuit device 1. The bonding aperture is formed by photolithography and etching.

Incidentally, the transition metal silicide film 60C as the upper layer of the wiring 60, which is used as the external terminal BP, may be removed inside the region defined by the bonding aperture in order to improve detection accuracy of the bonding position at the bonding step. Removal of the transition metal silicide film 60C is effected when the bonding aperture is opened. In other words, the removal of the transition metal silicide film 60C at the portion of the external terminal BP is made to expose the aluminum alloy film 60B as its lower layer and to obtain the difference of reflectively of a position detection beam between this aluminum alloy film 60B and the resin film as the upper layer of the passivation film.

After the series of formation steps are carried out, the hybrid semiconductor integrated circuit device 1 having mounted thereto DRAM is complete.

In the fabrication method of the hybrid semiconductor integrated circuit device 1 including the bipolar transistors whose intrinsic collector region and buried collector region are disposed sequentially in the direction of depth of the substrate and MISFET whose well region and buried semiconductor region, which are formed by the same layer of the same conductivity type as the intrinsic collector region and buried collector region, respectively, are disposed sequentially in the direction of depth of the substrate, the fabrication method in accordance with the present invention includes the step of introducing Sb into the main plane portion of the formation region of each of the bipolar transistors T1, T2 of the p$^-$-type semiconductor substrate 30 and introducing Sb (or As) and P having the same conductive type as that of the former but having a higher diffusion rate into the main plane portion of the formation region of the p-channel MISFET Qp on the p$^-$-type semiconductor substrate 30; the step of growing the n$^-$-type epitaxial layer 33 on the main plane of the p$^-$-type semiconductor substrate 30, diffusing Sb into the formation region of each bipolar transistor T1, T2 to form the buried n$^+$-type semiconductor region (buried collector region) 31B, and diffusing Sb and P into the formation region of the p-channel MISFET Qp to form the buried n$^+$-type semiconductor region 31A; and the step of forming the n-type well region 34B and the n$^-$-type well region (intrinsic collector region) 34B on the main plane portion of the formation region of each bipolar transistor T1, T2 of the n$^-$-type eptaxial layer 33 and forming the n$^-$-type well region 34A on the main plane portion of the formation region of the p-channel MISFET Qp of the n$^-$-type epitaxial layer 33. According to this structure, since the diffusion rate of P is higher than that of Sb, the depth of the buried n$^+$-type semiconductor region 31A in the direction of depth of the substrate can be made greater than the dpeth of the buried n$^+$-type semiconductor region 31B in the direction of depth of the substrate of each bipolar transistor T1, T2. Accordingly, it is possible to reduce the depth of the p$^-$-type well region 34A in the formation region of the p-channel MISFET Qp and to increase the depth of each of the n-type and n$^-$-type well regions 34B, 34B (intrinsic collector region) of each bipolar transistor T1, T2.

In the hybrid semiconductor integrated circuit device 1 wherein the wiring 57 is connected to the main plane of the n$^+$-type semiconductor region 56 as the n-type emitter region of the bipolar transistor T through the connection hole (emitter aperture) 55 formed in the inter-level insulation film 54, the n$^+$-type semiconductor region 56 as the n-type emitter region of the bipolar transistor T is formed by introducing, and activating, Sb into and in the main plane portion of the region defined by the connection hole 55 of the p-type base region (p-type semiconductor region 42). The wiring 57 comprises the aluminum alloy film 57B as the main body. According to this structure, though the diffusion quantity of the n$^+$-type semiconductor region 56 as the n-type emitter region in the lateral direction is greater than As and even if the aperture size of the connection hole 55 increases due to pre-washing which is effected before the formation of the wiring 57, the short-circuit between the p-type semiconductor region 42 as the p-type base region and the wiring 57 can be prevented. Accordingly, electrical reliability of the hybrid semiconductor integrated circuit device 1 can be improved. Since the diffusion quantity of the n$^+$-type semiconductor region 56 as the n-type emitter region in each of the lateral and vertical directions is smaller than P and the junction depth of each of the n-type emitter region, the p-type base region and the n-type collector region can be made small, the travelling distance of the current between the n-type emitter region and the n-type collector region can be shortened so that the operation speed of the hybrid semiconductor integrated circuit device 1 can be improved. Since the parasitic capacitance can be reduced by reducing the p-n junction area between the n$^-$-type emitter region and the p-type base region and between the p-type base region and the n-type collector region, the operation speed of the hybrid semiconductor integrated circuit device 1 can be further improved. Moreover, the integration density of the hybrid semiconductor integrated circuit device 1 can be improved by reducing the junction depth of each of the n-type emitter region, the p-type base region and the n-type collector region and thus reducing the occupying area of the bipolar transistor T.

Since the n-type impurity forming the n+-type semiconductor region 56 as the n-type emitter region is also introduced into the main plane portion of the collector potential pumping n+-type semiconductor region 40 of the bipolar transistor T, it can reduce the contact resistance value between the collector potential pumping n+-type semiconductor region 40 and the wiring 57. Since the n-type impurity forming the n+-type semiconductor region 56 as the n-type emitter can use commonly the n-type impurity for forming the n+-type semiconductor region 56 integrated with one of the n-type semiconductor regions 45 of the memory cell selecting MISFET Qs of the memory cell M of DRAM, the number of fabrication steps of the hybrid semiconductor integrated circuit device 1 can be reduced.

In the hybrid semiconductor integrated circuit device 1 wherein the buried p+-type semiconductor region 32 having the same conductivity as, but having a higher impurity concentration than, the p⁻-type well region 35 is disposed below this well region 35 and the wiring 57 is connected to each of the n-type semiconductor region 48 as the source and drain regions of the n-channel MISFET Qn formed on the main plane portion of the p⁻-type well region 35 described above and the n-type semiconductor region 45 as the source and drain regions of the memory cell selection MISFET Qs of DRAM through the connection hole 55 bored in the inter-level insulation film 55, the wiring 57 is connected to the n+-type semiconductor region 48 of the n-channel MISFET Qn formed on the main plane portion of the CMOS region CMOS of the p⁻-type well region 35 described above, and to the n-type semiconductor region 45 of the memory cell selection MISFET Qs formed on the main plane portion of the memory cell array MA in the p⁻-type well region 35, through the n+-type semiconductor region 56 having a greater junction depth than the n+-type semiconductor region 48 formed by introducing the n-type impurity into the region defined by the connection hole 55. In other words, the n+-type semiconductor region 56 is disposed in the memory cell selection MISFET Qs of the memory cell array MA but is not disposed in the n-channel MISFET Qn constituting the peripheral circuit. According to this structure, it is possible to isolate the n+-type semiconductor region 48 of the n-channel MISFET Qn from the buried p+-type semiconductor region 32 below the p⁻-type well region 35 and to reduce the parasitic capacitance added to the n+-type semiconductor region 48 of the n-channel MISFET Qn. Accordingly, the operation speed of the hybrid semiconductor integrated circuit device 1 can be improved and even if any mask deviation occurs between the n-type semiconductor region 45 and the connection hole 55 (or the wiring 57) during the fabrication process, the n-type semiconductor region 45 of the memory cell selection MISFET Qs can be connected reliably to the wiring 57 through the n-type semiconductor region 56 described above. In this manner, the short-circuit between the wiring 57 and the p⁻-type well region 35 can be prevented and electrical reliability of the hybrid semiconductor integrated circuit device 1 can be improved.

Incidentally, in the hybrid semiconductor integrated circuit device 1 of this embodiment I, the afore-mentioned intrinsic base region can be formed by the formation step of the p-type semiconductor region 46 constituting the LDD structure of the p-channel MISFET Qp by deleting the formation step of the p-type semiconductor region 42 as the intrinsic base region of each bipolar transistor T1, T2. In other words, the intrinsic base region of each bipolar transistor is formed by the same formation step as that of the p-type semiconductor region 46 of the p-channel MISFET Qp. In this case, the impurity concentration is set to a little bit higher level of about $10^{14}$ [atoms/cm$^2$] with the intrinsic base region being the reference. If the impurity concentration of the p-type semiconductor region 46 constituting the LDD structure is taken as the reference, the impurity concentration of the intrinsic base region becomes somewhat lower so that punch-through occurs between the n-type emitter region and the n-type collector region On the other hand, the function of the p-type semiconductor region 46 constituting the LDD structure is to cope with the hot carrier, there is no effective problem for the p-channel MISFET Qp even if the impurity concentration becomes somewhat higher.

In this manner, the number of fabrication steps of the hybrid semiconductor integrated circuit device 1 can be reduced by forming the intrinsic base region of the bipolar transistor T at the formation step of the p-type semiconductor region 46 of the p-channel MISFET Qp employing the LDD structure.

EMBODIMENT II

Embodiment II is the second embodiment of the present invention which explains another structure of the dielectric breakdown prevention circuit I disposed at the input portion IN of the hybrid semiconductor integrated circuit device 1 of the first embodiment I.

Figure 34:
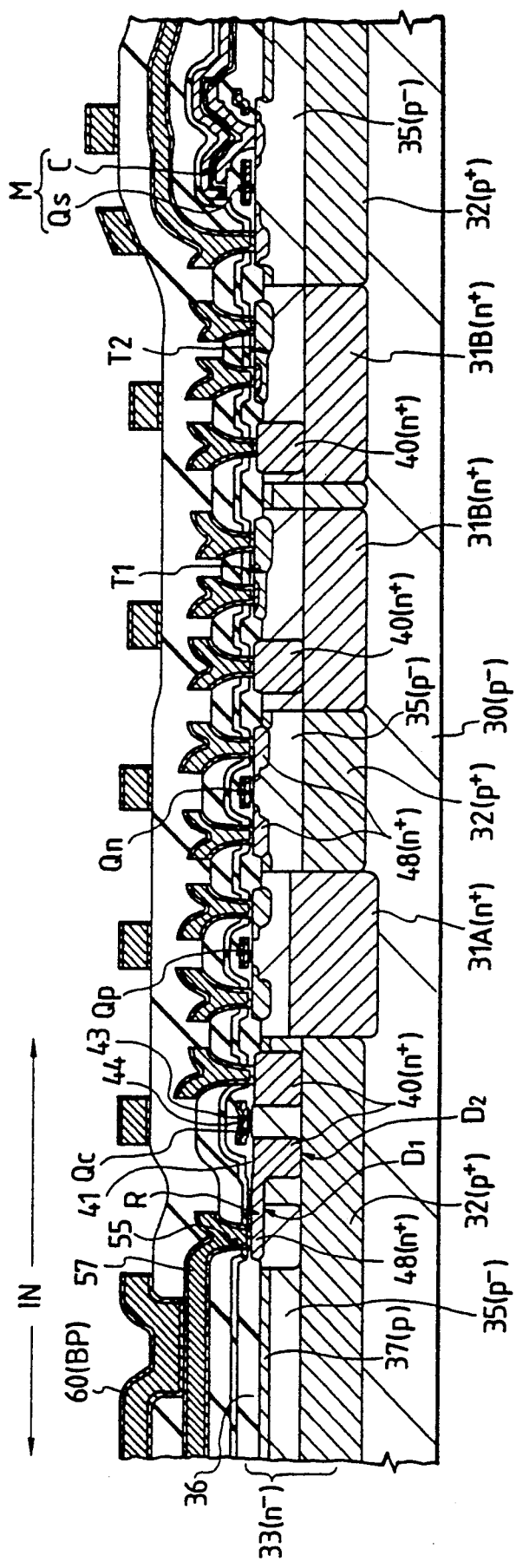
FIGS. 34 to 36 are sectional views of the principal portions of a hybrid semiconductor integrated circuit device in accordance with an embodiment II of the present invention.
Figure 35:
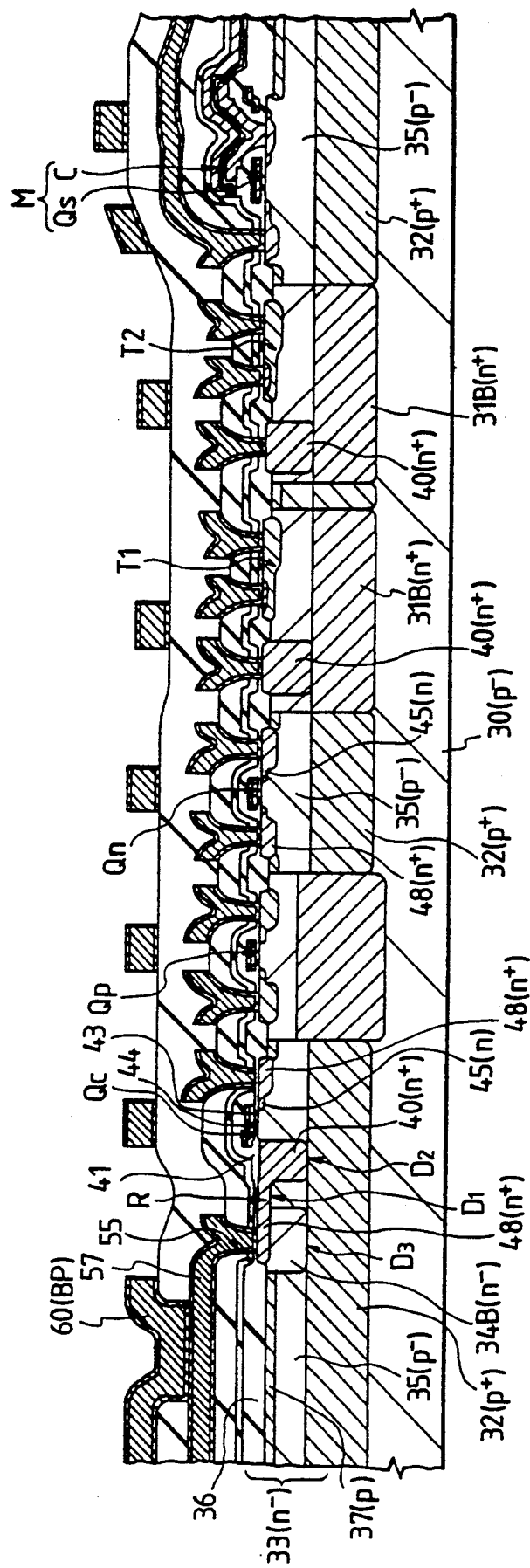
Figure 36:
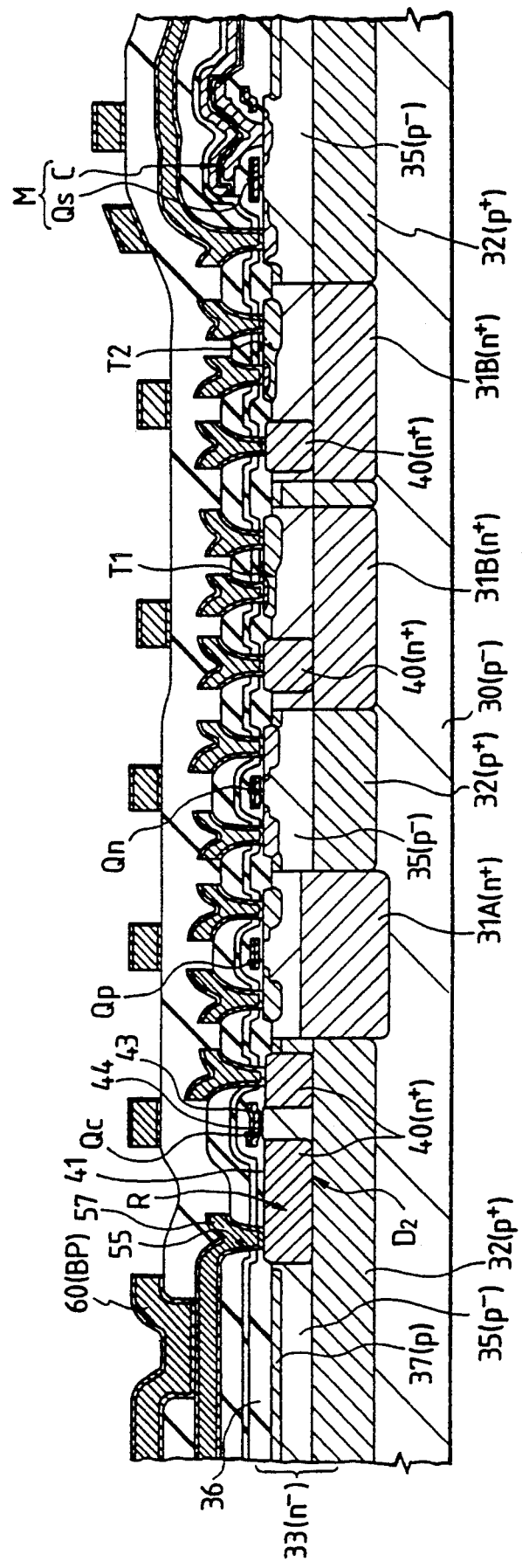

FIGS. 34 to 36 (sectional views of the principal portions) show the hybrid semiconductor integrated circuit device 1 in accordance with Embodiment II of the present invention.

As shown in FIG. 34, the dielectric breakdown prevention circuit I at the input portion IN of the hybrid semiconductor integrated circuit device 1 of this embodiment II comprises mainly a clamp MISFET Qc, a protective resistor element R and diode devices $D_1$, $D_2$. The source and drain regions of this clamp MISFET Qc are formed by the n+-type semiconductor region 40 in the same way as the clamp MISFET Qc of the first embodiment I. Therefore, since the n+-type semiconductor region 40 of this clamp MISFET Qc can be formed in self-alignment with the gate electrode 44, its effective channel length can be secured substantially at a set value. The protective resistance element R is constituted by the n+-type semiconductor region 48. The diode device $D_1$ comprises the n+-type semiconductor region 48 and the p⁻-type well region 35 described above. The diode device $D_2$ comprises the n+-type semiconductor region 40 and the buried p+-type semiconductor region 32. These diode devices $D_1$, $D_2$ are disposed sequentially from the external terminal BP for the input signal towards the input stage circuit Cin.

In the hybrid semiconductor integrated circuit device 1 having the dielectric breakdown prevention circuit I between the external terminal BP for the input signal and the input stage circuit connected in series with the former, the dielectric breakdown prevention circuit I is formed by disposing sequentially and in parallel from the external terminal BP for the input signal towards the input stage circuit Cin, the diode device $D_1$ comprising the p⁻-type well region 35 which has a low impurity concentration and is formed by the same layer as the p⁻-type well region 35 of the n-channel MISFET Qn, on the main plane portion of the substrate, and the n⁺-type semiconductor region 48 which has a high impurity concentration and is formed by the same layer as the n⁺-type semiconductor region 48 as the source and drain regions of the n-channel MISFET Qn, on the main plane portion of the p⁻-type well region 35; and the diode device $D_2$ comprising the buried p⁺-type semiconductor region 32 which has a high impurity concentration and is formed by the same layer as the device isolation region of the bipolar transistor T buried in the substrate and the n⁺-type semiconductor region 40 which has a high impurity concentration and is formed by the same layer as the collector potential pumping n⁺-type semiconductor region 40 of the bipolar transistor T with its bottom being in contact with the buried p⁺-type semiconductor region 32, on the main plane portion of the substrate. According to this structure, it is possible to reduce step-wise the excessive current inputted to the external terminal BP for the input signal by the diode devices $D_1$ and $D_2$ and moreover, to make the p-n junction withstand voltage of the diode device $D_2$ lower than the dielectric breakdown withstand voltage of the gate insulation film 43 of the input stage circuit Cin. Therefore, it is possible to prevent the dielectric breakdown of the input stage circuit Cin and to improve the dielectric breakdown withstand voltage of the hybrid semiconductor integrated circuit device 1. Since the formation steps of the bipolar transistor T and the n-channel MISFET Qn can be used commonly as the formation steps of the diode devices $D_1$, $D_2$ of the dielectric breakdown prevention circuit I, the number of fabrication steps of the hybrid semiconductor device 1 can be reduced by the number of these formation steps.

The dielectric breakdown prevention circuit I may have substantially the same structure as the dielectric breakdown prevention circuit of the embodiment I as shown in FIG. 35 and only the source region of the clamp MISFET Qc may comprise the n-type semiconductor region 45 and the n⁺-type semiconductor region 48 in the same way as the n-channel MISFET Qn. Since this clamp MISFET Qc can reduce the diffusion distance of the source region to the channel formation region of the n-type semiconductor region 45, it can reduce the short channel effect.

In the dielectric breakdown prevention circuit I described above, as shown in FIG. 36 the protective resistance element R may comprise the n⁺-type semiconductor region 40 and may be formed integrally with the n⁺-type semiconductor region 40 as the drain region of the clamp MISFET Qc. The bottom of the n⁺-type semiconductor region 40 as the protective resistance element R is brought into contact with the buried p⁺-type semiconductor region 32. In this case, the dielectric breakdown prevention circuit I has only the diode device $D_2$ but this diode device $D_2$ can absorb the excessive current in a wide range corresponding to the protective resistance element R and to the drain region of the clamp MISFET Qc.

In the dielectric breakdown prevention circuit I described above, it is possible to form the protective resistance element R by the n⁺-type semiconductor region 48 in the same way as the protective resistance element R of the embodiment I and to dispose the n⁻-type well region 34B (or the n-type well region 34B) throughout this n⁺-type semiconductor region 48. In other words, the diode $D_1$ does not exist in this dielectric breakdown prevention circuit I and the diode device $D_3$ and $D_2$ are disposed sequentially from the external terminal BP for the input signal towards the input stage circuit Cin.

In the hybrid semiconductor integrated circuit device 1 having the dielectric breakdown prevention circuit I between the external terminal BP for the input signal and the input stage circuit Cin connected directly to the former, the dielectric breakdown prevention circuit I is constituted by disposing sequentially from the external terminal BP for the input signal towards the input stage circuit Cin, the diode device $D_3$ which comprises the buried p⁺-type semiconductor region 32 having a high impurity concentration and formed by the same layer as the device isolation region of the bipolar transistor T buried in the substrate, and the n⁻-type well region 34B having a low impurity concentration and formed by the same layer as the n⁻-type well region (or the n-type well region 34B or the n⁻-type well region 34A of the p-channel MISFET Qp) as the intrinsic collector region of the bipolar transistor T disposed with its bottom surface in contact with the buried p⁺-type semiconductor region 32 on the surface portion of the substrate; and the diode device $D_2$ which comprises the buried p⁺-type semiconductor region 32 and the n⁺-type semiconductor region 40 having a high impurity concentration and formed by the same layer as the collector potential pumping n⁺-type semiconductor region 40 of the bipolar transistor disposed with its bottom surface in contact with the buried p⁺-type semiconductor region 32 on the main plane portion of the substrate. According to this structure, it is possible to reduce step-wise the excessive current inputted to the external terminal BP for the input signal by the diode devices $D_3$ and $D_2$ and moreover, to make the p-n junction withstand voltage of the diode device $D_2$ lower than the dielectric breakdown withstand voltage of the gate insulation film 43 of the input stage circuit Cin. Therefore, it is possible to prevent dielectric breakdown of the input stage circuit and to improve the dielectric breakdown withstand voltage of the hybrid semiconductor integrated circuit device 1. Furthermore, since the formation steps of the bipolar transistor T and p-channel MISFET Qp can be used commonly as the formation steps of the diode devices $D_1$ and $D_2$ of the dielectric breakdown prevention circuit I, respectively, the number of fabrication steps of the hybrid semiconductor integrated circuit device 1 can be reduced by the number of these formation steps.

EMBODIMENT III

Embodiment III is the third embodiment of the invention which improves the integration density of the hybrid semiconductor integrated circuit device 1 of the embodiment I by reducing the occupying areas of the bipolar transistors.

Figure 37:
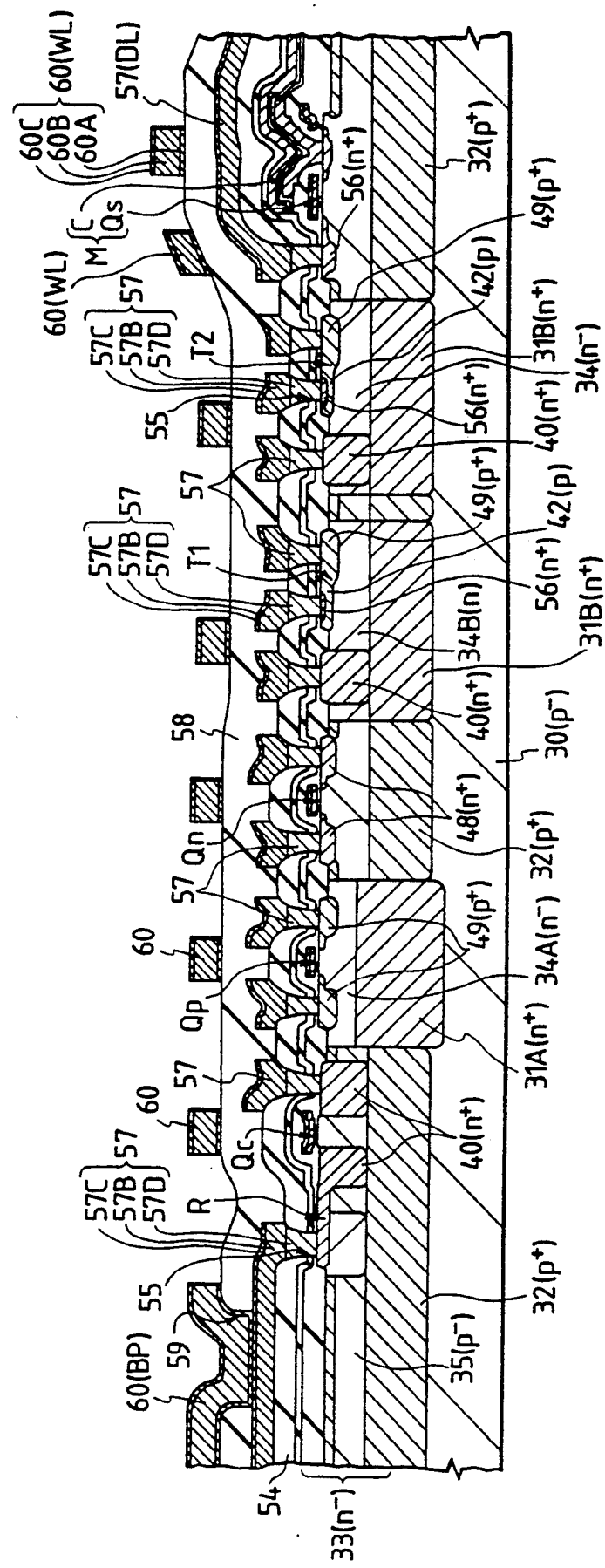
FIG. 37 is a sectional view of the principal portions of a hybrid semiconductor integrated circuit device in accordance with an embodiment III of the present invention.

FIG. 37 (sectional views of the principal portions) shows the hybrid semiconductor integrated circuit device 1 of this embodiment III.

In the hybrid semiconductor integrated circuit device 1 of this embodiment III, a transition metal film (or a transition metal silicide film) 57D is buried into at least the connection hole 55 used as the emitter aperture of each bipolar transistor T1, T2. This transition metal film 57D is used as part of the wiring 57. Since the aluminum alloy film 57B is not connected directly to each semiconductor region 40, 48, 49, 56 through the transition metal film 57D, the transition metal silicide film 57A described in the embodiment I is deleted.

The transition metal film 57D as the lower layer of the wiring 57 uses a W film deposited by selective CVD, for example. A WSi$_2$ film or the like is used in the case of the transition metal silicide film 57D. The transition metal film 57D is deposited by CVD or spattering until the inside of the connection hole 55 is filled and may thereafter be carried back on the entire surface by etching so that it remains only inside the connection hole 55.

The aluminum alloy film 57B of the wiring 57 is characterized in that its specific resistance value is small, but its step coverage is low at the step portion, particularly at the connection hole 55 portion used as the emitter aperture and its sectional area decreases. Each bipolar transistor T1, T2 has an emitter current quantity which is greater than the operation current quantity of CMOS. In order to secure the migration withstand voltage, therefore, the open size of the connection hole 55 as the emitter aperture must be increased. This increase in the open size of the connection hole 55 increases sequentially the areas of the n-type emitter region, p-type base region and n-type collector region, and results in the increase in the occupying area of each bipolar transistor T1, T2. In other words, in the hybrid semiconductor integrated circuit device 1 of the present invention, the transition metal film 57D is buried in the connection hole 55 so as to increase the sectional area of the wiring 57 at the connection hole 55 portion.

As shown in FIG. 38 (sectional view of the principal portions at a predetermined fabrication step), the connection hole 55 is first formed in the inter-level insulation film 54 and the transition metal film 57D described above is then buried into this connection hole 55.

Next, the aluminum alloy film 57B and the transition metal silicide film 57C are sequentially laminated on the entire surface of the substrate including the portions on the transition metal film 57D and on the inter-level insulation film 54. Thereafter, as shown in FIG. 39 (sectional view of the principal portions at a predetermined fabrication step), the transition metal silicide film 57C and the aluminum alloy film 57B are worked in predetermined shapes, respectively, to form the wiring 57. In other words, the transition metal film 57D as the lower layer of the wiring 57 is buried into all the connection holes 55 connecting the other devices to the wiring 57 inclusive of the connection holes 55 as the emitter aperture of each bipolar transistor T1, T2.

In the hybrid semiconductor integrated circuit device 1 described above wherein the aluminum alloy film 57B (wiring 57) extending on the inter-level insulation film 54 is connected to the n$^+$-type semiconductor region 56 as the n-type emitter region of each bipolar transistor T1, T2, through the connection hole 55 as the emitter aperture formed in the inter-level insulation film 54, the transition metal film (or the transition metal silicide film) 57D is buried into the emitter aperture (connection hole) 55 bored in the inter-level insulation film 54 and the n$^+$-type semiconductor region 56 as the n-type emitter region of each bipolar transistor T1, T2 is connected to the aluminum alloy film 57B of the wiring 57 through the transition metal film 57D. According to this structure, the sectional area of the wiring 57 can be increased at the step portion of the connection hole 55 by filling substantially all the regions inside the connection hole 55 as the emitter aperture by the transition metal film 57D so that the open size of the connection hole 55 as the emitter aperture can be reduced and the area of the n-type emitter region can be reduced. In other words, since the occupying area of each bipolar transistor T1, T2 can be reduced, the integration density of the hybrid semiconductor integrated circuit device 1 can be improved.

Since the transition metal film 57D buried into the connection hole 55 as the emitter aperture has a higher electromigration withstand voltage than the aluminum alloy film 57B, it is possible to further reduce the open area of the connection hole 55 and to further improve the integration density of the hybrid semiconductor integrated circuit device 1.

Since the transition metal film 57D buried into the connection hole 55 as the emitter aperture can prevent the alloying reaction between the n$^+$-type semiconductor region 56 as the n-type emitter region and the aluminum alloy film 57B, it can prevent the alloy spike phenomenon.

The transition metal film 57D can be buried into the connection hole 55 in self-alignment therewith. Since undesired opening does not occur inside the connection hole 55 even if any deviation of mask registration occurs between the connection hole 55 and the aluminum alloy wiring 57B of the wiring 57 (and transition metal silicide film 57C) at the formation step, the width of the wiring of the aluminum alloy film 57B at the connection hole 55 portion and the gap between the wirings can be reduced, respectively. In other words, it is no longer necessary to secure a mask registration margin (deletion of so-called "dog bone") with the aluminum alloy film 57B at the connection portion between the transition metal film 57D buried into the connection hole 55 and the aluminum alloy film 57B.

The transition metal film 57D can improve the step coverage of the complementary data line 57 at the connection hole 55 portion at the connection portion with the complementary data line 57 with one of the n-type semiconductor region 45 (the n$^+$-type semiconductor region 56, in practice) of the memory cell selection MISFET Qs of the memory cell M of the memory cell array MA, and can reduce the breakage of the complementary data line 57. Particularly, the transition metal film 57D buried into the connection hole 55 is effective because the memory cell M of the memory cell array MA comprises the data storage capacitance element C having the stacked structure and the step shape of the connection hole 55 is greater than the other regions.

The connection portion between the transition metal film 57D buried into the connection hole 55 of the wiring 57 and the aluminum alloy film 57B might cause precipitation of Si and the alloying reaction. In the practical use, therefore, a barrier metal layer such as a transition metal nitride film (TiN film) is interposed between them.

EMBODIMENT IV

This embodiment IV is the fourth embodiment of the present invention which is directed to improve the operation speed of the Bi-CMOS circuit, in particular, in the hybrid semiconductor integrated circuit device 1 of the embodiment I.

Figure 40:
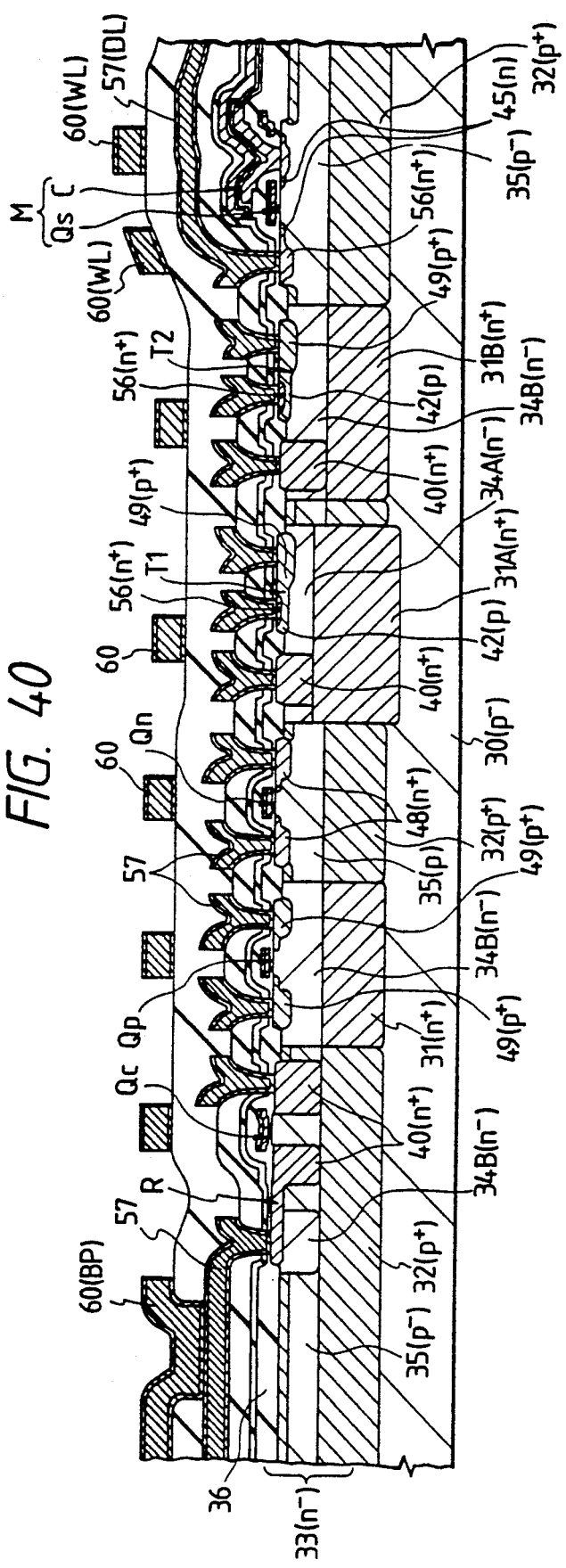
FIG. 40 is a sectional view of the principal portions of a hybrid semiconductor integrated circuit device in accordance with an embodiment IV of the present invention.

FIG. 40 (sectional view of the principal portions) shows the hybrid semiconductor integrated circuit device of the embodiment IV of the present invention.

In the hybrid semiconductor integrated circuit device 1 of this embodiment IV, particularly in the bipolar transistor T1 constituting the Bi-CMOS gate circuit, the n-type collector region is formed by the buried n+-type semiconductor region 31A and the n−-type well region 34A (intrinsic collector region).

The buried n+-type semiconductor region 34A has a large depth in the direction of depth of the substrate and the depth of the n−-type well region 34A is small.

On the other hand, the n-channel MISFET Qn of CMOS constituting the Bi-CMOS circuit is disposed on the main plane of the p−-type well region 35 and the p-channel MISFET Qp is disposed on the main plane of the n−-type well region 34B. Each of the p−-type well region 35 of the n-channel MISFET Qn and the n−-type well region 34B of the p-channel MISFET Qp has a smaller depth than the n−-type well region 34A as the intrinsic collector region of the bipolar transistor T1. The size of each of the buried p+-type semiconductor region 32 of the n-channel MISFET Qn and the buried n+-type semiconductor region 34B of the p-channel MISFET Qp is smaller than the buried n+-type semiconductor region 31A of the bipolar transistor T1 in the direction of depth of substrate.

In other words, in the bipolar transistor T1 described above, it is possible to make shallow the n−-type well region 34A as the intrinsic collector region among the n-type collector region and to shorten the distance between the n-type emitter region and the n-type collector region (the distance from the n-type emitter region to the buried n+-type semiconductor region 31A). Therefore, it is possible to reduce the travelling distance of the current, to improve the base cut-off frequency and to improve the operation speed. In contrast, in the n-channel MISFET Qn, the n+-type semiconductor region 48 as the source and drain regions and the buried p+-type semiconductor region 32 can be isolated positively by making the dpeth of the p−-type well region 35, and consequently, it is possible to reduce the parasitic capacitance added to the n+-type semiconductor region 48 and to improve the operation speed. Similarly, since the p-channel MISFET Qp can increase the depth of the n−-type well region 34B and can isolate positively the p+-type semiconductor region 49 as the source and drain regions from the n+-type semiconductor region 31B, it is possible to reduce the parasitic capacitance added to the p+-type semiconductor region 49 and to improve the operation speed.

Incidentally, the bipolar transistor T2 shown in FIG. 40 is constituted so as to improve the high withstand voltage.

Figure 41:
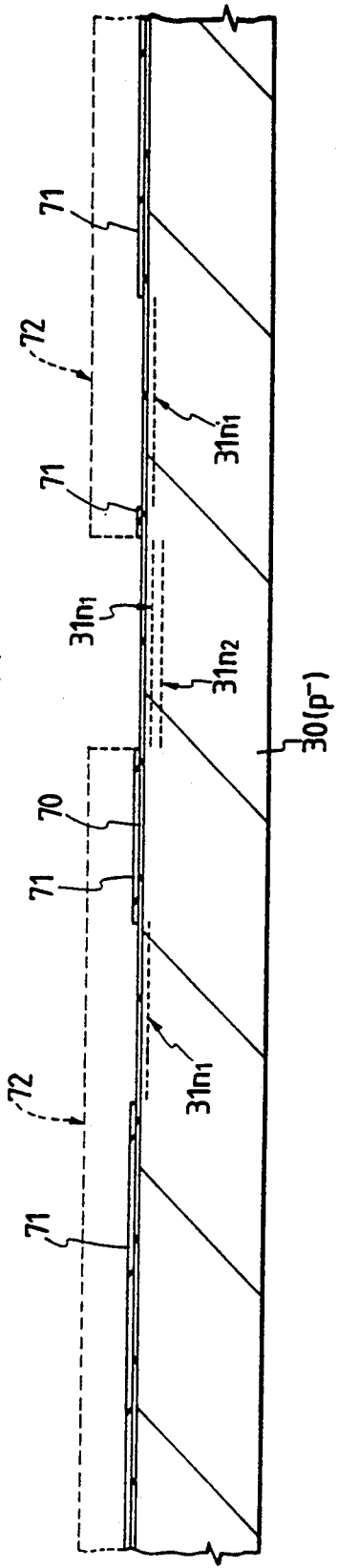
FIG. 41 is a sectional view of the principal portions of the hybrid semiconductor integrated circuit device at a predetermined fabrication step.

Each of the buried n+-type semiconductor region 31A of the bipolar transistor T1 of the Bi-CMOS gate circuit and the buried n+-type semiconductor region 31B of the p-channel MISFET Qp is formed as shown in FIG. 41 (sectional view of the principal portions at a predetermined formation step). In other words, the buried n+-type semiconductor region 31A of the bipolar transistor T1 is formed by introducing the n-type impurity $31n_1$, $31n_2$ and the buried n+-type semiconductor region 31B of the p-channel MISFET Qp is formed by introducing the n-type impurity $31n_1$. The n-type impurity $n_1$ uses Sb having a low diffusion rate, for example, and the n-type impurity $31n_2$ uses P having a high diffusion rate, for example. Since its diffusion rate is low, the n-type impurity $31n_1$ can form the deep n−-type well region 34B. Since its diffusion rate is high, the n-type impurity $31n_2$ can form the shallow n−-type well region 31B.

In the hybrid semiconductor integrated circuit device 1 described above including the bipolar transistor T1 whose intrinsic collector region and buried collector region are sequentially disposed in the direction of depth of the substrate and the p-channel MISFET Qp formed in the region where the well region having the same conductivity and formed by the same layer as the intrinsic collector region and buried collector region and the buried semiconductor region are disposed sequentially in the direction of depth of the substrate, the depth of the n−-type collector region 34A as the intrinsic collector region of the bipolar transistor T1 from the substrate surface is made smaller than the depth of the n−-type well region 34B forming the p-channel MISFET Qp from the substrate surface. According to this structure, since it is possible to make small the depth of the n−-type well region 34A as the intrinsic collector region of the bipolar transistor T1 and to shorten the travelling distance of the current, it becomes possible to improve the base cut-off frequency and the operation speed. At the same time, since it is possible to make great the depth of the n−-type well region 34B from the substrate in the p-channel MISFET Qp and to isolate the p+-type semiconductor region 49 as the source and drain region of the p-channel MISFET Qp from the buried n+-type semiconductor region 31B, it is possible to reduce the parasitic capacitance added to the p+-type semiconductor region 49 and to improve the operation speed of the p-channel MISFET Qp.

EMBODIMENT V

Embodiment V is the fifth embodiment of the present invention which improves the frequency characteristics of the bipolar transistor in the hybrid semiconductor integrated circuit device 1 of the embodiment I.

Figure 42:
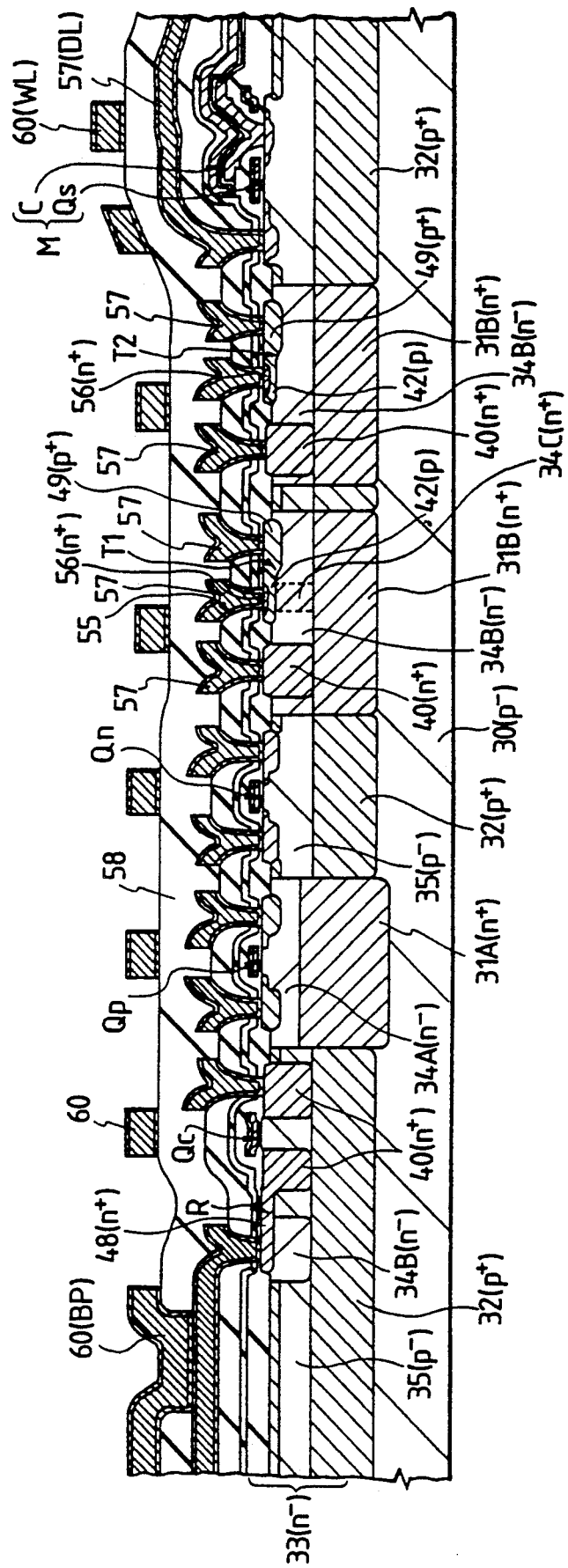
FIG. 42 is a sectional view of the principal portions of a hybrid semiconductor integrated circuit device in accordance with an embodiment V of the present invention.

FIG. 42 (sectional view of the principal portions) shows the hybrid semiconductor integrated circuit device 1 of the embodiment V of the present invention.

In the hybrid semiconductor integrated circuit device 1 of this embodiment V, a buried n+-type semiconductor region 34C having a high impurity concentration is disposed immediately below the n-type emitter region of the n−-type well region 34B used as the intrinsic collector region of the bipolar transistor T1 as shown in FIG. 42. In other words, this buried n+-type semiconductor region 34C increases the impurity concentration of the n−-type well region 34B as the intrinsic collector region between the p-type semiconductor region 42 as the intrinsic base region of the p-type base region and the buried n+-type semiconductor region 31B of the n-type collector region.

Figure 43:
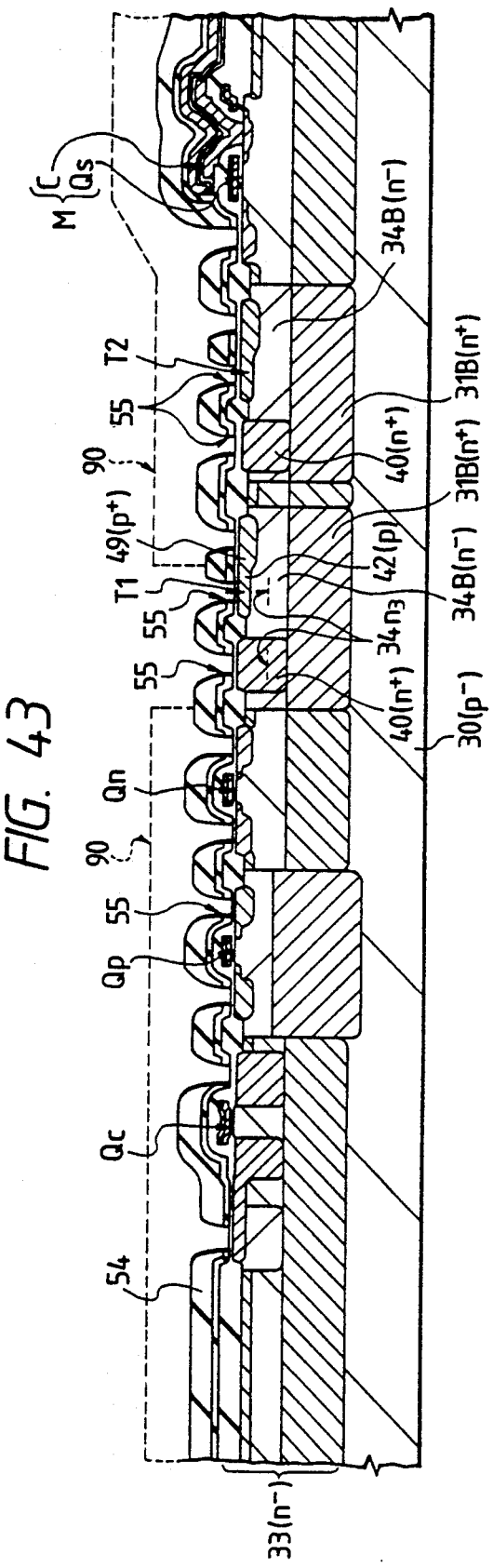
FIG. 43 to 45 are sectional views of the principal portions, each showing the hybrid semiconductor integrated circuit device in accordance with each fabrication step.
Figure 44:
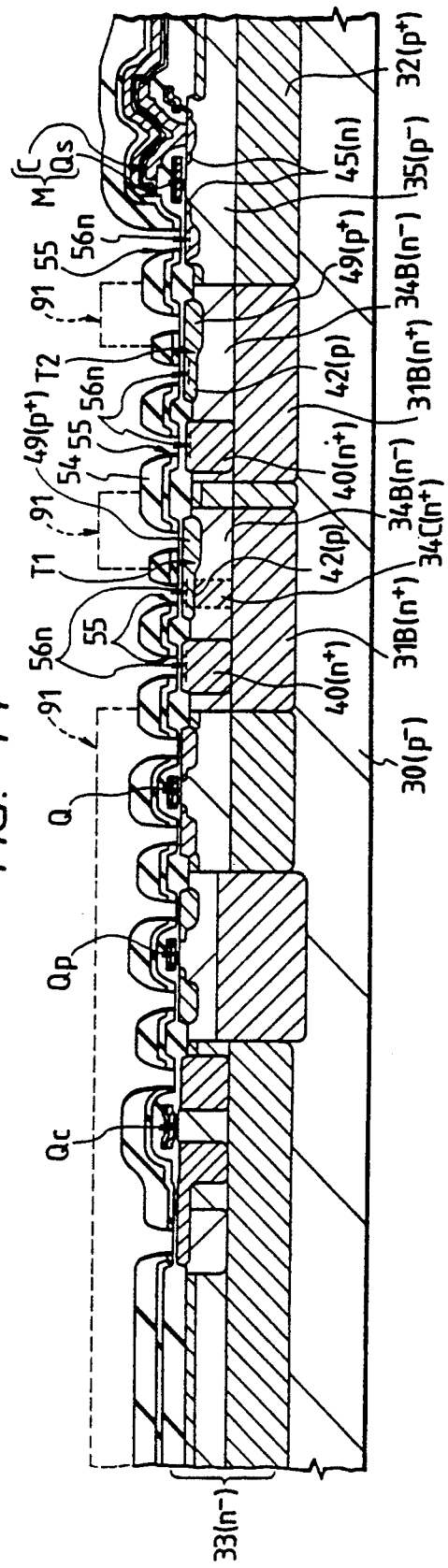

The buried n+-type semiconductor region 34C disposed immediately below the n-type emitter region is formed as shown in FIGS. 43 and 44 (sectional views of the principal portions at predetermined formation steps).

First of all, the connection hole 55 is formed in the inter-level insulation film 54 covering the device. This connection hole 55 is used as the emitter aperture on the p-type semiconductor region 42 as the intrinsic base region of the p-type base region of the bipolar transistor T1.

Next, an impurity introduction mask 90 on which the connection hole 55 portions on the formation region of the n-type emitter region of the bipolar transistor T1 and on the collector potential pumping n+-type semiconductor region 40 are open is formed. This impurity introduction mask 90 comprises a photoresist film formed by photolithography, for example, and is disposed on the inter-level insulation film 54.

An n-type impurity $34n_3$ is then introduced into at least the main plane portion of the n⁻-type well region 34B as the intrinsic collector region of the bipolar transistor T1 inside the region which is defined by the opening of the impurity introduction mask 90 and the connection hole 55 as shown in FIG. 43. The n-type impurity $34n_3$ uses P having an impurity concentration of about $10^{15}$ [atoms/cm²], for example, so that the impurity concentration is higher than that of the n⁻-type well region 34B and the peak of the impurity concentration exists in that region, and this impurity is introduced by ion implantation at high energy of about 300 [KeV]. This n-type impurity $34n_3$ is also introduced into the main plane portion of the collector potential pumping n⁺-type semiconductor region 40 of the bipolar transistor T1. Since the n-type impurity $34n_3$ is introduced inside the region defined by the connection hole (emitter aperture) 55 which defines also the size of the n-type emitter region of the bipolar transistor T1, it is introduced into the region immediately below the n-type emitter region in self-alignment therewith.

Next, an impurity introduction mask 91 on which each of the main plane portion of the p-type semiconductor region 42 of each bipolar transistor T1, T2, the main plane portion of the collector potential pumping n⁺-type semiconductor region and the main plane portion of one of the n-type semiconductor regions 45 of the memory cell selection MISFET Qs of the memory cell M of the memory cell array MA is formed. This impurity introduction mask 91 comprises a photoresist film produced by photolithography, for example.

Next, an n-type impurity $56n$ is introduced into the main plane portion of at least the p-type semiconductor region 42 and the n-type semiconductor region 45.

Extension diffusion is then applied to each of the n-type impurity $34n_3$ and n-type impurity $56n$ described above. The n-type impurity $34n_3$ forms the buried n⁺-type semiconductor region 34C immediately below the n-type emitter region. The n-type impurity $56n$ forms the n⁺-type semiconductor region 56 as part each of the n⁺-type semiconductor region 56 as the n-type emitter region and the source or drain region of the memory cell selection MISFET Qs.

The n-type impurity $34n_3$ forming the buried n⁺-type semiconductor region 34C is introduced before the introduction of the n-type impurity $56n$ if the extension diffusion quantity is great, and the n-type impurity $56n$ is then introduced after the extension diffusion is conducted. According to this sequence of steps, the junction depth of the n⁺-type semiconductor region 56 as the n-type emitter region can be made small so that the high frequency characteristics of the bipolar transistor T1 can be further improved. The n-type impurity $34n_3$ may be introduced after the introduction of the n-type impurity $56n$ if the extension diffusion quantity is small.

Figure 45:
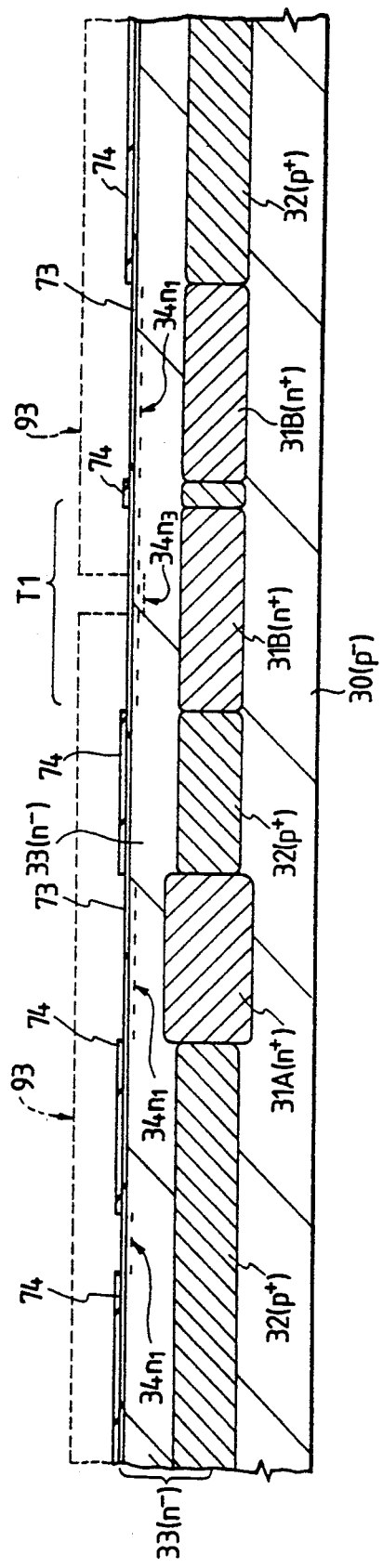

The buried n⁺-type semiconductor region 34C may be formed by introducing the n-type impurity $34n_3$ after (or before) the introduction of the n-type impurity $34n_1$ forming the n⁻-type well region 34B, by use of the impurity introduction mask 93 as shown in FIG. 45 (sectional view of the principal portions at a predetermined fabrication step).

In the hybrid semiconductor integrated circuit device 1 described above having the bipolar transistor T1 having a vertical structure wherein the n-type emitter region, the p-type base region and the n-type collector region are disposed sequentially from the surface of the substrate in the direction of its depth, the buried n⁺-type semiconductor region 34C having a higher impurity concentration than the n⁻-type well region 34B is disposed at the portion of the n⁻-type well region as the intrinsic collector region of the n-type collector region immediately below the n-type emitter region. According to this structure, the resistance value of the region of n⁻-type well region 34B of the n-type collector region, where the current flows substantially, immediately below the n-type emitter region can be reduced and the current flowing time can be shortened. It is therefore possible to improve the base cut-off frequency as well as the operation speed of the bipolar transistor T1. Since the intrinsic collector region other than the portion of the n-type collector region immediately below the emitter region is formed by the n⁻-type well region 34B having a low impurity concentration and the parasitic capacitance formed by the p-n junction between the intrinsic collector region and the p-type base region can be reduced, it becomes possible to further reduce the base cut-off frequency and to further improve the operation speed of the bipolar transistor T1.

The buried n⁺-type semiconductor region 34C at the portion of the n-type collector region immediately below the emitter region is formed by introducing the n-type impurity $34n_3$ into the n⁻-type well region 34B as the intrinsic collector region of the n-type collector region inside the region defined by the emitter aperture (connection hole 55) which defines the n⁺-type semiconductor region 56 as the n-type emitter region. According to this structure, part of the formation step of the impurity introduction mask for forming the buried n⁺-type semiconductor region 34C of the high impurity concentration of the n-type collector region immediately below the n-type emitter region can employ the formation step of the emitter aperture (connection hole 55). Therefore, the number of fabrication steps of the hybrid semiconductor integrated circuit device 1 can be reduced by the number of the formation steps corresponding to the formation step of this mask.

EMBODIMENT VI

This embodiment VI is the sixth embodiment of the present invention which reduces power consumption in a hybrid semiconductor integrated circuit device having mounted thereto DRAM having a large capacity of at least 16 [Mbit].

Figure 46:
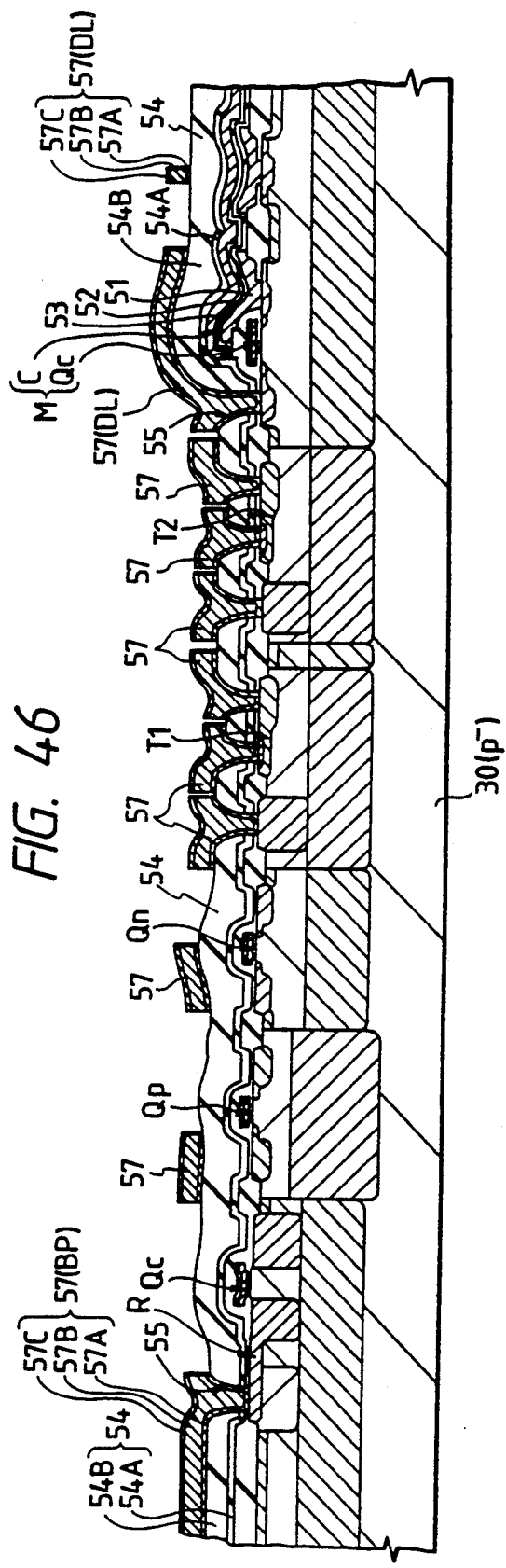
FIG. 46 is a sectional view of the principal portions of a hybrid semiconductor integrated circuit device in accordance with an embodiment VI of the present invention.

FIG. 46 (sectional view of the principal portions) shows the hybrid semiconductor integrated circuit device in accordance with embodiment VI of the present invention.

DRAM having a large capacity of 16 [Mbit] is mounted to the hybrid semiconductor integrated circuit device 1 of this embodiment VI. The wiring width of the complementary data line (DL) 57 extending on the memory cell array MA of this DRAM is smaller than the film thickness of the inter-level insulation film 54 between this complementary data line 57 and the upper electrode layer 53 below the former. On the other hand, in the region of the peripheral circuit, the wiring width of each signal wiring 57 formed by the same conductor layer as the complementary data line 57 and the power source wiring 57 is greater than the film thickness of the inter-level insulation film 54.

The charge-discharge current of the complementary data line 57 is expressed by the following formula <I>:

$$Jd = \frac{Cb \cdot N \cdot V_w}{trc} \cdot \eta \qquad <1>$$

where
- Jd: charge-discharge current of data line,
- Cb: data line capacity (per line),
- N: number of sense amplifiers operating simultaneously at the time of selection of word line (total bit number/refrech cycle)
- $V_w$: write voltage (Vcc)
- trc: refrech cycle time
- $\eta$: coefficient ¼ Vcc precharge→½ Vcc or Vss precharge→1

The data line capacity Cb on the right side of the formula <1> includes the capacitance between the complementary data line 57 and the data storage capacitance element C having the stacked structure, the capacitance between the complementary data line 57 and the word line 44, the capacitance between the semiconductor region (45, etc.) and the substrate, the mirror capacitance, and the like. Among them, the capacitance between the complementary data line 57 and the upper electrode layer (plate electrode) 53 of the data storage capacitance element C having the stacked structure occupies the major portion of from about 40 to about 50% of the data line capacitance Cb. This capacitance between the complementary data line 57 and the upper electrode layer 53 can be expressed by the following formula <2>:

$$Cdp = Ld \cdot Wd \cdot \frac{\epsilon o \cdot \epsilon ox}{tox} \cdot \alpha \qquad <2>$$

where
- Ld: data line length;
- Wd: data line width,
- $\alpha$: a coefficient,
- tox: film thickness of inter-level insulation film.

As is obvious from the formulas <1> and <2> given above, it is possible to reduce the capacitance Cdp between the complementary data line 57 and the upper electrode layer 53 by reducing the wiring width Wd of the complementary data line 57 and increasing the film thickness tox of the inter-level insulation film 54 and thus to reduce the data line capacitance Cb. Therefore, the charge-discharge current Jd of the complementary data line 57 can be reduced.

Figure 47:
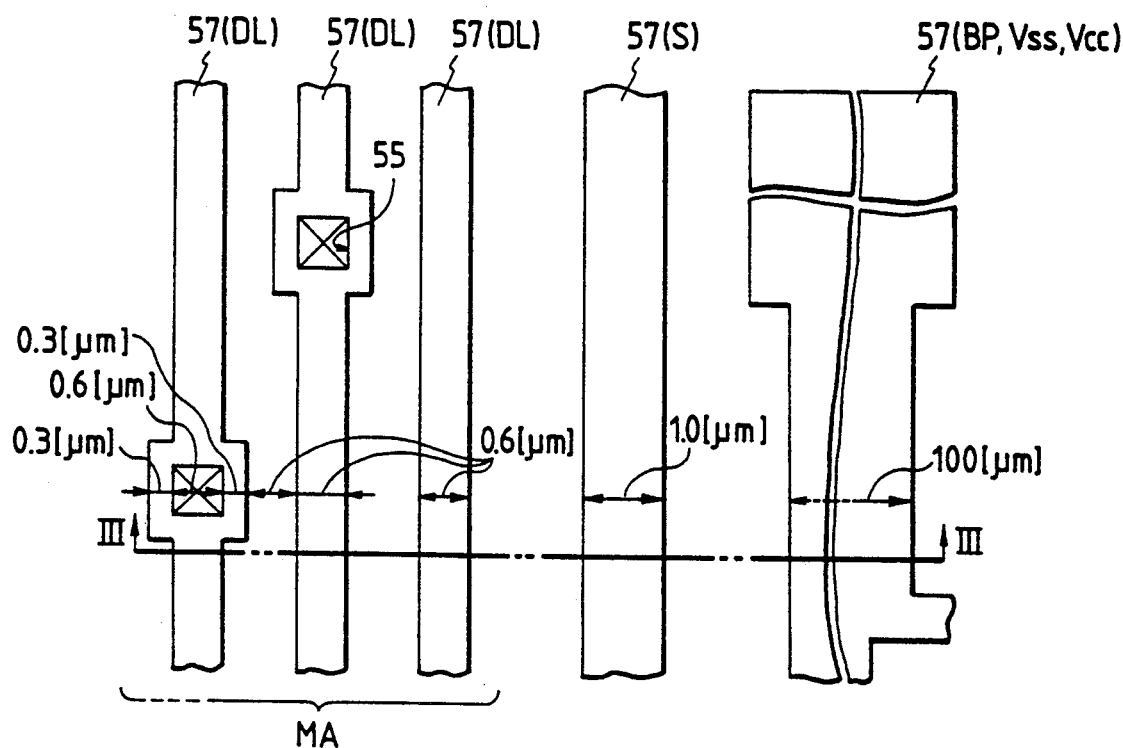
FIG. 47 is a plan view of a wiring used for the hybrid semiconductor integrated circuit device.

When DRAM having a large capacity of 16 [Mbit] is mounted, the hybrid semiconductor integrated circuit device 1 can have a maximum pellet size of about 140 [mm²] by making contrivances to the structure of the resin mold semiconductor device 2 while employing the LOC (Lead On Chip) structure or the like. Since the occupying area of the memory cell array MA of DRAM in the hybrid semiconductor integrated circuit device 1 is about 55% of the total area, the cell size of the memory cell M per bit is set to about 4.5 [μm²]. When DRAM employs the folded bit line system, one word line 44 and one set of complementary data lines (two data lines) 57 extend on the memory cell M of one [bit]. Due to this layout structure, a good balance can be established for miniaturization if the size in the vertical direction of the complementary data lines is 2 if it is 1 in the vertical direction of the word line. Therefore, the cell size of the memory cell M has preferably a rectangular shape of 1.5×3.0 [μm²]. In other words, as shown in FIG. 47 (plan view of the wiring) and in FIG. 48 (schematic sectional view taken along line III—III of FIG. 47), the wiring pitch of the complementary data line 57 is 3.0 [μm] and the wiring pitch of one data line in the complementary data lines 57 is 1.5 [μm]. Since DRAM having a large capacity of 16 [Mbit] employs a 0.6 [μm] fabrication process wherein the minimum working size (minimum wiring gap) is 0.6 [μm] and the margin for registration of two layers in the fabrication process is 0.3 [μm], the wiring width Wd of the complementary data line 57 is set to about 0.6 [μm]. In contrast, the inter-level insulation film 54 between the complementary data line 57 and the upper electrode layer 53 is formed in a film thickness substantially equal to the 4 [Mbit] DRAM mounted to the hybrid semiconductor integrated circuit device 1 of the embodiment I, that is, about 700 [nm], in order to reduce the capacitance Cdp between the complementary data line 57 and the upper electrode layer 53. In other words, in DRAM having a large capacity of 16 [Mbit], the wiring width (0.6 [μm]) of the complementary data line 57 is made smaller than the film thickness (0.7 [μm]) of the inter-level insulation film 54 in order to reduce the charge-discharge current and thus to reduce power consumption.

Figure 48:
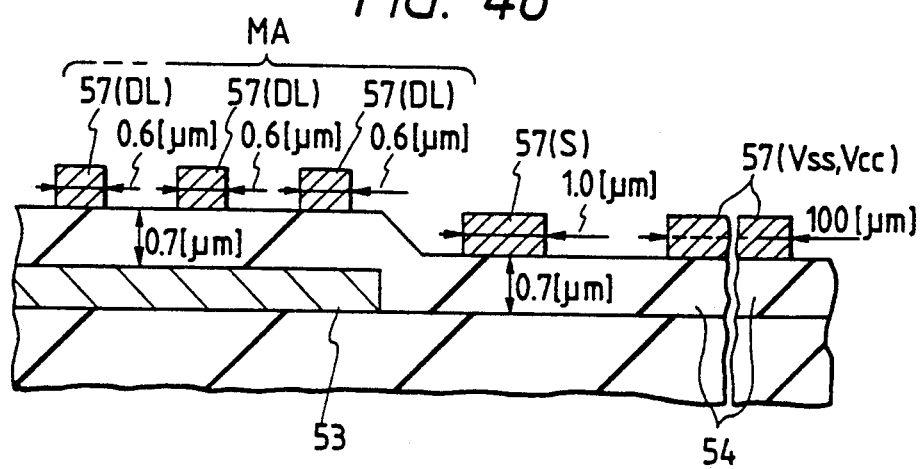
FIG. 48 is a schematic sectional view taken along line III—III of FIG. 47.

On the other hand, as shown in FIGS. 47 and 48, in DRAM having a large capacity of 16 [Mbit], the wiring width of each of the signal wiring 57 (S) of the peripheral circuit and the power source wiring 57 (Vss or Vcc) is made greater than the film thickness of the inter-level insulation film 54. The signal wiring 57 (S) is for the clock system signal, for example, and the wiring width is made great in order to increase the operation speed rather than for the purpose of miniaturization. The signal wiring 57 (S) is formed in a wiring width of about 1.0 [μm], for example. The power source wiring 57 (Vss or Vcc) has a large wiring width in order to reduce the noise and to improve the migration withstand voltage rather than for the purpose of miniaturization. The wiring width of the portion of this power source wiring 57 (Vss or Vcc) till its branch to the input or output external terminal BP is the worst case, and its wiring width is about 100 [μm], for example.

When DRAM having a greater capacity such as 256 [Mbit] or more is mounted to the hybrid semiconductor integrated circuit device 1 described above, the wiring width of the signal wiring 57 (S) of the peripheral circuit is sometimes smaller than the film thickness of the inter-level insulation film 54, but the wiring width of the power source wiring 57 till its branch from the external terminal BP is greater than the film thickness of the inter-level insulation film 54.

In the hybrid semiconductor integrated circuit device 1 described above equipped with DRAM wherein each memory cell M is constituted by the series circuit of the memory cell selection MISFET Qs and the data storage capacitance element C having the stacked structure and the complementary data line 57 extending on the upper electrode layer 53 of the data storage capacitance element C having the stacked structure through the inter-level insulation film 54 is connected to one of the n-type semiconductor regions 45 of the memory cell selection MISFET Qc of the memory cell M, the wiring width of the complementary data line 57 is made smaller than the film thickness of the inter-level insulation film 54 between the complementary data line 57 and the upper electrode layer 53 of the data storage capacitance element C having the stacked structure below the former. According to this structure, it is possible to reduce the parasitic capacitance Cd added to the complementary data line 57 and to reduce the charge-discharge flow rate Jd of the complementary data line 57. Accordingly, power consumption of DRAM can be reduced and eventually, power consumption of the hybrid semiconductor integrated circuit device 1 can be reduced. Since power consumption can thus be reduced, the integration density of the hybrid semiconductor integrated circuit device 1 can be improved.

The wiring width of the signal wiring 57 (S) which is formed by the same conductor layer as the complementary data line 57 and extends to the peripheral circuit of DRAM is made greater than the film thickness of the inter-level insulation film 54 as its lower layer. According to this structure, since the resistance value of the signal wiring 57 (S) extending to the peripheral circuit can be reduced by increasing its sectional area, it is possible to improve the signal transmission speed and to improve the operation speed of the hybrid semiconductor integrated circuit device 1.

The wiring width of the power source wiring 57, which is formed by the same conductor layer as the complementary data line 57 of DRAM, till its branch portion from the external terminal BP is made greater than the film thickness of the inter-level insulation film 54 below the former. According to this structure, since the resistance value of the power source wiring 57 can be reduced by increasing its sectional area, it is possible to reduce the noise, to prevent an erroneous operation and to improve electrical reliability of the hybrid semiconductor integrated circuit device 1. Since a sufficient wiring width can be secured, it becomes also possible to prevent the wire breakage by securing the migration withstand voltage and to improve electrical reliability of the hybrid semiconductor integrated circuit device 1.

EMBODIMENT VII

This embodiment VII is the seventh embodiment of the present invention which improves the integration density of DRAM and at the same time, reduces the area of the bipolar transistor, particularly the area of the device isolation region, to improve the integration density in the hybrid semiconductor integrated circuit device. This embodiment is particularly suitable for a hybrid semiconductor integrated circuit device having mounted thereto DRAM having a large capacity of 16 [Mbit] or more.

Figure 49:
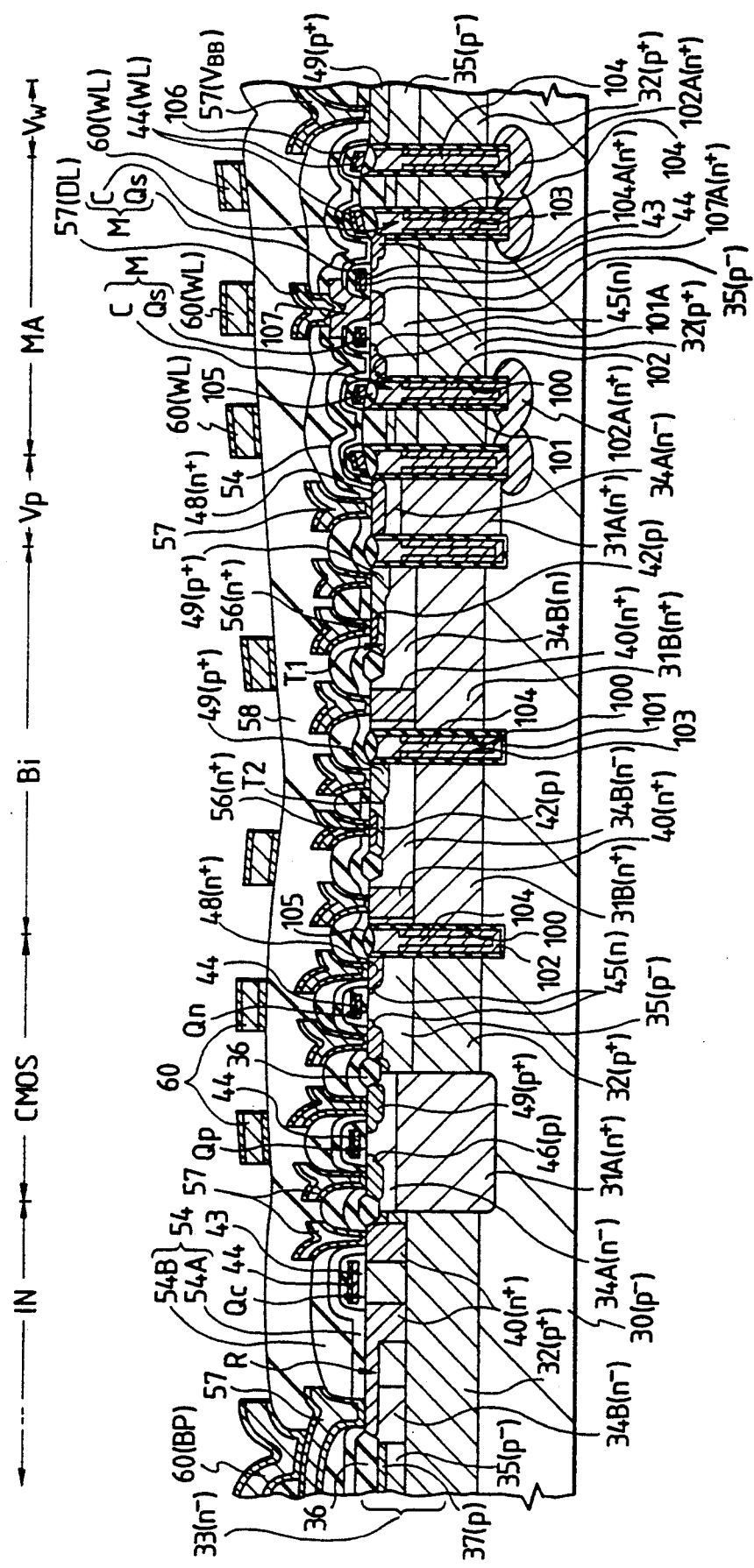
FIG. 49 is a sectional view of the principal portions of a hybrid semiconductor integrated circuit device in accordance with an embodiment VII of the present invention.

FIG. 49 (sectional view of the principal portions) shows the hybrid semiconductor integrated circuit device 1 of the embodiment VII of the present invention.

Figure 50:
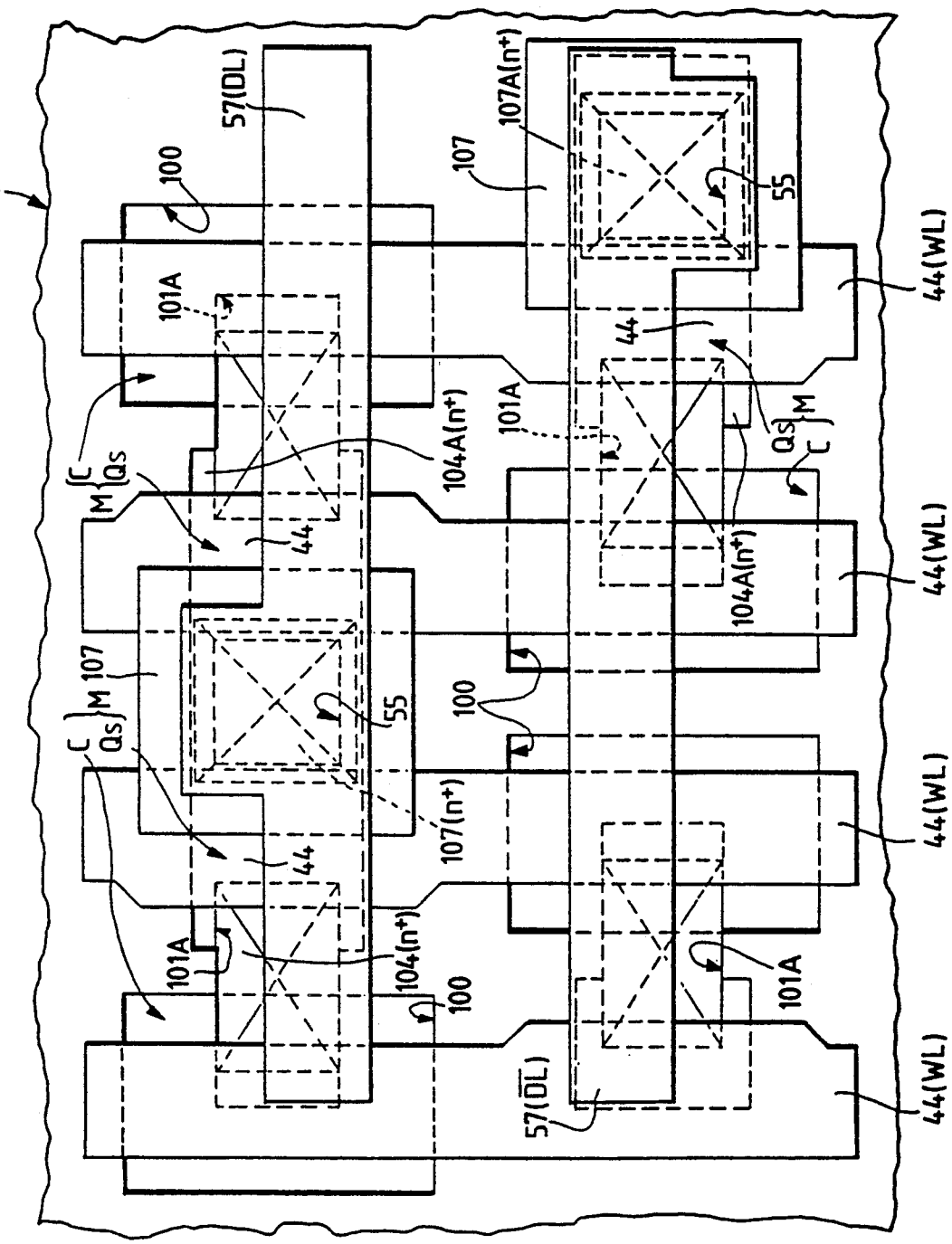
FIG. 50 is a plan view of the principal portions of DRAM mounted to the hybrid semiconductor integrated circuit device.

As shown in FIGS. 49 and 50 (which is a plan view of the principal portions of a memory cell array), the memory cell M of DRAM mounted to the hybrid semiconductor integrated circuit device 1 of this embodiment VII comprises a series circuit of a memory cell selection MISFET Qs and a data storage capacitance element C having a thin trench type stacked structure.

The memory cell selection MISFET Qs of the memory cell M comprises mainly a $p^-$-type well region 35 (channel formation region), a gate insulation film 43, a gate electrode 44, an $n^+$-type semiconductor region 107A, an n-type semiconductor region 45 and an $n^+$-type semiconductor region 104A. The data storage capacitance element C, having a thin trench type stacked structure, of the memory cell M comprises mainly a thin trench 100, an isolation insulation film 101, a lower electrode layer 102, a dielectric film 103 and an upper electrode layer 105.

The complementary data line (DL) 57 is connected to one of the $n^+$-type semiconductor regions 107A of the memory cell selection MISFET Qs through an intermediate conductor film 107 connected to the main plane of the $n^+$-type semiconductor region 107A in self-alignment with the gate electrode 44, inside the region defined by a sidewall spacer 47. The intermediate conductor film 107 comprises a polycrystalline silicon film deposited by CVD, for example, and an n-type impurity such as P is introduced into this polycrystalline film in order to reduce the resistance value. The $n^+$-type semiconductor region 107A is formed by diffusing the n-type impurity introduced into the polycrystalline film as the intermediate conductor film 107, into the main plane portion of the $p^-$-type well region 35.

The other n-type semiconductor region 45 of the memory cell selection MISFET Qs and the $n^-$-type semiconductor region 104A are connected to the upper electrode layer 104 of the data storage capacitance element C of the stacked structure through the opening 101A formed in the insulation film 101 for isolation described above. As will be described later, the upper electrode layer 104 comprises a polycrystalline silicon film and the $n^+$-type semiconductor region 104A is formed by diffusing the n-type impurity introduced into this polycrystalline silicon film into the main plane portion of the $p^-$-type well region 35 inside the region defined by the opening 101A.

The thin trench 100 of the data storage capacitance element C having the thin trench type stacked structure penetrates through the $p^-$-type well region 35 and the buried $p^+$-type semiconductor region 32 and its bottom reaches the $p^-$-type semiconductor substrate 30. This thin trench 100 is formed by anisotropic etching such as RIE in a depth greater than the size of the opening.

The insulation film 101 for isolation is disposed in such a manner as to extend along the inner wall of the thin trench 100 and isolates electrically the $p^-$-type well region and the buried $p^+$-type semiconductor region 32 from the data storage capacitance element C having the thin trench type stacked structure, respectively.

The lower electrode layer 102 is disposed in such a manner as to extend along the inner wall of the thin trench 100 while interposing the insulation film 101 for isolation between them. The lower electrode layer 102 comprises a polycrystalline silicon film deposited by CVD, for example, and an n-type impurity such as P is introduced into this polycrystalline silicon film. The lower electrode layer 102 is connected to the buried $n^+$-type semiconductor region 102A through an opening (without any reference numeral) bored by removing the isolation insulation film 101 at the bottom of the thin trench 100. This buried $n^+$-type semiconductor region 102A is formed by diffusing the n-type impurity, which is introduced into the lower electrode layer 102, into the $p^-$-type semiconductor substrate 30. Since the pitch of disposition of the memory cells M is small in DRAM having a large capacity of 16 [Mbit], the buried $n^+$-type semiconductor region 102A is connected to the buried $n^+$-type semiconductor region 102A of other memory cells adjacent thereto in the extending direction of the word line (WL) 44 and in the extending direction of the complementary data line 57 except for the connection portions between the memory cells M and the complementary data lines 57 (or it is integrally formed with the latter). The power source voltage ½ Vcc is supplied from a plate power supply portion Vp to the buried n+-type semiconductor region 102A. Since the power source voltage Vcc used in the internal circuit becomes about 3.3 [V] in DRAM having a large capacity of 16 [Mbit], the power source voltage ½ Vcc described above is about 1.65 [V].

The plate power supply portion Vp is formed by disposing sequentially the n+-type semiconductor region 48, the n⁻-type well region 34A and the buried n+-type semiconductor region 31A from the substrate surface in the direction of depth inside the region whose periphery is defined by the thin trench 100 as shown in FIG. 49. The plate power supply portion Vp is disposed in the peripheral region of the memory cell array MA, for example. The wiring 57 to which the power source voltage ½ Vcc is applied is connected to the n+-type semiconductor region 48 of this plate power supply portion Vp and the n+-type semiconductor region 102A is connected to the buried n+-type semiconductor region 31A.

The dielectric film 103 is disposed on the surface of the lower electrode layer 102. The dielectric film 103 comprises a single layer of a silicon nitride film, a single layer of a silicon dioxide film or their composite film, for example.

The upper electrode layer 105 is disposed on the surface of the dielectric film 103 in such a manner as to bury the thin trench 100. This upper electrode layer 105 comprises a polycrystalline silicon film deposited by CVD, for example, and an n-type impurity such as P is introduced into this polycrystalline silicon film. Unlike the data storage capacitance element C of the stacked structure mounted to the hybrid semiconductor integrated circuit device of the embodiment I, the lower electrode layer 102 of the data storage capacitance element C of the thin trench stacked structure is formed as the plate electrode and its upper electrode layer 105 is formed as the floating electrode The data storage capacitance element C of the thin trench stacked structure thus constituted is referred to as a data storage capacitance element C of a so-called "SPC structure" and can increase the charge storage quantity in the direction of depth of the substrate. Therefore, it becomes possible to reduce the memory cell area and to improve the integration density of the hybrid semiconductor integrated circuit device 1.

In the memory cell array MA of DRAM described above, the buried p+-type semiconductor region 32 formed by the same layer (by the same formation step) as the region of the n-channel MISFET Qn is disposed below the p⁻-type well region 35 as shown in FIG. 49. This buried p+-type semiconductor region 32 is a structure peculiar to the hybrid semiconductor integrated circuit device 1 and can be disposed in the region of the memory cell array MA without increasing the number of formation steps. The buried p+-type semiconductor region 32 disposed in the region of the memory cell array MA is connected to the well power supply portion Vw (formed integrally with it) and the substrate potential Vss is applied to it. The well power supply portion Vw is disposed at the peripheral portion of the memory cell array MA, for example. The well power supply portion is formed by disposing sequentially the p+-type semiconductor region 49, the p⁻-type well region and the buried p+-type semiconductor region 32 from the substrate surface in the direction of depth inside the region whose periphery is defined by the thin trench 100. The wiring 57 to which the substrate potential Vss is applied is connected to the p+-type semiconductor region 49 of this well power supply portion Vw.

On the other hand, in the bipolar transistor region Bi (or in the CMOS region CMOS) shown in FIG. 49, the device isolation region is constituted by sequentially burying the insulation film 101 for isolation, the lower electrode layer 102, the dielectric film 103 and the upper electrode layer 105 into the thin trench 100. Each of the thin trench 100 of the device isolation region and the layers 101, 102, 103, 105 buried into the thin trench are formed by the same layer (by the same formation step) as the corresponding member formed in the memory cell array MA. The bottom portion of the thin trench 100 of the device isolation region is greater than the buried n+-type semiconductor region 31B as the n-type collector region in order to prevent the short-circuit between the devices. The insulation film 101 for isolation at the bottom of the thin trench 100 of the device isolation region is not removed in order to prevent the short-circuit between the devices and eventially, the buried n+-type semiconductor region 102A is not disposed.

An insulation film 106 is disposed on the lower electrode layer 102 buried into the thin trench 100, in order to isolate electrically the lower electrode layer 102 from the conductor layer on the former.

Next, the fabrication process of the hybrid semiconductor integrated circuit device 1 described above will be explained briefly with reference to FIGS. 51 to 56 (sectional views of the principal portions at each formation step).

First of all, the n⁻-type well regions 34A, 34B, the n-type well region 34B, the p⁻-type well region 35 are formed in each region and then the device isolation insulation film 36 and the p-type channel stopper region 37 are formed. Thereafter, the main plane of the active region of each of the n⁻-type well regions 34A, 34B, the n-type well region 34B and the p⁻-type well region 35 is exposed.

Next, the insulation film 108 is formed on the entire surface of the substrate including the portions on the active regions described above, and an etching mask 110 on which the formation region of the thin trench 100 is open is formed on the insulation film 108 as shown in FIG. 52. The etching mask 110 is formed by a photoresist film using photolithography, for example.

Figure 53:
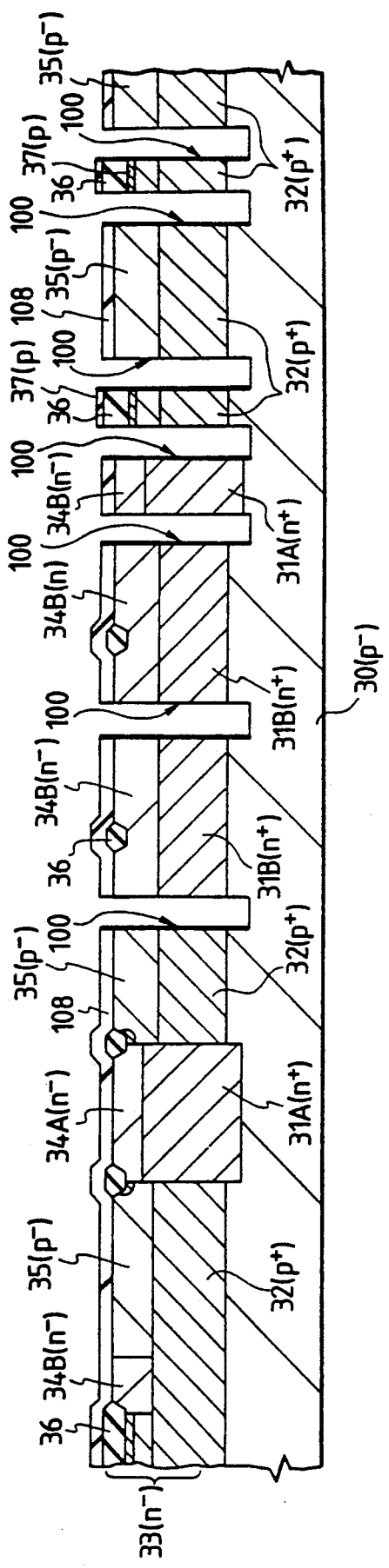

As shown in FIG. 53, the insulation film 108 and the substrate are then etched sequentially using the etching mask 110 described above to form the thin trench 100. Etching is made by anisotropic etching such as RIE, as described already.

Next, the insulation film 101 for isolation is formed on the entire surface of the substrate including the inner walls of the thin trench 100. The insulation film 101 for isolation uses a silicon dioxide film deposited by CVD, for example.

Figure 54:
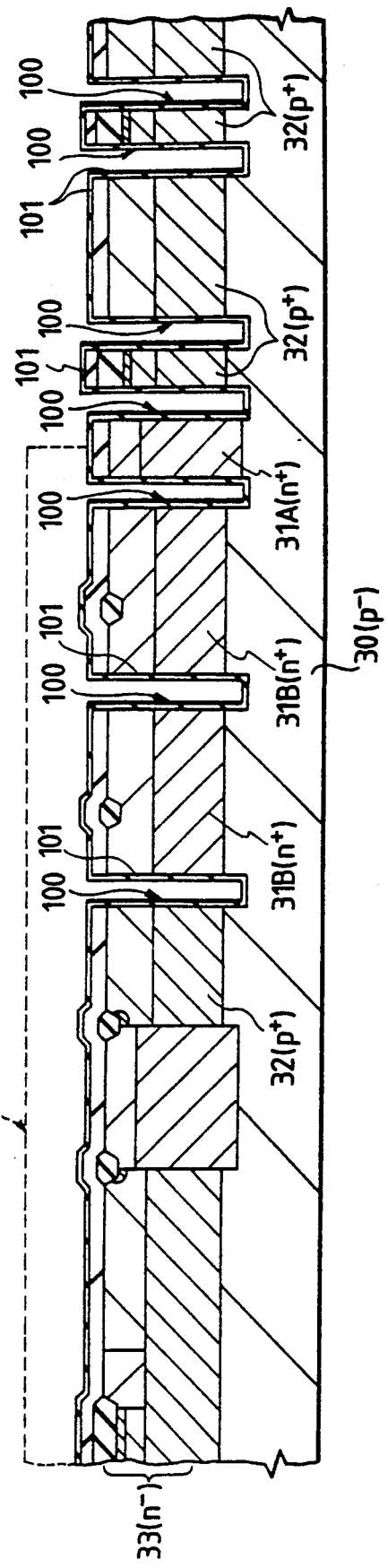
Figure 55:
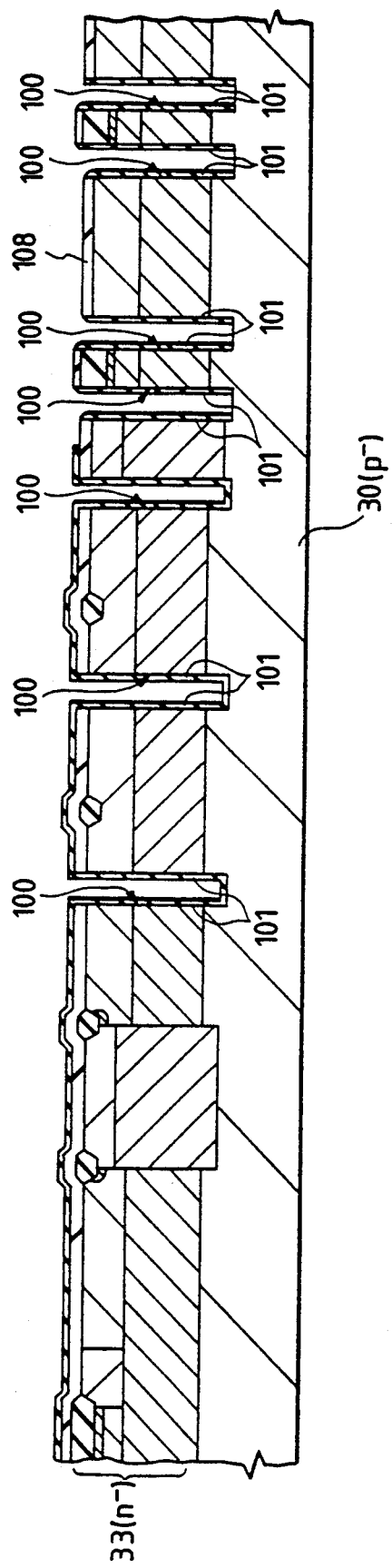
Figure 56:
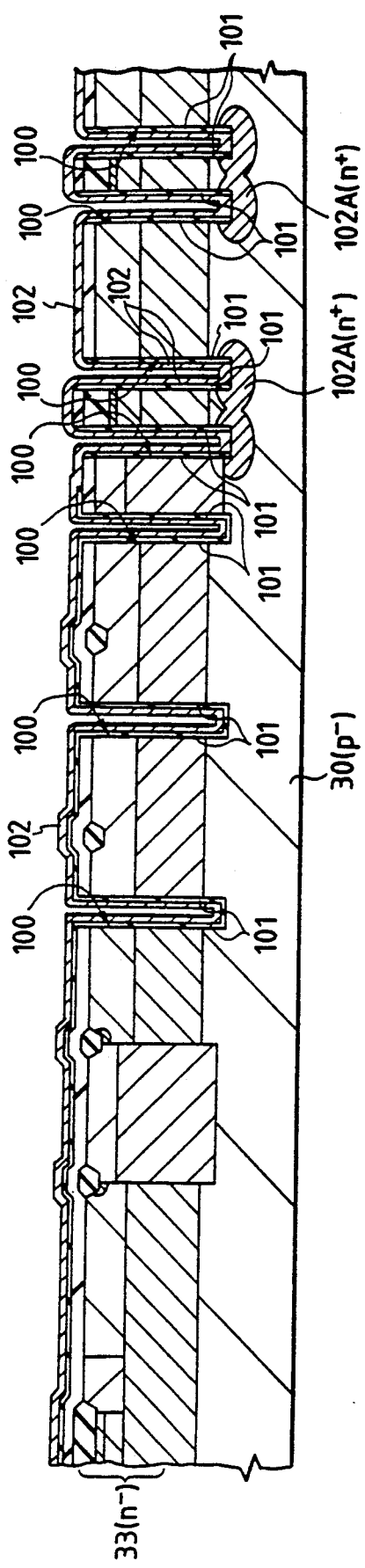

As shown in FIG. 54, an etching mask 111 on which the region of the memory cell array MA is open is formed on the insulation film 101 for separation. The etching mask 111 is formed by a photoresist film using photolithography, for example.

Etching is then applied to the entire surface of the substrate by use of the etching mask 111 described above to remove the insulation film 101 for isolation at the flat portions, particularly at the flat portion at the bottom of the thin trench 100. This etching is made by anisotropic etching. The surface of the p⁻-type semiconductor region 30 is exposed only at the bottom of the thin trench 100 in the memory cell array MA region where the isolation insulation film 101 is removed.

Next, as shown in FIG. 46, the lower electrode layer 102 is formed on the entire surface of the substrate. The lower electrode layer 102 comprises the polycrystalline silicon layer as described already, and the n-type impurity is introduced into this polycrystalline silicon film. The n-type impurity diffuses into the p$^-$-type semiconductor substrate 30 at the bottom of the thin trench 100 in the memory cell array MA region and forms the buried n$^+$-type semiconductor region 102A.

The dielectric film 103 and the upper electrode layer 105 are then laminated sequentially, and the lower electrode layer 102, the dielectric film 103 and the upper electrode layer 105 are worked in the predetermined shapes, respectively, so that the data storage capacitance element C having the thin trench stacked structure and the device isolation region can thus be formed.

Thereafter, the ordinary formation steps are carried out to complete the hybrid semiconductor integrated circuit device 1 shown in FIGS. 49 and 50.

In the hybrid semiconductor integrated circuit device 1 wherein DRAM having the memory cells M each comprising the series circuit of the memory cell selection MISFET Qs and the data storage capacitance element C and the bipolar transistor are formed on the same substrate, the data storage capacitance element C of the memory cell of DRAM is formed inside the thin trench 100 which is formed in the direction of depth of the substrate from the substrate surface and the device isolation region defining the periphery of the bipolar transistor T is formed by the thin trench 100 which is formed by the same formation step as the thin trench 100 that forms the data storage capacitance element C of the memory cell of DRAM. The data storage capacitance element C of the memory cell M of DRAM has the thin trench stacked structure (SPC) obtained by laminating sequentially the lower electrode layer 102, the dielectric film 103 and the upper electrode layer 104 inside the thin trench 100. According to this structure, the thin trench 100 of the data storage capacitance element C of the memory cell M of DRAM can increase the charge storage quantity in the direction of depth of the substrate. Therefore, it becomes possible to reduce the area of the memory cell M and to improve the integration density of the hybrid semiconductor integrated circuit device 1. Since the isolation dimension can be secured in the direction of depth of the substrate by the thin trench 100 of the device isolation region of the bipolar transistor T, it is possible to reduce the area of the device isolation region and to improve the integration density of the hybrid semiconductor integrated circuit device 1. Moreover, since the thin trench 100 of the data storage capacitance element C of the memory cell M of DRAM can be formed by the same formation step as the thin trench 100 of the device isolation region of the bipolar transistor T, the number of fabrication steps of the hybrid semiconductor integrated circuit device 1 can be reduced.

Since the device isolation region of the bipolar transistor T is formed by the thin trench 100, it is possible to reduce more greatly the parasitic capacitance added to each operation region than p-n junction isolation, and to improve the high frequency characteristics.

In the hybrid semiconductor integrated circuit device 1 equipped with DRAM wherein the memory cells M each comprising the series circuit of the memory cell selection MISFET Qs and the data storage capacitance element C are disposed on the main plane of the p$^-$-type well region 35, the buried p$^+$-type semiconductor region 32 having the same conductivity type as that of the p$^-$-type well region 35 but having a higher impurity concentration is disposed below this p$^-$-type well region 35 on which the memory cells M of DRAM are disposed, and the well potential (substrate potential Vss) is supplied to the p$^-$-type well region 35 through this buried p$^+$-type semiconductor region 32. According to this structure, since the noise occurring in the p$^-$-type well region 35 can be absorbed through the buried p$^+$-type semiconductor region 32 having a lower resistance value than the p$^-$-type well region 35, the erroneous operations in the data read and write operations of DRAM can be prevented. Since the distribution of the well potential of the p$^-$-type well region 35 inside the memory cell array MA can be made uniform, it is possible to reduce any fluctuation of the threshold voltage value of the memory cell selection MISFET Qs of the memory cell M and to improve electrical reliability of the hybrid semiconductor integrated circuit device 1.

The buried p$^+$-type semiconductor region 32 is formed by the same layer as the buried p$^+$-type semiconductor region 32 of the region of the n-channel MISFET Qn. According to this structure, the number of fabrication steps of the hybrid semiconductor integrated circuit device 1 can be reduced.

Although the present invention has thus been described on the basis of the embodiment thereof, the invention is not naturally limited thereto but can of course be changed or modified in various manners without departing from the gist thereof.

For example, the present invention can be applied to a hybrid semiconductor integrated circuit device using DRAM as one unit, such as a microcomputer (one-chip microcomputer).

The present invention can also be applied to a hybrid semiconductor integrated circuit device 1 having other memory functions such as SRAM, ROM, and the like, besides DRAM.

The effects brought forth by the typical inventions among the inventions disclosed in this application are briefly as follows.

(1) The dielectric breakdown withstand voltage can be improved in a hybrid semiconductor integrated circuit device having a dielectric breakdown prevention circuit.

(2) The number of fabrication steps of the hybrid semiconductor integrated circuit device can be reduced, besides the effect (1).

(3) Electrical reliability can be improved in the hybrid semiconductor integrated circuit device.

(4) The operation speed can be improved in the hybrid semiconductor integrated circuit device.

(5) The integration density can be improved in the hybrid semiconductor integrated circuit device described above.

(6) The withstand voltage of the bipolar transistor can be improved in the hybrid semiconductor integrated circuit device described above.

(7) Low power consumption can be accomplished in the hybrid semiconductor integrated circuit device described above.

What is claimed is:

1. In a semiconductor integrated circuit device including a dielectric breakdown prevention circuit between an external terminal and an input stage circuit connected directly to said external terminal, and including also a complementary MISFET and a bipolar transistor, the improvement wherein said dielectric breakdown prevention circuit comprises first and second diode devices disposed sequentially and in parallel from said external terminal towards said input stage circuit;

said first diode device comprising:
a first semiconductor region of a first conductivity type having a low impurity concentration and being formed by the same layer as a well region of said complementary MISFET, on a main plane portion of a semiconductor substrate; and
a second semiconductor region of a second conductivity type having a high impurity concentration and being formed by the same layer as the source and drain regions of said complementary MISFET, on the main plane portion of said first semiconductor region;

said second diode device comprising:
a buried type third semiconductor region of the first conductivity type having a high impurity concentration and being formed by the same layer as an isolation region of said bipolar transistor buried in said semiconductor substrate; and
a fourth semiconductor region of the second conductivity type having a high impurity concentration and being formed by the same layer as a contact region of a buried collector region of said bipolar transistor disposed with the bottom surface thereof being in contact with said third semiconductor region, on the main plane portion of said semiconductor substrate.

2. In a semiconductor integrated circuit device including a dielectric breakdown prevention circuit between an external terminal and an input stage circuit connected directly to said external terminal, and including also a complementary MISFET and a bipolar transistor, the improvement wherein said dielectric breakdown prevention circuit comprises first and second diode devices disposed sequentially and in parallel from said external terminal towards said input stage circuit;

said first diode device comprising:
a buried type third semiconductor region of a first conductivity type having a high impurity concentration and being formed by the same layer as an isolation region of said bipolar transistor buried in a semiconductor substrate; and
a fifth semiconductor region of a second conductivity type having a low impurity concentration and being formed by the same layer as a well region of said complementary MISFET disposed with the bottom surface thereof being in contact with said third semiconductor region, on a main plane portion of said semiconductor substrate;

said second diode device comprising:
said third semiconductor region; and conductivity type having a high impurity concentration and being formed by the same layer as a contact region of a buried collector region of said bipolar transistor disposed with the bottom surface being in contact with said third semiconductor region, on the main plane portion of said semiconductor substrate.

3. A semiconductor integrated circuit device according to claim 2, wherein said dielectric breakdown prevention circuit is formed by disposing sequentially and in parallel said first diode device, a third diode device, and said second diode device from said external terminal towards said input stage circuit.

4. A semiconductor integrated circuit device according to claim 3, wherein said second diode device comprises a part of a drain region of a clamp MISFET of said dielectric breakdown prevention circuit.

5. A semiconductor integrated circuit device according to claim 4, wherein a source region of said clamp MISFET of said dielectric breakdown prevention circuit is formed by the same layer as said fourth semiconductor region of the second conductivity type of said second diode device or as said second semiconductor region of the second conductivity type of said first diode device.

6. A semiconductor integrated circuit device according to claim 5, wherein an insulation film having a greater film thickness than a gate insulation film of said clamp MISFET is disposed between the drain region and a gate electrode of said clamp MISFET of said dielectric breakdown prevention circuit.

7. A semiconductor integrated circuit device according to claim 6, wherein each of the drain and source regions of said clamp MISFET of said dielectric breakdown prevention circuit is formed in self-alignment with said gate electrode.

8. A semiconductor integrated circuit device according to claim 6, wherein said dielectric breakdown prevention circuit disposed between said external terminal and said input stage circuit comprises at least said second diode device.

9. A semiconductor integrated circuit device including a dielectric breakdown prevention circuit coupled to an external terminal for protecting an input stage circuit coupled to said external terminal, and including also bipolar transistors and complementary MISFETs comprised of a first MISFET of a first conductivity type and a second MISFET of a second conductivity type, said dielectric breakdown prevention circuit comprising:

a) a first semiconductor region of the first conductivity type formed in a main surface of a semiconductor body, said first semiconductor region being formed by the same layer as a well region in which said second MISFET of the second conductivity type of said complementary MISFETs is formed;
b) a second semiconductor region of the second conductivity type formed in said first semiconductor region, said second semiconductor region being formed by the same layer as source and drain regions of said second MISFET of the second conductivity type of said complementary MISFETs, said first and second semiconductor regions forming a first PN junction diode, wherein said external terminal is electrically coupled to one end portion of said second semiconductor region;
c) a buried type third semiconductor region of the first conductivity type buried in said semiconductor body and underlying said second semiconductor region, said buried type third semiconductor region being formed by the same layer as an isolation region for isolating said bipolar transistors from each other, wherein said buried type third semiconductor region has an impurity concentration higher than that of said first semiconductor region and is disposed at the bottom surface of said first semiconductor region; and
d) a fourth semiconductor region of the second conductivity type formed in said first semiconductor region, said fourth semiconductor region being formed by the same layer as collector contact regions of said bipolar transistors, wherein said fourth semiconductor region is electrically connected with another end portion of said second semiconductor region and is in contact with said buried type third semiconductor region, wherein said fourth semiconductor region is electrically coupled to said input stage circuit, and wherein said buried type third semiconductor region and said fourth semiconductor region form a second PN junction diode.

10. A semiconductor integrated circuit device including a dielectric breakdown prevention circuit coupled to an external terminal for protecting an input stage circuit coupled to said external terminal, and including also bipolar transistors and complementary MISFETs comprised of a first MISFET of a first conductivity type and a second MISFET of a second conductivity type, said dielectric breakdown prevention circuit comprising:
 a) a first semiconductor region of the first conductivity type formed in a main surface of a semiconductor body, said first semiconductor region being formed by the same layer as a well region in which said second MISFET of the second conductivity type of said complementary MISFETs is formed;
 b) a second semiconductor region of the second conductivity type formed in said first semiconductor region, said second semiconductor region being formed by the same layer as source and drain regions of said second MISFET of the second conductivity type of said complementary MISFETs, said first and second semiconductor regions forming a first PN junction diode;
 c) a buried type third semiconductor region of the first conductivity type buried in said semiconductor body and underlying said second semiconductor region, said buried type third semiconductor region being formed by the same layer as an isolation region for isolating said bipolar transistors from each other, wherein said buried type third semiconductor region has an impurity concentration higher than that of said first semiconductor region and is disposed at the bottom surface of said first semiconductor region; and
 d) a fourth semiconductor region of the second conductivity type formed in said first semiconductor region, said fourth semiconductor region being formed by the same layer as collector contact regions of said bipolar transistors, wherein said fourth semiconductor region is connected with one end portion of said second semiconductor region and contacts with said buried type third semiconductor region, wherein said fourth semiconductor region is electrically coupled to said input stage circuit, wherein said buried type third semiconductor region and said fourth semiconductor region form a second PN junction diode; and
 e) a fifth semiconductor region of the second conductivity type having an impurity concentration lower than that of said fourth semiconductor region, formed in said main surface of said semiconductor body, said fifth semiconductor region being formed by the same layer as a second well region in which said first MISFET of the first conductivity type of said complementary MISFETs is formed, wherein said fifth semiconductor region is connected with another end portion of said second semiconductor region and contacts with said buried type third semiconductor region, wherein said fifth semiconductor region and said buried type third semiconductor region form a third PN junction diode, and wherein said fifth semiconductor region is electrically coupled to said external terminal.

11. A semiconductor integrated circuit device according to claim 10, wherein said dielectric breakdown prevention circuit is formed by disposing said diodes sequentially and in parallel from said external terminal towards said input stage circuit.

12. A semiconductor integrated circuit device according to claim 11, wherein said second diode comprises a part of a drain region of a clamp MISFET of said dielectric breakdown prevention circuit.

13. A semiconductor integrated circuit device according to claim 12, wherein a source region of said clamp MISFET of said dielectric breakdown prevention circuit is formed by the same layer as said fourth semiconductor region of the second conductivity type of said second diode or as said second semiconductor region of the second conductivity type of said first diode.

14. A semiconductor integrated circuit device according to claim 13, wherein an insulation film having a greater film thickness than a gate insulation film of said clamp MISFET is disposed between the drain region and a gate electrode of said clamp MISFET of said dielectric breakdown prevention circuit.

15. A semiconductor integrated circuit device according to claim 14, wherein each of the drain and source regions of said clamp MISFET of said dielectric breakdown prevention circuit is formed in self-alignment with said gate electrode.

16. A semiconductor integrated circuit device according to claim 14, wherein said dielectric breakdown prevention circuit disposed between said external terminal and said input stage circuit comprises at least said second diode.

17. A semiconductor integrated circuit device having a dielectric breakdown prevention circuit coupled to an external terminal for protecting an internal circuit, comprising:
 a) a semiconductor body having a main surface;
 b) a first semiconductor region of a first conductivity type formed in said main surface of said semiconductor body;
 c) a second semiconductor region of a second conductivity type formed in said first semiconductor region, said second semiconductor region serving as a resistance element;
 d) a buried type semiconductor region of said first conductivity type buried in said semiconductor body and underlying said second semiconductor region, wherein said buried type semiconductor region contacts the bottom of said first semiconductor region and has an impurity concentration higher than that of said first semiconductor region;
 e) a first MISFET formed on a surface of said first semiconductor region, said first MISFET having a gate conductor layer and a pair of diffused regions formed at edges of said gate conductor layer, wherein one of said pair of diffused regions is connected to one end portion of said second semiconductor region and is in contact with said buried type semiconductor region, wherein said one of said pair of diffused regions forms a first PN junction diode with said buried type semiconductor region; and f) a third semiconductor region of said second conductivity type formed in said semiconductor body, said third semiconductor region having an impurity concentration lower than that of said one of said pair of diffused regions and being connected to another end portion of said second semiconductor region, said third semiconductor region contacting with said buried type semiconductor region and forming a second PN junction diode with said buried type semiconductor region;

wherein said dielectric breakdown prevention circuit comprises said second semiconductor region serving as said resistance element, said first MISFET and said first and second PN junction diodes, wherein said one of said pair of diffused regions is electrically coupled to said internal circuit, and wherein said third semiconductor region is electrically coupled to said external terminal.

18. A semiconductor integrated circuit device according to claim 17, wherein said semiconductor body includes a semiconductor substrate of said first conductivity type and an epitaxial semiconductor layer of said second conductivity type formed on said semiconductor substrate, wherein said buried type semiconductor region is formed at the junction of said semiconductor substrate and said epitaxial semiconductor layer, and wherein said first semiconductor region is formed in said epitaxial semiconductor layer.

19. A semiconductor integrated circuit device according to claim 17, wherein said second semiconductor region of said second conductivity type forms a third PN junction diode with said first semiconductor region of said first conductivity type, and wherein said third PN junction diode has a predetermined tunnel breakdown voltage value higher than that of said first PN junction diode while said second PN junction has a predetermined tunnel breakdown voltage higher than that of said third PN junction diode.

20. A semiconductor integrated circuit device according to claim 17, wherein said second semiconductor region has a depth shallower than that of each of said third semiconductor regions and said one of said pair of diffused regions in said semiconductor body, and wherein said second semiconductor region does not reach said buried type semiconductor region.

21. A semiconductor integrated circuit device according to claim 19, further comprising a fourth semiconductor region of the second conductivity type formed in said main surface of said semiconductor body, wherein said buried type semiconductor region extends under said fourth semiconductor region and forms a fourth PN junction diode with said fourth semiconductor region, and wherein said dielectric prevention circuit further includes said fourth PN junction diode.

22. A semiconductor integrated circuit device according to claim 21, wherein said fourth semiconductor region is coupled to a power source line.

23. A semiconductor integrated circuit device according to claim 13, wherein said fourth semiconductor region is formed at a region adjoining said third semiconductor region, wherein a fifth semiconductor region of the first conductivity type is formed between said third and fourth semiconductor regions, and wherein said fifth semiconductor region forms PN junctions with said third and fourth semiconductor regions in said main surface of said semiconductor body.

* * * * *